(12) United States Patent
Pavlov et al.

(10) Patent No.: US 10,536,167 B2
(45) Date of Patent: Jan. 14, 2020

(54) MATRIX-BASED ERROR CORRECTION AND ERASURE CODE METHODS AND SYSTEM AND APPLICATIONS THEREOF

(71) Applicant: File System Labs LLC, Northbrook, IL (US)

(72) Inventors: Elan Pavlov, Cambridge, MA (US); Stephen Ness, San Francisco, CA (US); Roger Critchlow, Santa Fe, NM (US); Robert Swartz, Highland Park, IL (US); Timothy S. Murphy, Milwaukee, WI (US); Ronald Lachman, Northbrook, IL (US)

(73) Assignee: File System Labs LLC, Northbrook, IL (US)

( * ) Notice: Subject to any disclaimer, the term of this patent is extended or adjusted under 35 U.S.C. 154(b) by 0 days.

(21) Appl. No.: 15/362,360

(22) Filed: Nov. 28, 2016

(65) Prior Publication Data

US 2017/0077950 A1    Mar. 16, 2017

Related U.S. Application Data

(63) Continuation of application No. 14/816,039, filed on Aug. 2, 2015, now Pat. No. 9,507,788, which is a (Continued)

(51) Int. Cl.
*H03M 13/05*      (2006.01)
*G06F 16/13*      (2019.01)
(Continued)

(52) U.S. Cl.
CPC .......... *H03M 13/05* (2013.01); *G06F 3/064* (2013.01); *G06F 3/0619* (2013.01);
(Continued)

(58) Field of Classification Search
CPC ... H03M 13/05; H03M 13/611; G06F 3/0619; G06F 3/064; G06F 3/0647; G06F 3/0689;
(Continued)

(56) References Cited

U.S. PATENT DOCUMENTS 5,617,541 A *  4/1997  Albanese .............. H04L 29/06
                                                380/42
6,738,944 B1 *  5/2004  Kanai .................... G11C 7/16
                                                714/773
(Continued)

*Primary Examiner* — Cynthia Britt
*Assistant Examiner* — Dipakkumar B Gandhi
(74) *Attorney, Agent, or Firm* — Robert P. Greenspoon; Flachsbart & Greenspoon LLC

(57) ABSTRACT

A distributed data storage system breaks data into n slices and k checksums using at least one matrix-based erasure code based on matrices with invertible submatrices, stores the slices and checksums on a plurality of storage elements, retrieves the slices from the storage elements, and, when slices have been lost or corrupted, retrieves the checksums from the storage elements and restores the data using the at least one matrix-based erasure code and the checksums. In a method for ensuring restoration and integrity of data in computer-related applications, data is broken into n pieces, k checksums are calculated using at least one matrix-based erasure code based on matrices with invertible submatrices, and the n data pieces and k checksums are stored on n+k storage elements or transmitted over a network. If, upon retrieving the n pieces from the storage elements or network, pieces have been lost or corrupted, the checksums are retrieved and the data is restored using the matrix-based erasure code and the checksums.

20 Claims, 18 Drawing Sheets

Related U.S. Application Data continuation of application No. 13/297,262, filed on Nov. 15, 2011, now Pat. No. 9,098,519, which is a continuation-in-part of application No. 12/561,252, filed on Sep. 16, 2009, now abandoned.

(60) Provisional application No. 61/413,793, filed on Nov. 15, 2010, provisional application No. 61/175,779, filed on May 5, 2009, provisional application No. 61/097,345, filed on Sep. 16, 2008.

(51) Int. Cl.
| | | |
|---|---|---|
| *G06F 16/182* | (2019.01) | |
| *G06F 11/10* | (2006.01) | |
| *G06F 3/06* | (2006.01) | |
| *H03M 13/00* | (2006.01) | |
| *H03M 13/53* | (2006.01) | |
| *G06F 11/20* | (2006.01) | |

(52) U.S. Cl.
CPC .......... *G06F 3/0647* (2013.01); *G06F 3/0689* (2013.01); *G06F 11/1076* (2013.01); *G06F 16/134* (2019.01); *G06F 16/137* (2019.01); *G06F 16/182* (2019.01); *G06F 16/1827* (2019.01); *H03M 13/611* (2013.01); *G06F 11/2094* (2013.01); *G06F 2211/1028* (2013.01)

(58) Field of Classification Search
CPC .......... G06F 11/1076; G06F 17/30094; G06F 17/30097; G06F 17/30194; G06F 17/302; G06F 11/2094; G06F 2211/1028; G06F 16/182; G06F 16/1827; G06F 16/137; G06F 16/134

See application file for complete search history.

(56) References Cited

U.S. PATENT DOCUMENTS

| | | | | |
|---|---|---|---|---|
| 2001/0037406 | A1* | 11/2001 | Philbrick | H04L 29/06 709/250 |
| 2002/0166095 | A1* | 11/2002 | Lavi | H03M 13/2975 714/786 |
| 2005/0180459 | A1* | 8/2005 | Watson | H03M 13/1111 370/468 |
| 2009/0106626 | A1* | 4/2009 | Hou | G06F 11/1068 714/758 |
| 2010/0039286 | A1* | 2/2010 | Robbins | G01V 11/002 340/855.3 |

* cited by examiner

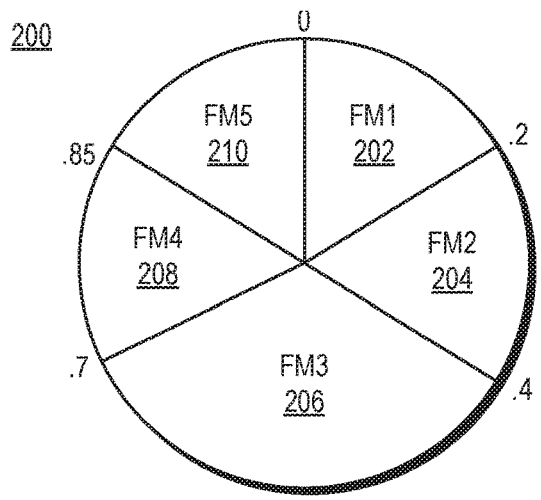
FIG. 2A
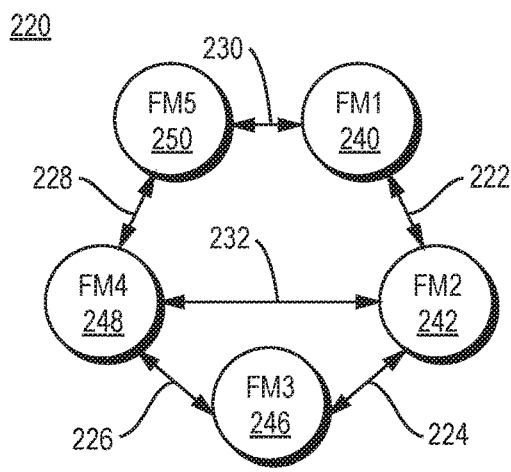
FIG. 2B
| FM | RANGE | PRED. | SUCC. | OTHER |
|---|---|---|---|---|
| FM1 | [0, .2) | FM5 | FM2 | |
| FM2 | [.2, .4) | FM1 | FM3 | FM4 |
| FM3 | [.4, .7) | FM2 | FM4 | |
| FM4 | [.7, .85) | FM3 | FM5 | FM2 |
| FM5 | [.85, 1.0) | FM4 | FM1 | |
FIG. 2C

MATRIX-BASED ERROR CORRECTION AND ERASURE CODE METHODS AND SYSTEM AND APPLICATIONS THEREOF

RELATED APPLICATIONS

This application claims the benefit of U.S. Provisional Application Ser. No. 61/097,345, filed Sep. 16, 2008, and U.S. Provisional Application Ser. No. 61/175,779, filed May 5, 2009.

This application is a continuation of U.S. patent application Ser. No. 14/816,039, filed Aug. 2, 2015, which claims the benefit of U.S. Provisional Application Ser. No. 61/413,793, filed Nov. 15, 2010, and which is a continuation of U.S. patent application Ser. No. 13/297,262, filed Nov. 15, 2011, which is a continuation-in-part of U.S. patent application Ser. No. 12/561,252, filed Sep. 16, 2009, which claims the benefit of U.S. Provisional Application Ser. No. 61/097,345, filed Sep. 16, 2008, and U.S. Provisional Application Ser. No. 61/175,779, filed May 5, 2009. The entire disclosures of these applications are herein incorporated by reference.

TECHNICAL FIELD

The present invention relates to error correction codes and, in particular, to erasure codes for data storage and other computing-related applications.

BACKGROUND

A fault-tolerant, or "recoverable", storage system is one that permits recovery of original data even in the event of partial system failures. A system can achieve recoverability by any of several means. One such method is replication, i.e. by keeping multiple copies of data. Replication is the primary recovery method used in RAID ("Redundant Array of Independent Disks") systems. Alternatively, a system can use an error correction code ("ECC") with proper redundancy to achieve recoverability. In general, error correction codes, of which erasure codes are a subset, are data representations that allow for error detection and error correction if the error is of a specific kind. Replication and error correction coding both use redundancy in order to ensure fault tolerance. The use of one or the other, or both, has been a design option for fault-tolerant storage systems since the earliest days of RAID.

A distributed hash table ("DHT") stores (key, value) pairs in a distributed system consisting of a set of nodes. Each node is responsible for a unique subset of keys, and all the nodes together are responsible for all possible keys. For example, if the keys are numbers in the range [0,1), then each node could be responsible for a connected subrange of numeric keys. Each node knows its neighboring nodes (i.e., it can communicate with its neighbors directly), so the DHT typically, although not necessarily, consists of a ring of nodes. A node can also be aware of other non-neighboring nodes, in order to increase connectivity and decrease the communication distance (hops) between nodes. A DHT can find the node responsible for a given key by starting at any node. If the node is not itself responsible for the key, then it queries the node it knows with the key closest to the desired key. This "greedy algorithm" converges quickly (generally logarithmically or better) to find the node responsible for the desired key.

Currently, in existing storage systems that employ error correction code redundancy schemes, responsibility for storage of data and for maintenance of storage data resides in a single component. Such systems do not employ distributed hash tables and do not disconnect the responsibility for the storage from the actual maintenance of the storage. As a result, these systems have single points of failure and cannot reconstruct failed drives in less than the time it takes to rewrite the entire drive.

SUMMARY

The present invention is a dynamically scalable redundant distributed storage system and method. The system may be implemented as a distributed heterogeneous or homogeneous file storage system with robust failure recovery. The system requires no special hardware, and is highly scalable. The system design divides the logical responsibility for the data from the actual control of the data by using separate file and storage manager components. A preferred embodiment of the system employs inexpensive heterogeneous components and a distributed hash table (DHT).

In one aspect, the invention is a dynamically scalable redundant distributed storage system comprising a set of file managers, each of which is responsible for providing access to stored files or data blocks and storing metadata associated with each of the files and data blocks for which it is responsible, the metadata including a unique file identifier for each file or data block; a file manager control component that allocates individual responsibilities among the file managers, assigns file management responsibilities for individual files and data blocks to individual file managers, and maintains a record of which files and data blocks are assigned to each file manager; a set of storage managers, each of which is responsible for managing the storage of files and data blocks on one or more data storage devices for which it is responsible and maintaining a record of the location of each stored file and data block on the data storage devices; a storage manager control component that allocates individual responsibilities among the storage managers, assigns file storage responsibilities for individual files among the individual storage managers, and maintains a record of which files and data storage devices are assigned to each storage manager; and at least one client that provides user access to the storage system, initiates actions within the storage system by means of the file manager control component and the storage manager control component, and implements a redundant data recovery and reconstruction scheme.

The file manager controller and the storage manager controller may be implemented using distributed hash tables. The distributed hash tables may be implemented as lists. The file manager distributed hash table list may comprise an entry for each file manager, each entry comprising a range of unique file identifier values assigned to the files or data blocks for which the file manager is responsible. The physical devices comprising or hosting the components comprising the storage system may be heterogeneous or homogeneous. The components of the system may be implemented in software using functional programming. The redundant data recovery and reconstruction scheme may employ error correction code methods, including matrix-based erasure codes, or may employ file replication methods. Any single component may be replaced by a group of components. Additional components may be added to the system dynamically while the system is in use. A component that has failed and then been repaired may be reutilized by the storage system. A file manager may act as a client. The system may be asynchronous, having no system clock. The file manager control component and storage manager control component may perform load balancing. The level of redundancy required by the redundant data recovery and reconstruction scheme for each file or data block may be assigned individually to each file or data block. The level of redundancy required by the redundant data recovery and reconstruction scheme may take the form of predetermined minimum and maximum redundancy levels.

In another aspect, the present invention is a method for ensuring restoration and integrity of data in computer-related applications using a dynamically scalable redundant distributed storage system that includes the steps of: dividing logical responsibility for files and data blocks from actual control of the files and data blocks by providing a group of file managers, each file manager having responsibility for providing access to a group of stored files or data blocks and configured to store metadata associated with each of the files and data blocks for which it is responsible, the metadata including a unique file identifier for each file or data block; allocating individual responsibilities among each of the plurality of file managers by assigning file management responsibilities for individual files and data blocks to individual file managers; maintaining a record of which files and data blocks are assigned to each file manager; providing a group of storage managers, each storage manager having responsibility for managing the storage of files and data blocks on one or more data storage devices for which it is responsible and configured to maintain a record of the location of each stored file and data block on the data storage devices; allocating individual responsibilities among each of the plurality of storage managers by assigning file storage responsibilities for individual files among individual storage managers; and maintaining a record of which files and data storage devices are assigned to each storage manager; implementing a redundant data recovery and reconstruction scheme; assigning a unique file identifier to each file or data block; storing, according to the redundant data recovery and reconstruction scheme, the metadata associated with each of the files and data blocks, including the unique file identifier for each file or data block; storing, according to the redundant data recovery and reconstruction scheme, the files and data blocks on one or more data storage devices; and recording the location on the data storage devices of each stored file and data block.

The method may include the step of providing user access to the storage system by means of a client that initiates actions within the storage system. The steps of allocating individual responsibilities among file managers and maintaining a record of which files and data blocks are assigned to each file manager may be performed by a file manager control component. The file manager control component may be a distributed hash table. The steps of allocating individual responsibilities among storage managers and maintaining a record of which files and data storage devices are assigned to each storage manager may be performed by a storage manager control component. The storage manager control component may be a distributed hash table. The redundant data recovery and reconstruction scheme may employ error correction code methods or replication of files and data blocks. The method may include the step of reconstructing data by the steps of: detecting loss or corruption of files or data blocks; retrieving stored metadata for the files or data blocks; using the retrieved metadata, locating, retrieving, and reconstructing the stored files and data blocks; and reallocating responsibility for the reconstructed data. The method may include the step of individually assigning, for each file or data block, the level of redundancy required by the redundant data recovery and reconstruction scheme. The method may include the step of establishing minimum and maximum redundancy levels to be required by the redundant data recovery and reconstruction scheme.

The metadata may be discovery metadata comprising a unique key for each file or data block, a predetermined desired redundancy level and type of data recovery, and reconstruction scheme designation for each file or data block. The file manager control component may be a distributed hash table that supports addition and removal of file managers, load balancing, and associating keys with responsible file managers. The storage manager control component may be a distributed hash table supports addition and removal of storage managers, load balancing, and associating keys with responsible storage managers. Each storage manager may be able to be accessed to write, retrieve, and modify the data on any file or data block it is responsible for. The storage managers may be able to lock file or data blocks. Each file manager may be associated with discovery metadata about the file manager and the file manager discovery metadata may be stored in a file or data block in the distributed storage system.

In a further aspect, the present invention is a method for ensuring restoration and integrity of data in computer-related applications using a dynamically scalable redundant distributed storage system that comprises the steps of distributing data file storage across a plurality of data storage devices by breaking each data file into to shreds and distributing the shreds across multiple data storage devices; reconstructing failed data storage devices by using redundancy or duplication to recover the stored data files on the failed data storage devices; and restoring the recovered data files by distributing them across, and storing them on, free space on the remaining data storage devices. In yet another aspect, the invention is a distributed storage system configured to rapidly reconstruct a failed storage element by distributing data storage across a number of storage elements and reconstructing data stored on the failed storage element by breaking each data file into shreds, distributing the shreds across multiple storage elements, using redundancy or duplication to recover the data from errors, and distributing the recovered data onto free space on the remaining system storage elements.

BRIEF DESCRIPTION OF THE DRAWINGS

The drawings depict illustrative implementations of this invention or provide information that relates to those implementations. This invention may be advantageously implemented in any of the many other ways that will be apparent to one of skill in the art of the invention. Other aspects, advantages and novel features of the invention will become more apparent from the following detailed description of the invention when considered in conjunction with these accompanying drawings. In the drawings:

FIG. 2A-C are three views of an exemplary embodiment of a file manager distributed hash table (DHT) with five nodes, according to one aspect of the present invention. FIG. 2A presents the distributed hash table as a circle, FIG. 2B presents it as a graph, and FIG. 2C presents it as a list.

DETAILED DESCRIPTION

Figure 1:
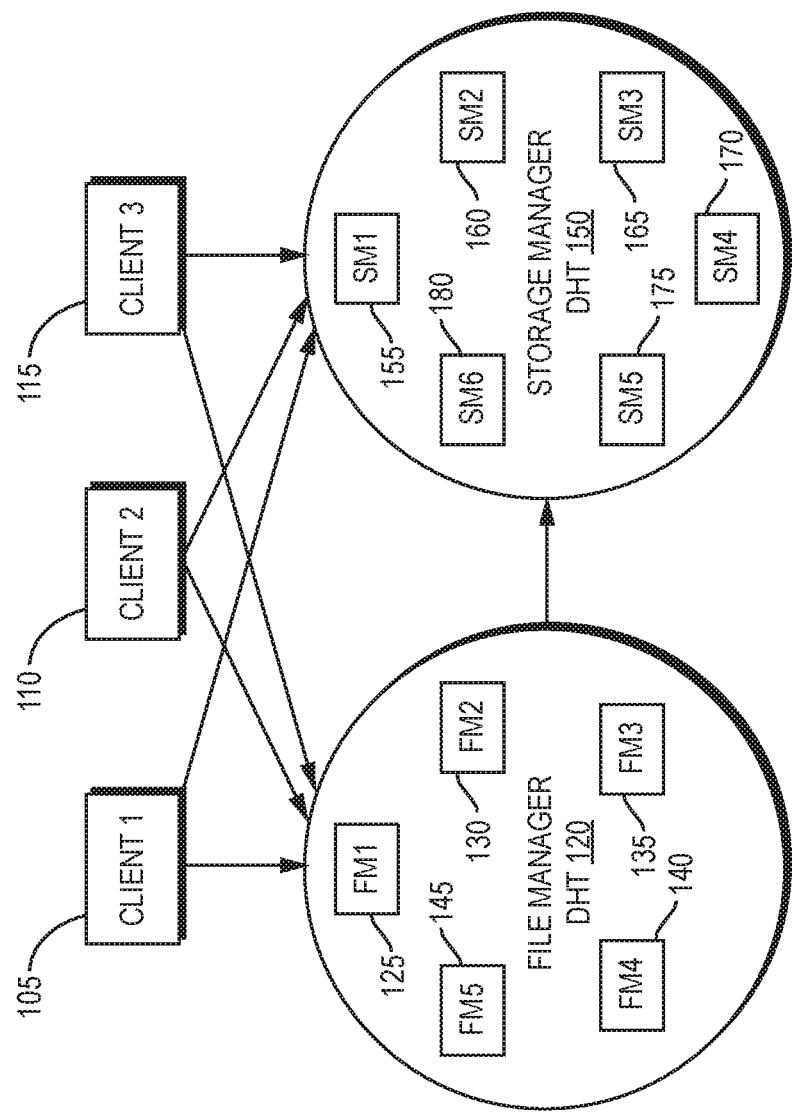
FIG. 1 is a high-level overview of the functional structure of an exemplary embodiment of a dynamically scalable redundant distributed storage system according to the present invention.

The present invention is a dynamically scalable redundant distributed storage system and method. A system according to the present invention distributes storage over a set of storage devices, sometimes called nodes, using redundancy to allow recovery after node failures. The system divides the logical responsibility for the data, which is given to a file manager in a preferred embodiment, from the actual control of the data, which is held by a storage manager in the preferred embodiment.

As used herein, the following terms expressly include, but are not to be limited to:

"Client" means a component that allows a user to access the file storage system. A file system component (such as a file manager) sometimes also acts as a client.

"Component" means a system component (or node) that is computer process implementing, for example, a client, a file manager, or a storage manager. A single server can provide one or more components.

"Data" means the actual content of a file, as opposed to file metadata.

"Distributed hash table" and "DHT" mean a hash table that shares (key,value) pairs among a number of servers called nodes. It allows load balancing between servers, can detect and respond to server failures, and provides relatively quick access time.

"Error correction code" means data representation that allows for error detection and correction if the error is of a specific kind. An error correction code (ECC) uses redundant information to recover data despite the occurrence of errors. For example, a file may be stored in multiple pieces with checksums to allow the recovery of the file if some pieces are lost. As defined herein, "error correction code" and "ECC" do not include replication.

"Erasure code" means an error correction code that transforms source data of k blocks into data with n blocks (n being more than k), such that the original data can be reconstructed using any k-element subset of the n blocks. Erasure codes are a specific subset of error correction codes.

"File manager" and "FM" mean a component responsible for accessing a file in the file storage system. Each file manager stores metadata for the files for which it is responsible.

"Metadata" means information about a file, such as its size, location, creation time, modification time, access permissions, redundancy parameters, and the like. Metadata is all forms of data that describe a file, as opposed to being the data in the file itself. In general, the size of this information is much smaller than the size of the file itself.

"(n, k)" are error correction code (ECC) parameters, wherein n gives the total number of shreds, k gives the number of shreds required for reconstruction.

"Redundancy" means a file storage method that maintains multiple shreds or multiple copies of the file, such that any copy can be accessed independently. Both ECC and replication are redundant storage methods.

"SHARDS" means "Scalable Heterogeneous And Redundant Distributed Storage", which is the name given by the inventors to a particular preferred embodiment of the present invention, which embodiment has been implemented as a prototype of a system according to the present invention.

"Shred" means a piece of stored file data, required to retrieve or reconstruct a part of a file. If the file has been replicated, then only one shred is required for reconstruction. If redundancy is achieved by ECC, then multiple shreds are required for the reconstruction.

"Storage manager" and "SM" mean a component that manages data storage on one or more data devices.

"Stripe" means a piece of a file with a predetermined size.

In one aspect, the invention can be viewed as providing a protocol for the coordination and behavior of several agents, providing an extremely reliable storage system that supports addition, subtraction, and recovery from asynchronous failure of agents, all without interruption of service. In this context, an agent is a computing device capable of communication with other agents, retention of information, and on-demand transmission of information derived from the retained information. In an exemplary embodiment, an agent is a computer communicating with other agents via TCP/IP (on a local network or the global internet), retaining information using semiconductor memory supplemented with a solid-state or conventional disk-based file storage system. In distinction from existing systems, such as redundant disk arrays, there are no constraints on the location of agents and, beyond support for the defined protocols, there is no required homogeneity among agents. In this context, a storage system is a device for acceptance, retention, and production of user-supplied information. Information to be retained is associated, at the time of acceptance, with another piece of information, known as the "key", which is used to identify the retained information upon retrieval. Within a single storage system, distinct pieces of information are associated with distinct, unambiguous keys. While some of the utility of a storage system derives from the indirection between keys and stored values, i.e., that a storage system can be thought of as a lookup table or dictionary, the phrase "storage system" emphasizes the fact that retained values, considered numerically, are larger than are their associated keys and thus require more physical media for their retention (in common parlance, a file is bigger than a file name, a disk block is bigger than a block index). Common examples of storage systems include disk drives, in which (typically) fixed-size contiguous blocks of data are keyed by numeric indices ("block numbers"), and conventional file systems, in which variable-sized (typically) contiguous blocks of data are keyed by character strings ("file names").

A system according to the present invention may be implemented as a distributed heterogeneous or homogeneous file storage system with robust failure recovery. The system uses storage efficiently and provides fast access to data. Having no centralized control point, it can tolerate and recover from the failure of one or more components more quickly than conventional systems. The system requires no special-purpose hardware, and is dynamically scalable. In a preferred embodiment, the system employs inexpensive heterogeneous components, but it will be clear to one of skill in the art that it can equally employ homogeneous components. Since the file system can be heterogeneous and new machines can be added at will, including while the system is running, and the average cost of adding storage is constant (logarithmic in worse case), the system scales efficiently.

In the preferred embodiment, the system is fully distributed, with multiple cooperating components that communicate with one another directly, without a centralized control point and without the use of a synchronizing system clock. Instead, local clocks are used for leases and error detection timeouts. Because the system divides the logical responsibility for the data from the actual control of the data, ownership of the data can be reconstructed extremely quickly, while the responsibility for reconstructing the actual data is distributed. Since recovery of the actual data is the part that is extremely slow, it can be distributed among the entire system. This permits utilization of the entire bandwidth of the system, as opposed to the bandwidth of a single machine.

The system of the invention assumes that at most a fixed number of nodes may fail at any given time, and it guarantees data integrity as long as the assumed number of failures is not exceeded. The system can survive even a large number of failures as long as the speed of failure is not larger than the speed of recovery (which is extremely fast). It can be scaled and enlarged with more machines without affecting the speed of access of currently used machines.

The preferred embodiments of the system use either error correction codes (ECC) or replication for distributed storage. For example, the error correction code used may be an erasure code, such as a Cauchy-Reed-Solomon erasure code. A preferred embodiment of the use of such a code is described in co-pending U.S. patent application Ser. No. 12/561,252, entitled "Matrix-Based Error Correction And Erasure Code Methods And Apparatus And Applications Thereof", which has herein been incorporated by reference in its entirety. If error correction coding is used, the system stores shreds of a file on multiple nodes. If replication is used, the system stores copies of a file at multiple nodes.

In a preferred embodiment, a client may set the desired redundancy (robustness) level on a per-file basis. In addition to user files (files created by clients), a system according to the invention also stores system files (files created by the system itself) with a given redundancy level. Specifying a higher redundancy level for files under high demand allows the system to perform more efficient load balancing. It also permits the system to take geographical demands into account. The system also supports the specification of multiple and maximum redundancy levels as an alternative to a single fixed redundancy level. In such a case, the system repairs failures only when it reaches the minimum redundancy level, and it creates additional redundancy until it reaches the maximum level The level of redundancy for each file essentially specifies how many nodes can fail in the worst case without compromising the ability of the system to reconstruct the file. The system recovers very quickly from failures, so long as the number of failures is not greater than the specified number of tolerated failures. For example, if the system uses ECC, stores eight shreds on separate nodes, and requires four shreds for reconstruction, then it will always be able to reconstruct so long as fewer than five nodes fail. Similarly, if the system uses replication to, for example, store five copies of a file on separate nodes, it will always be able to produce the file if fewer than five nodes fail, but recovery of the file might be impossible if five or more nodes fail.

In a preferred embodiment, the system employs a distributed hash table (DHT). Unlike current DHT-based systems such as Bittorrent, the present invention can achieve faster than logarithmic storage access and assures data availability in the presence of multiple disk failures. A distributed hash table provides a convenient way of organizing a group of computers (nodes). While a distributed hash table is used throughout this disclosure in the description of the preferred embodiment of the invention, many other implementations of the same functionality provided by this element will be clear to one of skill in the art of the invention and are considered by the inventors to be within the scope of the invention.

In a preferred embodiment of the invention, a file storage system is implemented using two DHTs: one DHT that forms a group of file managers and another DHT that forms a group of storage managers. This embodiment stores each file identifier as a key in the file manager DHT. Each node in the file manager DHT has a corresponding file manager, responsible for all files with file identifiers (keys) within a given range. Similarly, the embodiment stores a block identifier for each available storage unit as a key in the storage manager DHT. Each node of the storage manager DHT has a corresponding storage manager. Because of this structure, the system of this embodiment has a single point of responsibility for each file and for each storage block; that is, a specific file manager is responsible for a given file at any given time, and a specific storage manager is responsible for a given block at any given time.

To create a file in this preferred embodiment, a client (typically a user process, although in some instances a system process) contacts the responsible file manager through the file manager DHT (e.g., by choosing a random number as file id and asking which DHT node is responsible for that key) and receives permission to create the file. Once created, file information is a (key, value) pair in the DHT, where the key is the file id and the value is file metadata stored by the file manager. Responsibility for the file can change over time as the DHT is modified (for example, moving to a different file manager node due to load balancing), but a single node is responsible for any given file at any time.

The file manager assigns the disk storage required for the file to various storage managers. The storage managers actually allocate disk space and report back to the file manager. The parallel use of multiple storage managers speeds up file access, as access need not be limited by the disk bandwidth available on a single storage device. A directory (file tree-structure) can simply be a file containing a list of file identifiers, and is itself stored in the file manager DHT so that directories are robust against failure, just like other files.

A key aspect of the present invention is that it separates the responsibility for storing file data, which is handled by storage managers, from the responsibility for storing information about the file (i.e., file metadata), which is handled by file managers. The amount of file metadata is generally very small relative to the amount of file data. Disentangling file data from metadata therefore allows the system to distribute file data over multiple storage units. This allows the system to add new components (file managers and storage managers) in order to dynamically scale storage capacity.

A preferred embodiment uses the file manager DHT to maintain a file store that is distributed across multiple servers. It adds a level of data maintenance, using the DHT to ensure that file metadata stored by a file manager persists even if the file manager fails. Unlike competing systems, the system backs up metadata in the distributed storage system itself, assuring its robustness even after a file manager failure.

The embodiment also uses the DHTs to detect component failures and to allocate the responsibility for reconstruction when failures occur. In the normal state, every file stored in the system has the desired level of redundancy. After component failures, some files may not have the desired level of redundancy, so the system is in a recovery state until it restores the desired redundancy. By design, the system is in the recovery state for a minimal amount of time following any node failure. If too many component failures occur, so that it is impossible to reconstruct a file, then the system is in a corrupted state. The system enters the corrupted state only if the number of component failures exceeds the specified maximum.

The division of the system between the responsibility for a file (file manager) and the responsibility for actually storing the file (storage manager) permits dynamically adding new servers to the system. When adding a new file manager, the new file manager is first added to the DHT and then takes responsibility for a subset of the files whose values lie in a given range. Since the metadata file is extremely small, it is easy to transfer responsibility for a file. Adding a storage manager is also easy, by simply adding a storage manager with responsibility for a small area (a small area which is empty can always be found) and using the DHT (or other) load balancing to increase the responsibility of the new storage manager. It is also possible to remove file managers by merging metadata files. Removing storage managers can be done by slowly moving files (and responsibility) to adjacent storage managers and letting the load balancing mechanism deal with the rest of the system.

The use of redundancy introduces several performance tradeoffs. When the system needs to retrieve a file, it can request multiple copies of the file (if stored redundantly) or extra shreds (if stored using an ECC). This results in faster receipt of sufficient data to provide the required file, but at the cost of increased system load. Similarly, the system can require the receipt of more copies or shreds than needed before it provides the file, allowing it to check the received data for correctness, but at the cost of slower performance.

FIG. 1 presents a high-level overview of the functional structure of an exemplary embodiment of a dynamically scalable redundant distributed storage system according to the present invention. As shown in FIG. 1, three clients 105, 110, 115 communicate with file manager DHT 120 containing 5 nodes 125, 130, 135, 140, 145 and with storage manager DHT 150 containing 6 nodes 155, 160, 165, 170, 175, 180. Each file manager or storage manager node may reside on a separate server, or a single server may be host to multiple nodes, or, as will be clear to one of skill in the art of the invention, any combination of servers hosting single nodes and servers hosting multiple nodes may be advantageously employed in the invention.

A system according to the present invention requires no special purpose hardware. For example, in a prototype embodiment, the system hardware comprises a set of commodity personal computers running Linux and communicating via TCP/IP networking. An advantage of the invention is that storage units (disks) can be heterogeneous, constructed from components with different properties (such as, for example, storage units with varying storage capacities), and an administrator can add or remove storage units without interrupting the operation of the system. In addition, the replacement for a failed component does not need to be a single unit; rather, any component can be replaced with either another single component or by multiple components. In some embodiments, the system can be made up of systems running different operating systems, and thus is heterogeneous in that fashion.

In the prototype embodiment, software comprises programs written in the functional programming language Erlang, using Scalaris as a DHT. This takes advantage of the parallel processing capabilities of Erlang. While a prototype embodiment is described, it will be clear to one of skill in the art of the invention that many other implementations are possible, for example, on small single-board computers with ARM processors and SATA disks as hardware, and/or with software written in C, C++, or any other suitable language.

In a preferred embodiment, the distributed file system uses functional programming idioms at all levels. The data maintained by the file manager and storage manager consists of a functional key-value store in which FileIdentifers or BlockIdentifiers are the keys and the FileMetadata or BlockMetadata are the values. Time consuming operations performed on file manager or storage manager data are designed to work with a copy of the manager data and send update notifications to the affected file manager or storage manager when the operations complete. The manager decides whether the notifications are incorporated into the live copy of the manager data or discarded if they have been obsolesced while being computed. This idiom is applied to operations on the entire set of data kept by a manager and to operations on a single file or block data.

A preferred embodiment of the invention uses a distributed hash table (DHT) as a component. A DHT may be thought of as a division of a circular address space (its key space) into sectors, such that each DHT node is responsible for one sector of the address space. For example, the address space might be keys in the numeric range [0,1), with each node responsible for a connected segment of the range. The DHT maintains connections (communication paths) between nodes, forming a graph with DHT nodes as points and connections between nodes as edges. Each node connects directly to its immediate neighbors, i.e., to the two nodes responsible for its neighboring segments. Each node also connects to some additional nodes—which additional nodes those are depends on the specific DHT implementation. The DHT routing mechanism allows it to efficiently find the node responsible for any key. The DHT uses non-adjacent connections for more efficient long-distance routing; for example, the routing algorithm may be a greedy algorithm. Close key values are generally controlled by nodes connected via a short path (i.e., by a small number of hops). These DHT attributes result in a polylogarithmic routing mechanism to find any key, with polylogarithmic out-degree and in-degree for any node.

There are different types of distributed hash tables. It will be clear to one of skill in the art of the invention that the specific DHT implementation details will differ between the various types of DHTs. For the preferred embodiment of the invention, the specific choice of DHT implementation is unimportant, as long as the DHT has the ability to find any key with low cost, low degrees, and some type of load-balancing. Which type of DHT is selected will therefore depend on the particular system implementation. Some of the factors to consider when choosing a DHT are the out-degree (number of neighbors each node has), the speed of routing from any two points, the load balancing properties, and the communication overhead of the system. In some cases, the use of a geographically load-balanced DHT is preferable.

While the preferred embodiment of the invention employs a distributed hash table in order to divide responsibility among a set of machines, such that every file has a single machine responsible for it, it will also be clear to one of skill in the art of the invention that any mechanism that allocates responsibility for file maintenance among the machines can be advantageously employed in the present invention. This responsibility does not have to be unique. For example, but not limited to, a byzantine quorum system may be used to allocate responsibility. Similarly, any agreement protocol may be employed.

In an embodiment employing a DHT, the DHT reallocates DHT address space and updates DHT connection paths whenever a new node is added to the DHT. When a new file manager or storage manager is added to the system, the added node announces itself to the file manager DHT or storage manager DHT. This allows the system to add new file managers or new storage managers (that is, additional storage) with no disruption in its operation. As will be clear to one of skill in the art of the invention, the specific DHT algorithms and interface implementation details will depend on the choice of a specific DHT implementation. The DHT implementation will preferably ensure that keys are generally load-balanced, so that no node is responsible for a 'relatively' large number of keys. Access frequency among the nodes of the DHT should be fairly uniform to achieve file manager load balancing. The DHT interface typically includes the abilities to add/remove nodes from the DHT, to load balance, to insert and remove key/value pairs, and to query an existing key to get the associated value.

While logical separation of the DHT from the data has many advantages, it also has some possible disadvantages. In particular, logarithmic number of hops is often considered desirable for DHTs (that is, the communication distance between any two nodes is logarithmic in the number of nodes). For a file system, this may be problematic. For some applications, such as torrent files, the quantity of data, and hence the time required to retrieve the data, massively dwarfs the logarithmic time required to find the data. For other applications such as, for example, retrieving a small amount of data, even a logarithmic delay may be insufferable. Many existing file systems avoid this problem by allowing direct access to files. However, this is costly for other aspects of the system, such as dealing with failures.

While the DHT has been previously described as a graph, it will be clear to one of skill in the art of the invention that it is also possible to view a DHT as a list. The list contains an entry for each node, giving the range of values for which the node is responsible. The file manager is a node in the file manager DHT that is responsible for a given range of keys (file identifiers). By the construction of the DHT, exactly one node is responsible for any key. A preferred embodiment of the present invention stores each file with a unique file identifier, a number in the range [0,1). Node i in the file manager DHT is responsible for file f if the file id (key) for f is k and the range for which node i is responsible contains k. By the properties of the DHT, this node is unique; that is, a unique file manager node is responsible for any given file. Each file manager node i maintains metadata for every file for which it is responsible. In general, all access to file f is performed through file manager i. Since each file has a single responsible file manager node, the system can use the file manager to implement properties typically associated with centralized systems, such as locking.

The file manager controls creation, deletion and modification of metadata associated with a file. The file manager mediates all access to the files for which it is responsible and can implement some types of locks. The file manager maintains metadata for all files for which it is responsible and ensures that the metadata can survive even if the file manager itself crashes by distributing the metadata in the distributed system. The file manager also keeps in touch with its neighboring DHT nodes and defines the current status of neighboring nodes by agreement with other DHT nodes. Since some files are seldom accessed by clients, the file manager preemptively performs error checking (scrubbing) for files that have not been checked in a long time. The file manager metadata for each file includes the most recent file scrub time.

FIGS. 2A-C are three views of an exemplary embodiment of a file manager distributed hash table (DHT) with five nodes, according to one aspect of the present invention. FIG. 2A presents the table as a circle 200, with each sector 202, 204, 206, 208, 210 representing the portion of the key space [0, 1) for which a file manager (FM) is responsible. FIG. 2B presents it as a graph 220, with each arrow 222, 224, 226, 228, 230 representing a communication path between two of the file manager nodes 240, 242, 246, 248, 250. FIG. 2C presents it as a list 260 containing the range 262 and graph 264 information for each file manager 266 in the DHT.

A system according to the invention uses this multiplicity of representations of the DHT to solve the access issue. Given the list, a node can access data efficiently by simply looking up the node responsible for any given key. Of course, due to the distributed nature of the DHT, the list may not be completely accurate when used, since constructing the list takes time, during which a node failure or DHT rebalancing might occur. However, even if the list is outdated, it still leads to a node that is close to the desired node, so a very small number of hops leads to the node currently responsible for the desired key.

The storage manager is responsible for management of a storage device (typically, a physical disk). The present invention does not assume that the sizes of storage devices are the same; thus, the underlying storage can be heterogeneous. The storage manager simply reads or writes data to the device when requested. In addition, for some files (depending on the metadata), the storage manager can lock data on a byte level. Since the storage manager is responsible for disk management, in particular, it implements a disk allocation strategy based on a standard algorithm for allocating local disk space (such as, for example, "first free"). The exact algorithm is not critical, and, as will be apparent to one of skill in the art of the invention, can be determined for any particular implementation based on workload analysis. The storage manager can be accessed to write, retrieve and modify the data on any block it stores. Potentially, the storage manager can also implement some types of locks.

Figure 3A:
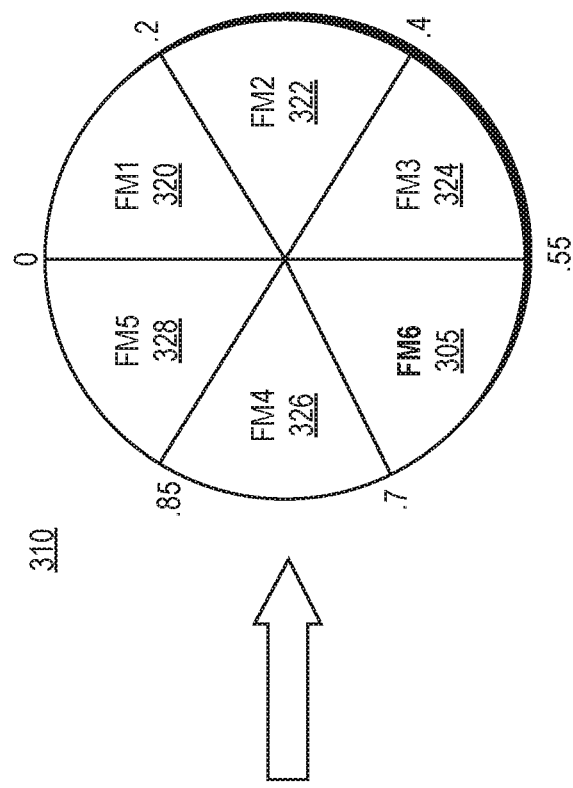
FIG. 3A depicts an example of the addition of a node to a distributed hash table.
Figure 3A:
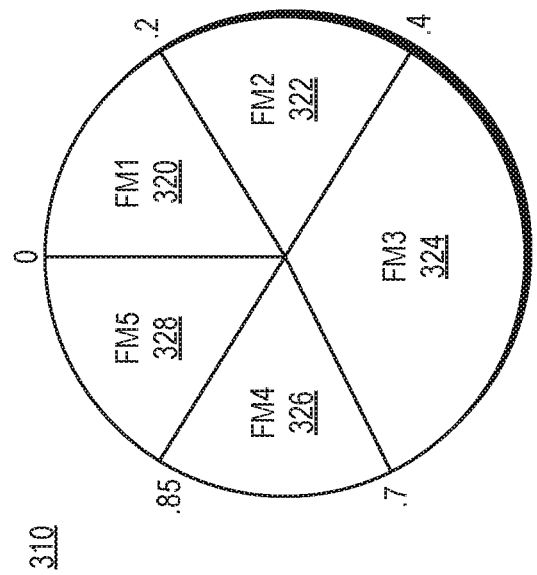
Figure 3B:
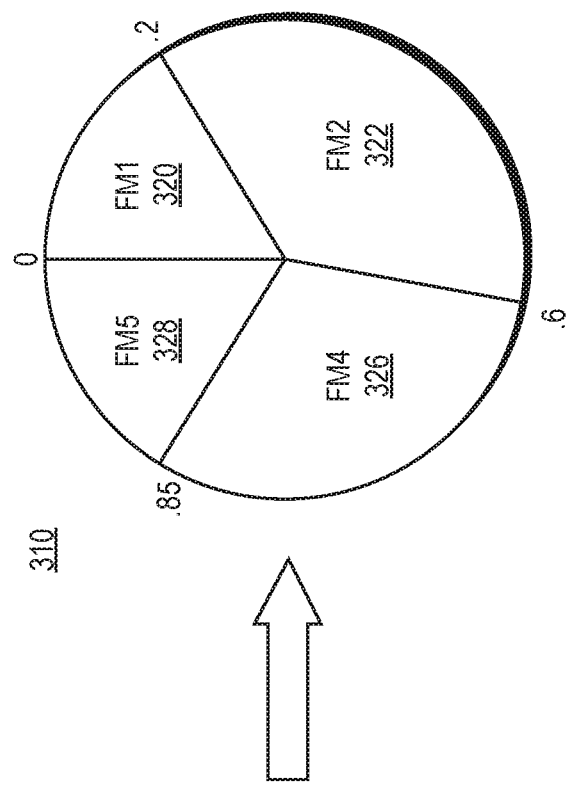
FIG. 3B depicts an example of the removal of a node from a distributed hash table, according to one aspect of the invention.
Figure 3B:
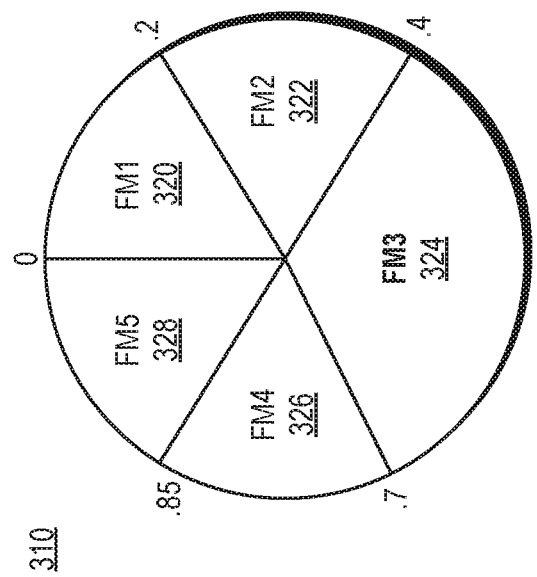

FIGS. 3A-B depict examples of the modification of a file manager DHT by addition or removal of a node. In FIG. 3A, node FM6 305 is added to file manager DHT 310 with five existing nodes 320, 322, 324, 326, 328, with node FM6 305 becoming responsible for part of the sector for which node FM3 324 was previously responsible. In FIG. 3B, node FM3 324 is removed from file manager DHT 310, with neighboring nodes FM2 322 and FM4 326 assuming responsibility for the sector for which node FM3 324 was previously responsible. The example presented in FIGS. 3A-B depicts a file manager DHT, but it will be clear to one of skill in the art of the invention that modification of a storage manager DHT example would be similar.

In a preferred embodiment, a client initiates file read, write, modify, and other operations. The client typically is a file system daemon running on the user's computer. For some special files (such as metadata files), a file manager may also be a client. In general, a client checks for errors whenever it accesses a file. If it detects an error (e.g., via extrapolating an ECC), the client notifies the responsible file manager. The client then attempts to fix the corrupted file by returning it to the required redundancy. If the client does not return to the file manager within an allocated time, the file manager then completes the required correction itself.

The client effectively represents the file system "user". It creates, reads, modifies and deletes files. It can also ask for locks. The client can also perform file striping (i.e., breaking a large file into smaller pieces) and file shredding (i.e., generating ECCs if desired). The client is an unavoidable point of failure for all actions, since it is the initiator, so the system makes it the sole possible point of failure, by requiring it to authenticate the successful completion of every action.

The system maintains metadata associated with every file. The metadata can include standard file system information such as creation time, modification time, and size. The metadata contains additional information related to the distributed nature of the file system, such as, but not limited to, block locations. Block locations are just pointers to storage managers, i.e., entries in the storage manager DHT. File metadata also contains information about the type and degree of redundancy with which the file is stored. For example, if using an error correction code, the metadata includes the number of shreds needed for recovery, as well as the number of shreds that can be lost without losing resiliency. The metadata may also include data about locks.

In a preferred implementation, the metadata for all files managed by file manager node i is kept in a file on node i. This metadata file also contains local connectivity data about the DHT, including the neighbors of node i to distance 2 and the range of values for which i is responsible. This file (say $m_i$) is itself treated as a file in the file system and hence made redundant. This file also contains the values $m_j$ for all j which are neighbors of i. This is important for healing/recovering metadata files.

A preferred embodiment of the present invention uses two types of metadata. The first type, called discovery metadata, is the metadata required to discover a file (that is, to find where the file is stored, for example, in order to read it). Discovery metadata includes file name, block IDs, desired redundancy and error correction scheme, and soft parameters (if any). Discovery metadata changes very infrequently. The second type of metadata is utility metadata. Utility metadata specifies file properties that are useful once the file data is known. Utility meta-data can include, but is not limited to, modification time and access time.

The system stores all file metadata at the file manager level, as this makes certain types of queries easy. However, not all of the metadata will be the responsibility of the file manager to backup. Utility metadata can be backed up by the storage manager within (or as part of) the file itself. This is useful, since it prevents recursion when modifying a file, inasmuch as the change of discovery metadata can yield at most one backup of a file manager metadata file, whereas the change of utility metadata requires no backup of a file manager metadata file. This also means that, for most accesses of a file, no change is required at the file manager level. Not all metadata is maintained for all files. For instance, "time accessed" will not be maintained for some file systems according to the invention. This can be a per file decision, although the choice of which metadata to store for a given file is utility metadata. This division of labor slightly complicates the recovery process, as when recovering the metadata for a file manager, which involves both recovering the discovery metadata from the file manager backed-up file as well as polling the storage manager to calculate the latest accurate utility metadata (i.e. that which is held by the latest quorum of storage manager). However, this cost rises infrequently and is not expensive compared to the optimization achieved in average cost complexity. The present invention is the first system in which the metadata of blocks/files is offloaded to the lowest possible location on the hierarchy. In fact, some of the metadata is only backed up at the storage manager level, although it will be maintained in memory of the file manager for faster access.

The ability to lock files is a desirable file system property, but can be difficult to achieve in a distributed file system. As a result, some distributed systems do not enable locking, and some support only read-only files. A preferred embodiment of the present invention implements file locking at the file manager layer. It provides several methods of locking:
  Standard locking of an entire file.
  Locking of a part of the file, via either the file manager or the storage manager (used for databases, for example).
  Update notification: while not a lock in the classic sense, it is rather a request by a client to be informed whenever a file changes. This can be useful when multiple clients modify the same file.

A distributed system with many possible users might require access control, which can be difficult to achieve in a distributed system. The system of the invention leverages the fact that every file has a unique file manager responsible for it to achieve file security. A simple mechanism wherein the client encrypts file data only assures security of data, not of file access. To achieve security of access, a preferred embodiment of the invention uses public-key cryptography between client and file manager when it creates a file. The client uses the public key of the system to communicate with the file manager. The client encrypts and gives the file manager a symmetric key that controls access to the data. The file manager encrypts using symmetric cryptography and sends a different password, pb, for each block to all storage managers that have parts of the data. When accessing data, the client contacts the file manager and requests a block. The file manager then encrypts (pb, t, random) using the symmetric encoding it shares with the storage manager and gives it to the client. The client then uses this as a token to retrieve the data from the storage manager. The embodiment uses this schema for all grants of access (as well as locks) to data from a file. All such access and locks have a time-limited license, in order to prevent a dead client from maintaining a lock. The length of the time grant provided by licenses can be made dependent on the metadata of a file.

Load balancing is the ability to ensure that the amount of work each machine is doing is related to the work that other machines do, such as, for instance, ensuring that the work the machines do is within a constant proportion of each other. When a system is properly load balanced, the maximum amount of work on each machine is decreased, and hence the number of machines and the power requirements of each machine is decreased. This minimizes the cost of the system. As an example using load balancing: Given a file manager, FM_1, with responsibility for a file which resides in storage managers SM_1, . . . , SM_k; if FM_1 feels that it is overloaded, it can create more storage managers (since the load for any storage manager is less than the load for the file manager for the same file). Once the ratio of load on a storage manager to the number of storage managers is high enough, the FM_1 can outsource the provision of storage managers to neighboring file managers, since all queries to FM_1 are routed via a neighbor. Recursively doing this yields load balancing.

A preferred embodiment of the system manages several aspects of load balancing for optimal performance:
1. Load balancing of the DHT key range.
2. Load balancing of the communication load among storage managers.
3. Load balancing of disk usage among the storage managers.
4. Geographic load balancing, which allocates files to storage managers that are closer to where they will be accessed from. This renders access faster if the request comes from the usual area of access.

There are tradeoffs between the different aspects of load balancing. Furthermore, there are tradeoffs between the costs and the benefits of load balancing. There are two classes of load balancing algorithms. In static load balancing, data is not moved after its initial allocation. In dynamic load balancing, data may be moved after creation. The preferred embodiment uses both classes of load balancing. The system performs static load balancing when a file is created or modified, as well as dynamic load balancing based on changing load. It performs dynamic load balancing when static load balancing does not suffice, such as, for example, when large portions of the system crash, based on anticipated need as well as on system resources. For load balancing in the key-space, there is no resource constraint, as the load is minimal, so the system can load balance keys frequently The load balancing mechanism of the underlying DHT performs balancing among DHT keys. This type of load balancing typically balances keys and not key usage, but a key balancing algorithm can easily be modified to a key usage balancing algorithm by weighting keys with their time-weighted average use and normalizing.

A preferred embodiment of the system achieves static load balancing among storage managers on file creation as follows. When creating a file requiring b blocks, the system queries 2b storage managers and asks about their load. (Actually, much less than 2b is needed, but the analysis is easier for 2b.) Then the system can choose the b storage managers with the lowest load. When using geographic load balancing, these are the storage managers that return to the client quickest. Similar to the balls in bins protocols of Feige, this will result in logarithmically approximate load balancing. Finally, for the class of dynamic load balancing algorithms, the system can use online algorithms similar to those used for migration of CPU tasks in distributed systems.

One aspect of a preferred embodiment of the system is load balancing via response sampling. When a machine (e.g., a storage manager) is needed, the system will not choose a single storage manager, but rather will query a set of storage managers. The system will then choose the "best" (such as, for example, the fastest, geographically best located, or least loaded) among the respondents and then utilize that machine There are several protocols used by preferred embodiments of the system. A file storage system can benefit greatly from global knowledge about the system. For example, load balancing can benefit from knowing the load on all nodes, partition detection can benefit from knowing the number of nodes in the system, and so on. In a distributed system, it may be difficult or impossible to obtain such knowledge accurately: each node has local state knowledge, but a node cannot know the precise state of other nodes. Fortunately, it is sufficient to know global values approximately.

One preferred embodiment uses a gossip protocol to approximate these values. It assumes that every node (file manager or storage manager) participating in the gossip protocol has a local clock. Denote by $t_i^0$ the internal clock time when node i joined the system. At time $t_i^0+j$ for all integer j, node i does as follows:
1. Merge all data received from all of its neighbors prior to the current time.
2. Discard all outdated data (when i has received more recent data from the relevant node).
3. Add its own data, along with its current time stamp, to the list.
4. Send all of the current data (i.e., there is no data which has a larger time stamp) to all of its neighbors.

Due to the logarithmic length of all-pairs shortest paths in the DHT, this protocol is guaranteed to be accurate up to a logarithmic time difference in the data conveyed. Assuming that the clock's accuracy is bounded, this gossip protocol gives an approximation for the accuracy of the required information.

Distributed file systems, or, more generally, file systems with the ability to recover corrupted or missing data, can recover or heal from failures. But as disk sizes increase, the time required to recover from failure increases linearly. In fact, conventional systems are likely to reach a point where data is corrupted faster than it can be recovered. Conventional hardware optimizations can be useful, but they are expensive, and historically they have not scaled as quickly as disk sizes. This gap between disk size increases and communication and bus speed increases implies that the problem of recovery in conventional systems is likely to get worse. The present invention can recover lost data very quickly. This is due to its use of DHTs to separate how a file is found from where it is stored. The system separates reconstruction of metadata, which can be performed quickly due to the small size of the metadata, from the recovery of the data itself, which can be performed in a distributed manner and hence quickly.

At a high level, the protocol for healing the system after failure is as follows:
1. Detect a failure.
2. Reconstruct the metadata. Fix the DHT and reallocate responsibility for the DHT. Distribute responsibility for data reconstruction.
3. Reconstruct data.
4. Rebalance the system (including small files).

It will be clear to one of skill in the art of the invention that there are many ways of implementing this protocol, in addition to the implementations described herein.

A simple way to detect node failures is through the built-in functionality of the DHT. One of the keys in DHT design is a low out-degree from any node. As mentioned above, the DHT generally maintains links between nodes as open connections. This means that the failure of a single node can be detected by its neighboring nodes in the graph-based DHT representation. If node i suspects a failure of one of its neighbors j, it consults with all of the other neighbors of j. They reach a Byzantine agreement as to the status of j. If they agree that j has indeed failed, than j is declared failed. If j eventually recovers, it will consult its neighbors as to its status.

A system according to the invention can recover from more than a single failure. In fact, the system can recover from K concurrent failures for any given K. If K is smaller than the outdegree of the DHT, then the system can simply treat each failure separately. More generally, if each failed node has a connected node that has not failed, the system can solve the problem. However, in general this is not the case. For the general case, the set of failures represents a subgraph of the graph representation of the DHT. As such, consider the connected component of failures. Since K<<N, the edges of the connected component have neighbor nodes which have not failed. Thus, the edge nodes of the connected component of failures will be detected and such failures will be broadcast. If there is a node which has not notified the network of failures and whose neighbors have failed, the node itself must have failed. Alternatively, a recursive procedure can be used to recursively find and correct failures. Once failure has been detected, the entire graph may be notified. This is done by the detecting node, utilizing the underlying gossip layer to notify the graph of failures. In addition, to circumvent possible disconnections in the graph, the detecting node will choose some random nodes (via the DHT) to also notify the graph. If multiple gossip protocols attempt to give out the same information, this will not result in any overhead.

The system keeps discovery metadata in a file replicated within the system. This means that it can recover the metadata by using the underlying failure recovery mechanism (that is, copying the data or reconstructing using an ECC). While the recovery process is relatively simple, this process is crucial, as the system must know what data to reconstruct before it can reconstruct it. Thus, metadata recovery allows the system to allocate responsibility for recovering the data. Once the metadata has been recovered, the system can use the underlying processes of the DHT to allocate responsibility for the missing part of the DHT. Such processes typically include load balancing of the key space. When the system finishes reconstructing the discovery metadata and does DHT load balancing, it is possible that the range of values maintained by the crashed file manager will be maintained by multiple new file managers (generally at most two, unless massive failure was involved). Any file manager that finds itself the maintainer of a new range of values as a result of a crash will query all storage managers involved in storing the data to check for integrity. This can (optionally) include checking the consistency of recently modified files, although this is not necessary, since the client is responsible for this and if the client crashes, the system does not need to provide any guarantees. During such queries, the system also reconstructs the utility metadata from the relevant storage managers. Alternatively, storage managers can take responsibility for the reconstruction.

A key reason why reconstruction in general is so time consuming is the communication bottleneck due to the attempt to move all of the corrupted/lost data in a machine to a replacement machine. While this is costly during the recovery process in classical architectures, it is worthwhile inasmuch as it results in faster lookup time when there is no failure. Since failures are assumed to be rare, this tradeoff between the cost of repairing failures and the cost of running without failures is a valid one. The system architecture of the present invention avoids this bottleneck by disassociating where a file is stored from how it is accessed. Data reconstruction, and subsequent reallocation of the DHT, results in a single file manager that is responsible for any given file.

An innovation for reconstruction of the lost data is that the bandwidth for any individual node is dwarfed by the total system bandwidth. This means that if the system can distribute the recovery across the system, it can achieve rapid recovery. There are many ways in which the system can use the separation between how and where data is stored. One particular example uses the background layer to notify about failure and allocate responsibility. In this example, assume that a given file manager is trying to recover a disk of size s. The system can then distribute the metadata. The file manager then chooses a random number $0<r<1$. For block i on the disk, assuming that the block is indeed used, the DHT node responsible for the value $(i/s+r) \bmod 1$ will endeavor to reconstruct the block i. This means that the load balancing of reconstruction is at worst a factor 2 from optimal. If a node is responsible for reconstructing the block I, it will poll the nodes containing the data needed to reconstruct the data assuming the underlying reconstruction mechanism. When it has completed reconstruction, it will notify the file manager responsible for that node. If it cannot reconstruct the data for any reason (such as, for example, lack of disk space), it will likewise notify the file manager. If the file manager does not receive such a notification for any given block, it will simply choose a new random number and attempt a new reconstruction for the missing blocks, unless there is a small number of such blocks, in such a case it will reconstruct them by itself. Any storage manager that wishes to reconstruct a given block can do so easily by requesting the data needed for doing so and utilizing the underlying protocol. When the data is finally reconstructed, every file manager needs to receive the address of the new data stored. If the data is invalid (due possibly to modifications), the file manager will discard the data at the earliest possible stage.

While this approach yields extremely fast reconstruction, it suffers from several drawbacks. The first is that reconstruction requires some free space on all storage managers. Such free space is reduced by reconstruction and this might result in lack of space. The second problem is that the reconstruction might result in a skewed load balance across the system. Finally, reconstruction might mean that small files are not located in the file manager, which might result in slower access times. All of these problems can gradually be reduced by moving files across the system. Since the system is at the required redundancy, these corrections can take a longer time frame than that required for healing without impairing system guarantees.

In conventional file systems, when a disk crashes it is necessary to replace the disk. This is because the ability to reconstruct the part of the data for which it is responsible. In most cases these two factors will run in parallel, but even this worse case analysis is much faster than conventional implementations.

Table 1 presents a summary of actions that may be taken.

TABLE 1

| Action | Initiated by | Involved | Responsibility | Comments |
|---|---|---|---|---|
| Create file | Clients | FM, SM | Client | FM can act as clients for system files |
| Read file | Client | FM, SM | Client | FM can act as clients for system files |
| Delete file | Client | FM, SM | Client | If client crash during action FM will complete |
| Modify file | Client or FM | FM and/or SM | Initiator | Can modify data and/or metadata |
| Detect failure | Adjacent FM | All Adjacent FM | Initiator | Can be done recursively |
| Recover FM | Upon failure detection | Backups of FM file | FM neighbors | Not distributed |
| Recover SM | Upon failure detection | Entire system | FM(s) | Is completely distributed |
| Gossip updates | Entire system | Entire system | Entire system | Not centralized |
| Locking | Client | FM or SM | Client or timeout | Different types of locks |
| Rebalancing FM | FM(s) | Adjacent FM on the [1, 0) ring | FM | Based on DHT protocols | find a file is linked to the location of the file. For example, in RAID systems there is a correlation between data stored on various disks and cylinders. In iBrix®, the file ID essentially includes an address of the disk on which the file is stored. Thus, recovery must reconstruct the failed disk. Obviously, this introduces a bottleneck in recovering from failure, since the communication time to the disk (as well as disk i/o) throttles the recovery time. Attempts to bypass this bottleneck generally rely on increasing disk and communication speed with specialized hardware and algorithms. By disassociating the responsibility for the file (and metadata) that lies with the file manager from the responsibility for the actual storage of the file, which remains with a large number of storage managers, the present invention removes this bottleneck.

The system of the invention reconstructs the failed disk in a completely distributed fashion across the entire distributed file system. If a disk is of size size with a throughput of throughput, typical file system recovery would require $$\frac{size}{throughput}$$

time. By distributing the system over N disks, the system requires $$\min\{\log N, \log size\} + \frac{2 * size}{N * throughput}$$

The factor 2 is assuming the hard case in which upload throughput detracts from download throughput. The first factor is the time required to distribute responsibility or for all responsible nodes to become aware of a failure, and the second time is the time required for a given node to One problem peculiar to distributed systems is the case of a partition in a network. While the system can deal with isolated failures, it also needs to deal with the case when, due to communication or other problems, the network itself is split into two. Partitions pose peculiar problems, due to both the magnitude of the errors as well as the temporary extent of them. A partition event refers to a total lack of communication. Slow communication can be dealt with much more effectively by utilizing load balancing protocols. There are three major issues having to do with partitions:

1. The detection of a partition event.
2. File access, modification, etc. while in a partitioned state.
3. Recovery from a partition event and a merging of the system.

In general, a partition into multiple parts can be thought of as an initial partition into two parts and then subdividing one or more of the parts into subsequently smaller parts. Each division can then be treated independently. For simplicity, the following discussion assumes that any partition event divides the system into two parts, but it will be clear to one of skill in the art of the invention that the general case can be solved recursively.

Detecting a partition. The system uses the gossip protocol in the background layer to estimate the number of nodes in the system at any given time. This estimate will differ among different nodes in the system. Any node that has a sharp (relative to normal usage) dropoff in system size will detect a partition event. The end of a partition event is detected similarly.

Operation during partition. There are several possibilities for operation during a partition event. In increasing complexity of recovery, these are:

1. Only allow changing of files for which the relevant file manager and block managers can be accessed. This allows unrestricted creation of files.
2. Allow changing of files for which the file manager is accessible, but at a reduced resiliency. A sub-possibility is to reconstruct only files that are modified on the partition with the relevant file system.
3. Recover and redistribute file managers when possible and allow file changes as above.

Since different nodes might have different views of the existence of a partition event, this will be determined by the view of the relevant file manager or, in the third case, by the neighbors who decide to recover the file manager.

Operation after partition. At the termination of a file manager, the system must merge possibly divergent data. For the partition events above above, a preferred embodiment does as follows:
1. In this case, connecting the partitions is simple, due to the uniqueness of the file manager.
2. In this case, the system must merely repair the system to its required resiliency at the end of the partition event. If resiliency was increased during partition, redundant blocks are erased and the load balancing algorithms are invoked.
3. In this case, the system may result to some journaling or file specific algorithms, since the appropriate manner of dealing with multiple files with different changes is data-dependant.

Figure 4:
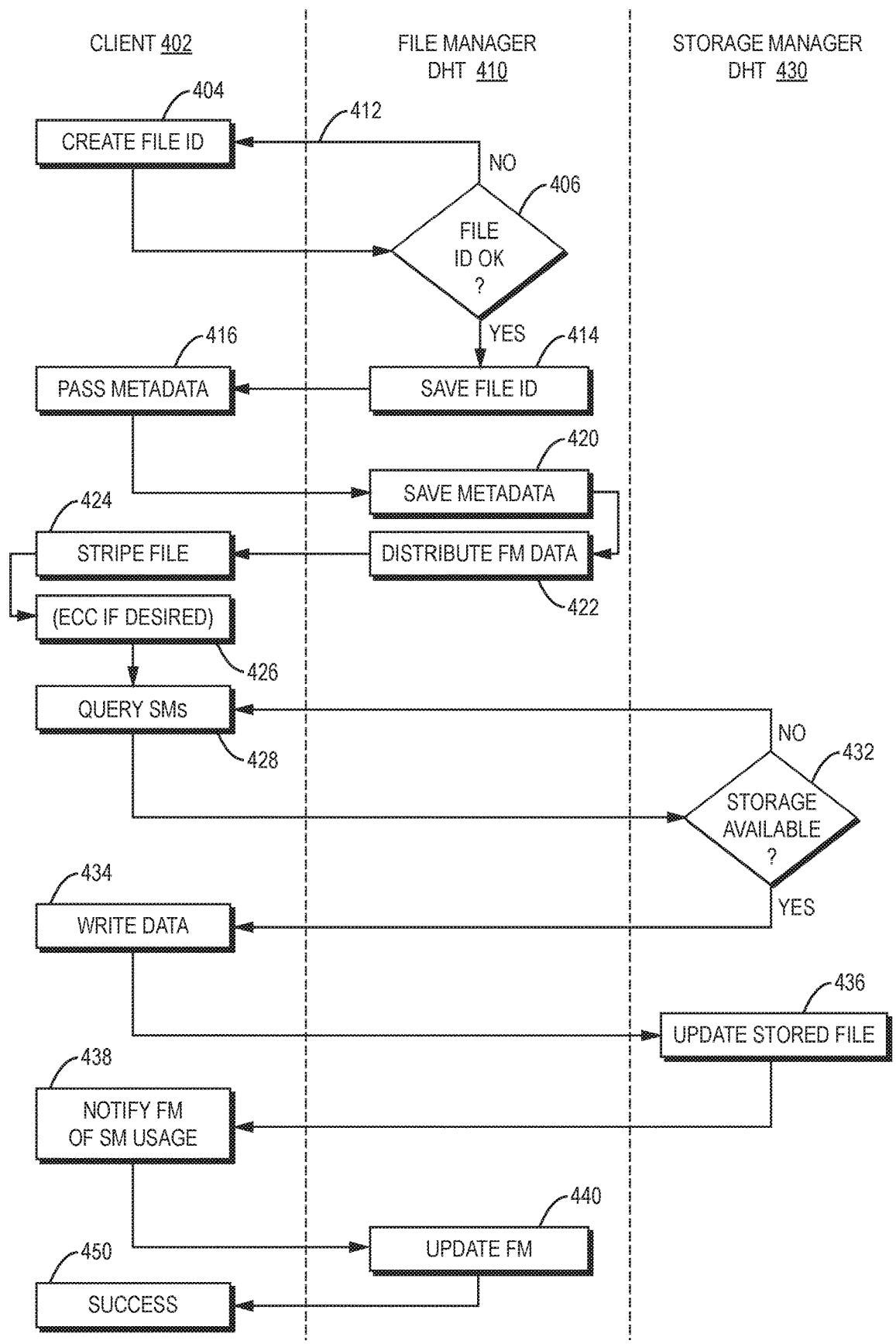
FIG. 4 is a high-level flow chart that depicts the steps involved in creation of a file, according to an exemplary embodiment of one aspect of the present invention.

File creation is normally initiated by a client, but may also be initiated by the system when adding a new node. FIG. 4 is a simplified high-level flow chart that illustrates the main steps in the process of creating a file in an illustrative implementation of this invention. For the exemplary embodiment of FIG. 4, the steps and actors are:
1. Client 402: Choose 404 random file ID for File manager DHT key. In some applications the ID can be deterministically decided.
2. Client 402: Query 406 File manager DHT, accessed via a previously used DHT node, preferably one that client 402 thinks has responsibility for the file ID, to find File manager 410 responsible for file ID.
3. File manager 410, Client 402: If number is not unique 412 (e.g., file ID already exists), return to step (1).
4. File manager 410: Save 414 file ID and reserve it. If consistency is desired, then apply locks.
5. If maintaining a CAN (content addressable network), then return to step (1) with the content hash, except that step (3) is replaced by simply maintaining a new pointer and finishing.
6. Client 402: Give 416 File manager 410 metadata about the file. This can include, but is not limited to, size, dates, permissions, number of n and k, and usage patterns (if known).
7. File manager 410: If permissions exist, then provide Client 402 with a number of potential storage managers to store file, such that the number of potential storage managers is larger than what is actually needed.
8. File manager 410: Save 420 metadata in File manager record (no need to backup at this stage).
9. File manager 410: Distribute 422 file comprising File manager data as a client.
10. Client 402: Stripe 424 file.
11. Client 402: Error encode 426 stripes.
12. Client 402: Contact 426 Storage manager 430 with query 432 on potential space.
13. Client 402: Write 434 data on storage managers that fit load balancing criteria (for example, but not limited to, first to answer).
14. Storage manager 430: Update 436 file with information stored on current disk. Update is done via process for modifying files (see below). Notify Client 402 when finished.
15. Client 402: Notify 438 File manager 410 of which storage manager used. File manager 410 does not need to know where Storage manager 430 saved the data. If File manager 410 crashes and this data is missing, then the system will revert.
16. Client 402: When complete, notify 440 file managers and File manager 410.
17. Storage manager 430: If timeout occurs and notification of completion has not been received, then contact File manager 410 to receive status. Revert based on consensus of Storage manager 430. Always revert if File manager 410 did not receive the list of storage managers. Wait for ack from File manager 410 that all storage managers are updated.
18. Storage manager 430: Use background channel to notify file manager servers of new space available.
19. File manager 410: Act as client and distribute the file modified in the previous step.
20. Client 402: Receive ack from File manager 410 before exiting 450. If problems, return to step (1). File manager 410 receives acks from the storage managers (although these acks can be done via the client) before acking to Client 402.

Figure 5:
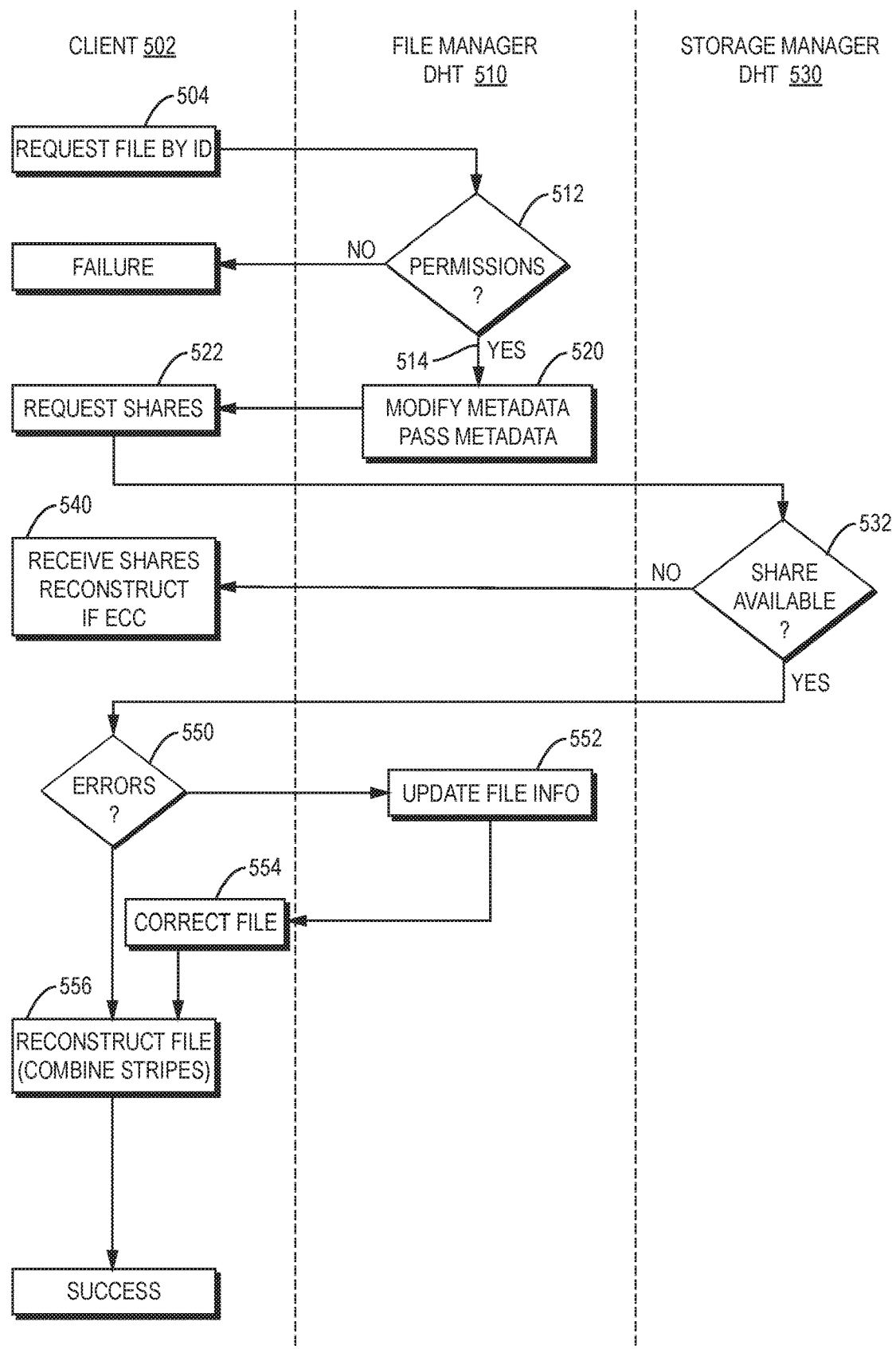
FIG. 5 is a high-level flow chart that depicts the steps involved in reading a file, according to an exemplary embodiment of one aspect of the invention.

Reading a file can be initiated by multiple actors in the system. FIG. 5 is a simplified high-level flow chart that illustrates the main steps in the process of reading a file, in an illustrative implementation of this invention. In the example shown in FIG. 5, the file read is initiated by Client 502. For the exemplary embodiment of FIG. 5, the steps and actors are:
1. Client 502: Access File manager DHT via previously used node and ask 504 for file based on ID (this can be either a random number-created or a content-based number).
2. File manager 510: If permissions 512 exist 514, then notify Client 502 of which storage managers have the file, as well as which shred each file manager has. Give client metadata such as n, k.
3. File manager 510: Modify 520 and backup metadata (such as, but not limited to, time last accessed).
5. Client 502: Contact 522 storage managers that hold file, such as Storage Manager 530, to see if shares are available 532.
6. Client 502: If there is a conflict between File manager 510 and the storage managers about the existence of a file, notify both and they will read (and correct) the backup copies of their files.
7. Client 502: Receive 540 shares and (possibly) reconstruct the stripes.
8. Client 502: (optional) Use redundant share to test file integrity.
9. Client 502: If the file has errors 550, notify File manager 510. Else skip to final step.
10. File manager 510: Change file information 552 and tell Client 502 to collect, correct, and restore file.
11. Client 502: Correct file 554 via error correction (perhaps on a server). Update File manager 510.
12. File manager 510: (optional—since this will be done periodically) If timeout occurs, then correct file.
13. Client 502: Combine stripes to reconstruct file 556.

Figure 6:
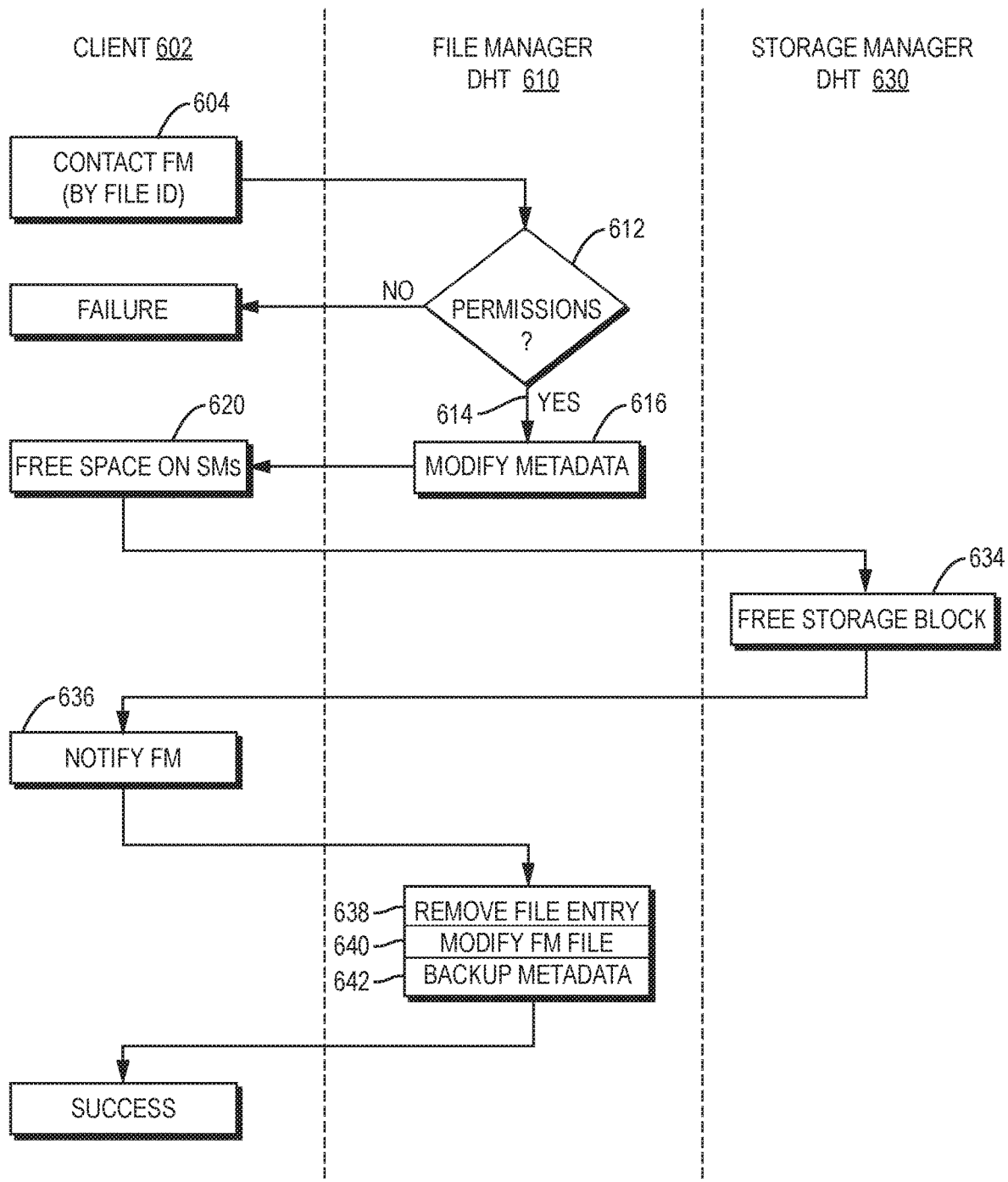
FIG. 6 is a high-level flow chart that depicts the steps involved in deleting a file, according to an exemplary embodiment of one aspect of the invention.

File deletion is generally used only by clients. FIG. 6 is a simplified high-level flow chart that illustrates the main steps in the process of deleting a file, in an illustrative implementation of this invention. For the exemplary embodiment of FIG. 6, the steps and actors are:
1. Client 602: Contact 604 File manager DHT and ask for information.

2. File manager 610: If permissions 612 exist 614, then give information. If there is consistency, then lock the file. If consistency and already granted permission, then wait till permission ends.
3. File manager 610: Modify 616 metadata.
4. Client 602: Contact 620 storage managers, including Storage manager 630, which free 634 space.
5. Client 602: Contact File manager 610 and notify 636 that space freed.
6. File manager 610: If completion and no open entries using file, then erase file.
7. File manager 610: Remove 638 file entry and modify 640 the File manager 610 file for the node. Backup 642 metadata. ack to Client 602.
8. Storage manager 630: If timeout occurs, notify File manager 610 of timeout and wait for ack from File manager 610.
10. File manager 610: If timeout occurs, then notify storage managers that space freed. When ack received from all storage managers, then ack to the notifier (if one exists). Storage managers of servers on which shares were removed use background channel to notify all file manager servers of new space available.
11. Client 602: Receive ack from File manager 610 and file managers before exiting. If no ack is received and timeout occurs, then return to step (1). The final ack is from File manager 610 that has received acks from all storage managers.

Steps for changing metadata:
1. Client: Contact the File manager and notify it of change in metadata.
2. File manager: If permissions, then change metadata.
3. File manager: Update File manager file via regular backup process.
4. Client: Receive ack from File manager and Storage manager before exiting. If no ack is received and timeout occurs, then return to step (1).

In some types of files, there will be large modifications. When doing such modifications, the system does not have to reuse the same storage manager. Since the main cost is the communications, the system can simply use a new storage manager for the data. This is useful if the old storage manager has become overused or is temporarily unavailable, and it is especially useful if a storage manager has failed. The race condition between reconstruction of the old (un-modified) data and the new data can be settled with every interaction with the file manager (which does not change), so that if old data is later reconstructed it will be discarded, at the latest, at the final update of the file manager as to where reconstructed data is located.

Figure 7:
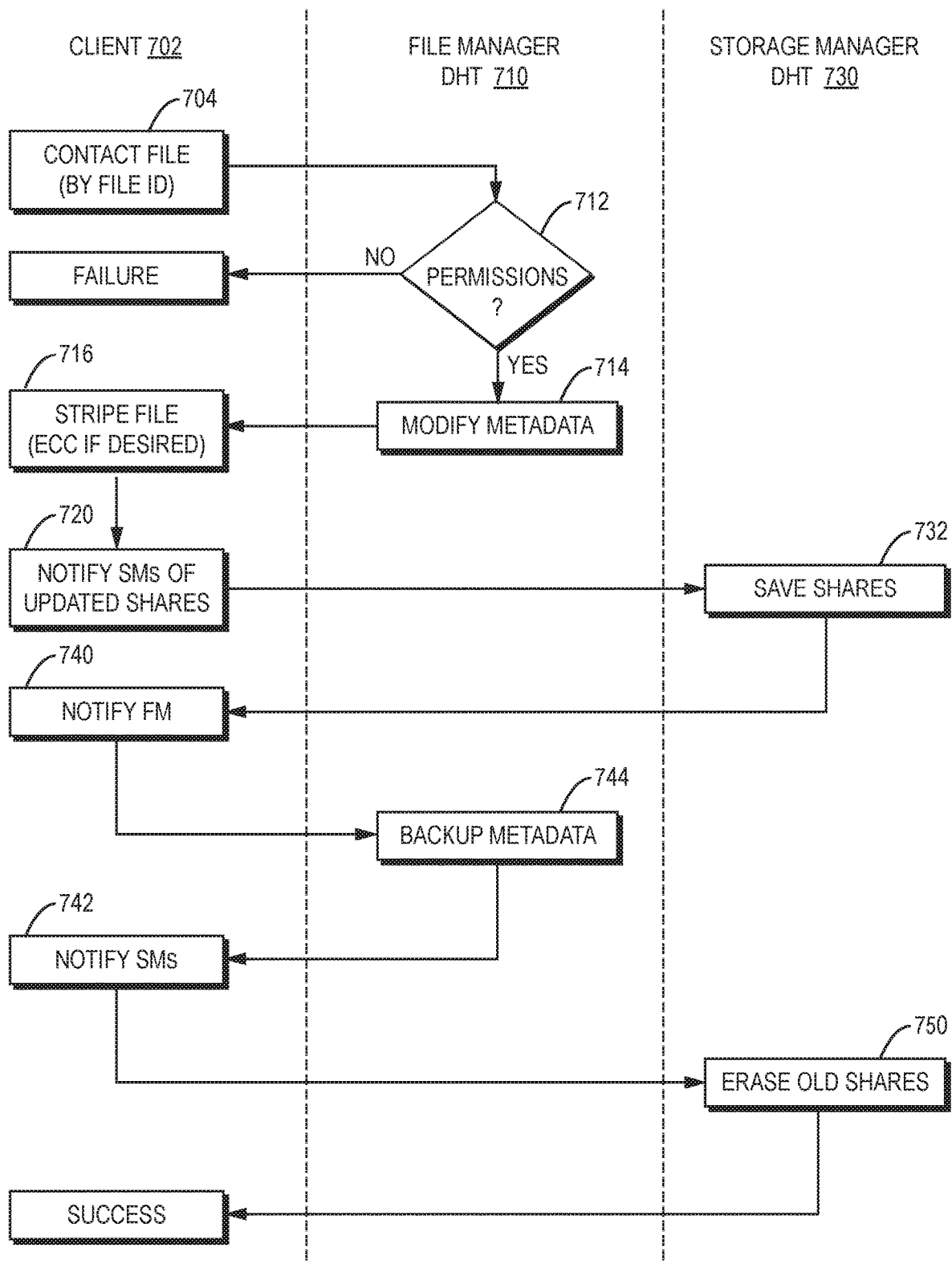
FIG. 7 is a high-level flow chart that depicts the steps involved in modifying a file, according to an exemplary embodiment of one aspect of the invention.

File modification can be initiated by any actor in the system. The differences in implementation is solely in how things are cached. FIG. 7 is a simplified high-level flow chart that illustrates the main steps in the process of modifying a file, in an illustrative implementation of this invention. In the example shown in FIG. 7, file modification is initiated by Client 702. For the exemplary embodiment of FIG. 7, the steps and actors are:
1. Client 702: Contact 704 File Manager DHT and get file information.
2. File Manager 710: If permissions 712, give information.
3. File Manager 710: If consistency, then apply locks/notification mechanism.
4. File Manager 710: Modify 714 metadata.
5. Client 702: Stripe 716 file and encode it. This should be done first when possible.
6. Client 702: Contact 720 Storage manager 730 with replaced shares. If Storage manager 730 crashes, allocate a new storage manager. This is done upon any contact with File Manager 710, but most certainly at the final stage of reconstructing the old storage manager, which updates File Manager 710. If the reconstructed data is invalid, File Manager 710 will discard it.
7. Storage manager 730: Save 732 new shares (but maintain old ones also). A preferred embodiment of the system maintains two sets of shares in case the client crashes during the operation, so that the system can revert to a consistent state. (This case is not strictly within the system guarantees, since it is a client fault).
8. Client 702: Finish updating shares and notify 740 File Manager 710, and then notify 742 storage managers of completion when ack is received from File Manager 710.
9. File Manager 710: Backup 744 metadata and send ack to client.
10. Storage manager 730: If notified of completion, then erase 750 old share.
11. Storage manager 730: If timeout occurs and no notification has been received, then query File Manager 710. Revert based on the latest version for which the system has enough shares. Query until ack received from File Manager 710 on correct reversion. The system will have enough shares to reconstruct at least one version, since if a storage manager deletes an old share, it must follow that all of the storage managers have new shares.
12. Client 702: Receive ack from File Manager 710 and the other file managers before exiting. If no ack received and timeout occurs, then return to step (1). Last ack is from File Manager 710 (which received the final ack from all storage managers).

In some cases it makes sense to get a lock for a file, read the file and then modify it. This can be done by a simple concatenation of existing operations. The system allows a modify command to change existing blocks/files. However, it is not required to modify the entire block, just the relevant parts that have changed. For replications, this is quite easy, whereas for an ECC (e.g. Reed Solomon), the bits that have changed in the code are fixed. The number of bits is generally bounded by the amount of change.

In the preferred embodiment, the system performs all file access through the responsible file manager, which maintains a list of authorized users. If desired, a client can also encrypt file data on the client side, so that the data actually stored by the system is meaningless without decryption. The system grants file operation permissions on a time lease basis with the possibility for renewal. This enables migration, and also has advantages from a security perspective.

The preferred embodiment uses the current time for timeouts and for leases. It is not possible to achieve a shared network clock in a distributed system. For timeouts, every component can simply use its own clock. For leases, the system has the receiver (generally, but not limited to, a storage manager) terminate a lease earlier than the grantor (generally, but not limited to, a file manager). The early termination is a measure of network speed (e.g., twice the average roundtrip delay).

Network failures and soft thresholds. In some applications, the system may experience intermittent node failures (such as due to transient network failures, for example). This can cause recurring reconstructions, possibly at considerable cost. Some embodiments of the system can deal with this by using soft reconstruction thresholds. For example, if a client requires 8 copies of a given file, the system can keep 10 copies instead, and perform reconstruction only when the number of available copies falls below 8.

In general cases of redundancy, the required threshold is fixed and each file has a desired level of redundancy which it aspires to and which the system maintains. However, there are cases, such as intermittent networking errors, when this is undesirable. In this case, two levels of redundancy are retained—a maximum and a minimum level. The system only repairs itself when reaching (or passing) the minimum level. However, when the system decides to create redundancy, it will do so to the maximum level, which the system will then maintain. Obviously, repeating this under random partitions will yield a system that is robust to random partitions. In fact, there is no hard limit on the level of redundancy and the desired level or redundancy can vary among files. One advantage of differing levels of redundancy on a per file basis is that it enables higher levels of redundancy for files that are under demand. This can then be used for load balancing purposes, such that files which are more frequently requested will have higher level of redundancy. In addition, geographical demands can be taken into account, such that, in a geographically spread out system, the redundancy will be in the local area of demand.

In some embodiments, the system can support advanced file system properties. Several extensions to the basic architecture of the present invention may be advantageous, including virtualization, lean (thin) provisioning (charging only for actual storage use), journaling (adding file version numbers), security (adding secure system access by controlling the file manager and storage manager security levels) and deduplication (eliminating the storage of duplicate blocks or files). The system can also work with any type of erasure coding (ECC) for the blocks. For virtualization, the distributed nature of the system allows a process running on one machine to be moved easily to a different machine. For a file manager, the only overhead is some possible modification at very low cost. The system design is also suitable for lean provisioning, since it does not allocate space that is not used. The system can collect usage data and control total usage via its gossip protocols. The system may additionally act as a journaling system—since a single file manager is responsible for maintaining any given file, the responsible file manager can maintain a journaling system, possibly saved on different storage managers than the current version of the file. This journaling system can maintain either the entire file or file differences (deltas).

In many storage applications, it is valuable to identify and eliminate multiple files with the same data ("deduplication", in order to eliminate duplicate copies of file data). This is especially difficult in a distributed system, where there is no centralized ability to compare files, as files are not stored on the same computer. The simplest form of deduplication identifies identical files. The system may identify identical files by using a hash of the file data as the file identifier. This requires a file to move to a different file manager whenever it is modified, but changing the file manager is simple and incurs very little overhead. This is due to the separation of the file manager and storage manager levels.

A file storage system can achieve greater storage efficiency if it recognizes files that are similar but not quite identical, for example by storing a master file plus a list of differences for each similar file. The method described above works well for identical files, but it poses problems when files are merely similar. The system, in some embodiments, can use signatures to detect similar files. A file signature is a set of values from random (but fixed) locations in the file. If the FFT from two files has a high value, then the files are similar, and the location of the file difference can be detected by binary search. The system can use a fingerprint hash to maximize the probability that two similar files will map to the same file manager. This can be further augmented by using the gossip protocol or other methods to transfer signatures, or hashes of signatures, between file managers.

The system supports several methods of data encryption. The most straightforward method is for the client to encrypt/decrypt all data before providing it to the system. This has great security advantages, as it removes all possible chance of data being compromised. However, deduplication does become impossible with this method, since the user chooses the encryption key and duplicate files encrypt to nonduplicate files. Another encryption method uses secure connections (e.g., SSL) between the client and the file manager or storage manager. Then the file manager can choose the encryption keys used by the file manager/storage manager. It will be clear to one of the skill in the art that many of the other possible encryption schemes in the literature are suitable for use with the present invention. A particular design decision for any particular implementation is whether the system uses independent encryption for each share or uses a homomorphic scheme. For files stored using an ECC, the system can choose encryption keys to guarantee that no share is in plaintext.

The expanding importance of cloud computing and the rapidly growing storage requirements of even small to medium sized enterprises creates an increasing demand for robust large-scale expandable storage. The present invention may be used to advantage to satisfy this need. Currently, systems that include a failed machine will discard all data on that machine. The present invention allows a failed machine that has been rebooted/repaired to be utilized, with all data.

The present invention relates to error correction codes and, in particular, to erasure codes for data storage and other computing-related applications.

Error correcting techniques have been used for many years to add reliability to information processing and communications systems. While many such applications are hardware-based, software-based forward error correction techniques have recently been used to add reliability to packet-based communications protocols. In general, forward error correction techniques prevent losses by transmitting or storing some amount of redundant information that permits reconstruction of missing data. These techniques are generally based on the use of error detection and correction codes.

Error correcting and similar codes can be divided into a number of classes. In general, error correcting codes are data representations that allow for error detection and error correction if the error is of a specific kind. The types of errors range from simple checksums and error detecting codes to more complicated codes, of which erasure codes, such as Reed-Solomon codes, are an example. Erasure codes, as the term is used herein, transform source data of k blocks into data with n blocks (n being more than k), such that the original data can be reconstructed using any k-element subset of the n blocks. In particular, erasure codes may be used in forward error correction to allow reconstruction of data that has been lost when the exact position of the missing data is known. They may also be used to help resolve latency issues if multiple computers hold different parts of the encoded data.

There are number of examples of such codes. Members of one class, called Tornado codes, were developed by Luby and others [e.g. Luby et al., "Practical Loss-Resilient Codes"; Luby et. al., "Efficient Erasure Correcting Codes", IEEE Transactions on Information Theory 47:2, (2001) 569-584] and have encoding and decoding times that scale linearly with the size of the message. Tornado codes are probabilistic, in that they will fix errors with a given probability, but there is always the small but real likelihood of failure.

Work has also been performed by Luby and others on erasure codes that are deterministic [Blomer et. al., "An XOR-Based Erasure Resilient Coding Scheme", Technical Report of the ICSI TR-95-048 (1995); Luby et. al., "Efficient Erasure Correcting Codes", IEEE Transactions on Information Theory 47:2, (2001) 569-584; Rizzo, Luigi, "Effective Erasure Codes for Reliable Computer Communication Protocols", ACM Computer Communication Review, Vol. 27, No. 2, April 1997, pp. 24-36], such as Cauchy-based and Vandermonde-based Reed-Solomon codes. However, Luby states that these codes are much slower to decode than Tornado codes [Luby, Michael, "Benchmark comparisons of erasure codes", University of Berkeley, web publication], with the encoding and decoding times of Reed-Solomon codes scaling quadratically or worse with the size of the message and software-based implementations of Tornado codes consequently being about 100 times faster on small length messages and 10,000 times faster on larger lengths. Although the data Luby produces is accurate, he assumes that he is working with systems with high number of errors.

There has long been a tension between what has historically been called timesharing and dedicated computing. Over the years the pendulum has swung between these two poles. At first, computers were single entities unconnected to other computers. These machines originally ran programs sequentially, but later timesharing was invented, which time sliced the computer among many programs and users so that one computer could be used simultaneously by many users. Before the advent of the microprocessor, timesharing systems such as Unix were on the upswing, since it was very efficient to share large computer resources. With the advent of inexpensive microprocessor-based machines, the pendulum swung back to each user having his or her own machine, although the machine was then time-sliced among many programs.

The mantra today is "cloud computing", where a large group of machines is either networked together over a WAN or LAN, or both sit in a cloud and users use the web and their computer and web browser as a terminal in order to obtain computing services. This 'cloud' of computers is similar to the mainframe used for timesharing, and benefits from the advantages of the timesharing model. In addition, many companies are providing programs such as spreadsheets, word processors, graphics programs, and other services over the web, where the computational resource is in a 'cloud' or large server farm. One of the recurrent problems with these designs, however, is that adding capacity is difficult and complicated and a number of kludges have to be used to scale such systems.

One of the major challenges that has faced users of computers is how to parallelize computation. This has been a problem for decades, and it has become even more acute with the advent of multicore processors and server farms. It is viewed as a critical challenge by many microprocessor manufacturers. The other half of this problem is the distribution of computation. Languages such as Erlang allow for the distribution of computation in a fault tolerant way. An example of distributed computation without using the advantages of erasure code methods is Scalaris [Schutt, Thorsten, et al., "Scalaris: Distributed Transactional Key-Value Store", Zuse Institute Berlin CSR; OnScale Solutions, Berlin, Germany]. Distribution of computing allows for faster computation, although the optimal distribution is in general NP-complete (Nondeterministic Polynomial time complete).

The distribution of data may be speeded up by having multiple producers of that data. This is true even when the producers hold different parts of the data due to different I/O speeds as well as the inherent asymmetry between a fast download speed and a slow upload speed on many internet connections. Two examples of this are BitTorrent and the Zebra file system [Hartman, John H. et al., "The Zebra Striped Network File System", ACM Transactions on Computer Systems, Vol. 13, Issue 3, August 1995, pp. 274-310]. In the case of the Zebra file system, data is sliced up (i.e. simply divided) onto multiple disk drives and when it is desired to retrieve it, it is reassembled from multiple sources. Retrieval is speeded up by this method, since the use of multiple producers provides better use of both channel and network bandwidth, as well as better utilization of disks and their controllers. However, this system is not fault tolerant and it is not easy to add resources to it. BitTorrent has many of the advantages of the Zebra file system, in that has many producers of data and is also fault tolerant, but its fault tolerance is obtained at the cost of immense redundancy since the data must be replicated many times. This means that the system must store complete copies of every piece of data that it wishes to store.

Data integrity is typically ensured by means of a backup method in which the data is reproduced and kept in another location. There are at least two copies of the data, and if one copy is destroyed then hopefully the other is still intact. From a practical point of view, this process has problems, since anyone who does regular backups knows that when it is necessary to retrieve the data from the backup, it is not infrequent that something has gone wrong and the backup is no good. Even if the backup is good, if all backups are destroyed then the data is still lost. Typically, a third (or more) backups are therefore made to defend against this possibility. Of course, it could happen that all three or more backups could be destroyed. The fact is that no backup scheme can guarantee that data will not be lost. Further, this method is also very inefficient, since it requires a doubling or tripling of the amount of storage needed. Typical commercial installations, such as RAID (Redundant Array of Inexpensive Disks) and the Google file system, utilize this method.

A method and apparatus for distributing data among multiple networks, machines, drives, disk sectors, files, message packets, and/or other data constructs employs matrix-based error correcting codes to reassemble and/or restore the original data after distribution and retrieval. In one aspect, the invention provides a fault-tolerant distributed data storage and retrieval system that delivers data at high speed and low cost. In another aspect, the invention is a method and apparatus for error correction in data storage and other computer-related applications. The method of error correction of the present invention is deterministic. In yet another aspect, the invention is, and employs, a new class of erasure codes that have a number of advantages over previous methods and a large number of applications. The erasure codes may be used in any application where older and/or less efficient erasure codes are presently used. In a further aspect, the present invention is a method and system for efficient distributed computing.

In one aspect of the invention, a distributed data storage system breaks data into n slices and k checksums using at least one matrix-based erasure code based on a type of matrix selected from the class of matrices whose submatrices are invertible, stores the slices and checksums on a plurality of storage elements, retrieves the n slices from the storage elements, and, when slices have been lost or corrupted, retrieves the checksums from the storage elements and restores the data using the at least one matrix-based erasure code and the checksums. In a preferred embodiment, some of the storage elements are disk drives or flash memories. The storage elements may comprise a distributed hash table. In preferred embodiments, the matrix-based code uses Cauchy or Vandermonde matrices. The system may be geographically distributed.

In another aspect of the invention, a distributed file system comprises a file system processor adapted for breaking a file into n file pieces and calculating k checksums using at least one matrix-based erasure code based on a type of matrix with an invertible submatrix, for storing or transmitting the slices and checksums across a plurality of network devices, for retrieving the n file pieces from the network devices and, when file pieces have been lost or corrupted, for retrieving the checksums from the network devices and restoring the file using the at least one matrix-based erasure code and the checksums.

In yet another aspect of the invention, a method for ensuring restoration and integrity of data in computer-related applications, comprises the steps of breaking the data into n pieces; calculating k checksums related to the n pieces using at least one matrix-based erasure code, wherein the matrix-based erasure code is based on a type of matrix selected from the class of matrices whose submatrices are invertible; storing the n pieces and k checksums on n+k storage elements or transmitting the n pieces and k checksums over a network; retrieving the n pieces from the storage elements or network; and if pieces have been lost or corrupted, retrieving the checksums from the storage elements or network and restoring the data using the matrix-based erasure code and the checksums.

In the present invention, a method and apparatus for distributing data among multiple networks, machines, drives, disk sectors, files, message packets, and/or other data constructs employs matrix-based error correcting codes to reassemble and/or restore the original data after distribution and retrieval. A fault-tolerant distributed data storage and retrieval system according to the invention delivers data at high speed and low cost. In another aspect, the invention is a method and apparatus for error correction in data storage and other computer-related applications. The method of error correction of the present invention is deterministic. In yet another aspect, the present invention is, and employs, a new class of erasure codes that have a number of advantages over previous methods and a large number of applications. The erasure codes of the present invention may be used in any application where older and/or less efficient erasure codes are presently used. In a further aspect, the present invention is a method and system for efficient distributed computing.

In one embodiment, data is distributed among multiple machines in a more efficient way by employing matrix-based codes. The class of suitable matrices includes all those whose square submatrices are invertible, such as, but not limited to, Cauchy matrices and Vandermonde matrices. This distribution of data radically reduces the amount of redundancy necessary to make sure no data is lost, as well as permitting more efficient processing in a multiprocessor system. From a storage point of view, a disk drive connected to each processor is then no longer necessary. Even if a disk drive is desired, the size can be smaller. In another embodiment, data is distributed within a disk drive using matrix-based codes in order to make the data fault tolerant. In yet another embodiment, matrix-based codes are employed to achieve fault-tolerant communications. In a further embodiment, matrix-based codes are employed to implement flash memories.

In a preferred application, the present invention is a method and apparatus for ensuring restoration or receipt of data under possible failure, when it is known which transmissions or storage facilities have failed. In an embodiment of this preferred application of the present invention, suppose it is known that, of n+k disks, only k will fail in a unit of time. The application is then implemented by the following basic steps: (1) Break each file to be stored into n pieces; (2) Calculate k checksums; (3) Store these n+k pieces and checksums on the n+k disks (or other elements of storage whose failure is as likely to be independent as possible); and (4) If it is known which disks are functional, Cauchy-based Reed-Solomon codes [Blomer et. al., "An XOR-Based Erasure Resilient Coding Scheme", Technical Report of the ICSI TR-95-048 (1995), improving on Rabin, "Efficient Dispersal of Information for Security, Load Balancing, and Fault Tolerance", JACM 36:2, (1989) 335-348] or other suitable matrix-based codes are used to ensure that the file can be safely restored. If it is not known which storage elements are functional, this can be discovered by the decoding mechanism and then step (4) can be used. Similarly, this basic methodology applies and works equally well with a message, by the steps of: (1) Break the message into n pieces; (2) Calculate k checksums; (3) Transmit all n+k pieces and checksums; and (4) If it is known which n transmissions have been received, restore the original message using Cauchy-based Reed-Solomon codes or other suitable matrix-based codes. If it is not known which transmissions have been received, this can be discovered by the decoding mechanism and then step (4) can be used. It will be clear that, if there are no errors, then there is no additional overhead associated with decoding because no decoding is required since all the data is not encoded.

Figure 8:
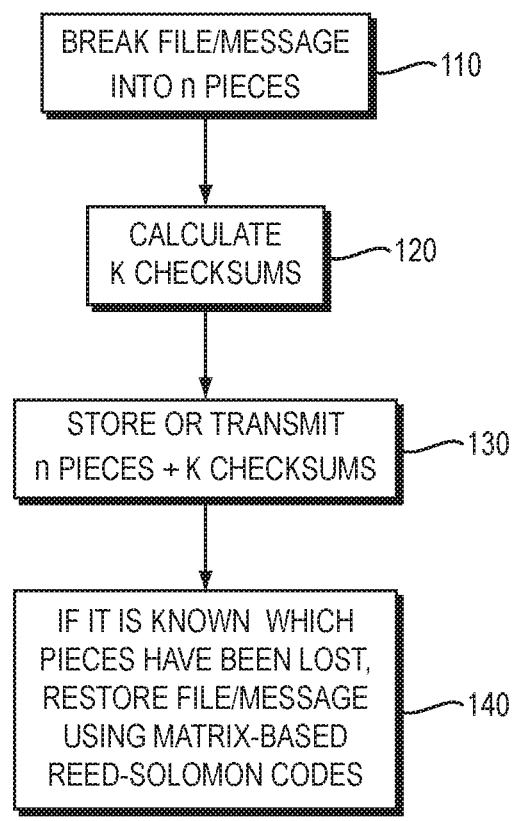
FIG. 8 is a flow diagram of an implementation of a preferred embodiment of a method for ensuring restoration or receipt of data, according to one aspect of the present invention.

The operation of this embodiment is illustrated by the block diagram shown in FIG. 8. In FIG. 8, the file or message is broken into n pieces 110, and k checksums are calculated 120. All n pieces and k checksums are then transmitted 130. Assuming it is known, or it can be determined, which n transmissions have been received, the original message is restored 140 using the matrix-based codes of the present invention.

In particular, this application represents and provides a major improvement in the process of backing up files in a network. Rather than duplicating the entirety of the file system, the files need only be split among all of the stable disk drives in the network. A specially designed system is needed to retrieve the files as the user needs them, but rather than needing to duplicate all files, only $$\frac{n+k}{n}$$

of the space the tiles occupy will be needed.

In some implementations, the slices may be subdivided into shreds. The length of the shred can be varied to optimize performance in different networks. For example, a long shred may be appropriate for a low-error channel (e.g., a LAN) and a shorter shred for a high-error channel. The system of the present invention provides the advantages of striping, blocking, and erasure coding in a single package. Striping distributes parts of data over independent communication channels so that the parts can be written and retrieved in parallel. Both the slicing and the shredding contribute to striping in the system. Blocking data breaks data into independent pieces that need not be dealt with as a unit or in a particular order. The shredding is the blocking operation. Erasure coding adds redundancy so that data may be reconstructed from imperfect storage nodes.

In the present invention, there is flexibility in the way that the slices may be retrieved to reconstruct data. For example, all the slices, data or checksums may be requested at once, and then the data can be reconstructed as soon as the necessary replies arrive. Alternatively, only the data slices can be initially requested, waiting to see if they are all available. Checksums are then requested only if data slices are missing. If all the data slices are retrieved initially, then they can simply be reassembled without the need to decode any checksums, thereby eliminating the computational overhead of decoding. In addition, an ordering of the nodes that respond with the lowest latency can be maintained, and slices requested from most responsive nodes first. A maximum number of outstanding slice requests permitted for a particular data item may also be specified, in order to ration use of network resources.

In the method of the present invention, each piece of data can be represented as a real number, as an element in a finite field, or as a vector over a finite field. In the preferred embodiment, finite fields are used since this obviates problems of roundoff error; however, it will be clear to one of skill in the art that the invention extends without change to real numbers or to any other representation of data on a computer.

One model of errors is that there is probability 1-p that any datum is transmitted correctly and probability p that it is known to be in error, independent of any other error. In real cases there are likely to be dependencies among the data (for example, a power failure may cause all of the disks in a building to fail). Real networks will have to distribute data and checksums diffusely to avoid these problems.

In describing a preferred embodiment of the present invention, Cauchy-based Reed-Solomon codes are described first, and then they are applied to the problem of network backup. A key feature of a Cauchy matrix is that each of its square sub-matrices is nonsingular (i.e., has a non-zero determinant) and thus is invertible. While Cauchy-based Reed-Solomon codes are employed in this description, it will be clear to one of skill in the art that many other suitable matrix-based codes exist, within the context of a general class of matrices all of whose square submatrices are invertible. For example, the system may be implemented with Vandermonde-Reed-Solomon codes or any other code that transforms source data of n blocks into data with r blocks (r being greater than n), such that the original data can be recovered from a subset of the r blocks. Further, the matrix-based codes of the present invention may be used in conjunction with one or more other error correction codes or erasure codes. For example, matrix-based codes according to the invention may act as an inner layer of code, and one or more error correction codes may act as an outer layer of code.

The algorithm is fast when the probability of transmission error is small, and it is easy to implement. In particular, with n data points (disks) and a probability p that a given piece of data will be transmitted in error, the algorithm is $O(n^2 p)$ If the data are represented as a vector of length m, so that there are mn pieces of data, then the algorithm's speed is linear in m, that is, $O(mn^2 p)$.

Mathematical definitions. Let n and k represent positive integers. Let $x=(x_1, \ldots, x_n) \in F_q^n$ represent the original set of data. A checksum scheme is a function $G: F_q^n \to F_q^{n \pm k}$ with two special properties enabling recovery of the original data from any n points of G(x).

Symmetry: For j>0, let $\Sigma_j$ denote the set of permutations of j things. If y=G(x), it is required that, whenever $\sigma \in \Sigma_n$ there exists a $\tau \in \Sigma_{n+k}$ such that $\tau(y)=G(\sigma(x))$ and, whenever $\tau \in \Sigma_{n+k}$ there exists a $\sigma \in \Sigma_n$ such that $\tau(y)=G(\sigma(x))$. That is, the code should not depend on the order of the n points.

Completeness: Let $\pi_n: F_q^{n+k} \to F_q^n$ be the projection map such that:

$$\pi_n(y_1, \ldots, y_{n+k})=(y_1, \ldots, y_n)$$

It is required that, for any $\tau \in \Sigma_{n+k}$, the map $\pi_n \circ \tau \circ G$ be invertible. That is, it is desirable to be able to recover the original n data points from any n of the n+k data points they are mapped into.

Matrix notation is required. Let $I_n=\{1, \ldots, n\}$, the set containing the first n integers. If $A=\{\alpha_{i,j}: i,j \in I_n\}$ is a square matrix, and $\emptyset \subset J_1 \subset I_n$ and $\emptyset \subset J_2 \subset I_n$ $A_{J_1}$ is written for the square matrix $A_{J_1}=\{\alpha_{i,j}: i,j \in J_1\}$ and $A_{J_1;J_2}$ for the matrix $A_{J_1;J_2}=\{\alpha_{i,j}: i \in J_1, j \in J_2\}$.

Checksums. Decompose the checksum scheme F into $F_i, 1 \leq i \leq n+k$. In this discussion, attention is restricted to the special case $F_i(x)=x_i$, $1 \leq i \leq n$. The first n points are the data, and the other k points are checksums for restoring the data. There are many options for the remaining functions $F_i$, i>n. Many non-linear functions are possible. The simplest function is the linear function $F_i = \Sigma \alpha_{i,j} x_j$, i>n.

Let $x_i, 1 \leq i \leq n$ denote the data, which lives in the finite field $F_{2^{16}}$. The checksums take the form $F_i = \Sigma \alpha_{i,j} x_j$. Let $e_i$ denote the unit vector in $F_q^n$ with $i^{th}$ coordinate 1 and all other coordinates 0. Let the matrix $A=\alpha_{i,j}$ and all its submatrices have non-zero determinates. The Cauchy matrix, for example, satisfies this condition [Davis, "Interpolation and Approximation", Dover, N.Y., 1975, pp. 268-269). In that case all of the data may be recovered from all of the checksums, or from any subset of checksums and data that contains at least n elements [Blomer et. al., "An XOR-Based Erasure Resilient Coding Scheme", Technical Report of the ICSI TR-95-048 (1995)].

In operation, the present invention works as follows. Numbers $f_i = \Sigma \alpha_{i,j} x_j$ are observed. If only n checksums are known, it is necessary only to solve the matrix equation Ax=f, or $x=A^{-1}f$. Now suppose n−q data points and q checksums are known. Let $D \subset I_n$ denote the unknown data points, and let $C \subset I_n$ denote the known checksums, so that |C|=|D|=q. Let $g_i = \Sigma \alpha_{i,j} x_j$, i∈C, j∈D. It is known that $g_i = \Sigma \alpha_{i,j} x_j$, i∈C, j∈D. By assumption the square submatrix $A_{C;D}$ is invertible, and the solution is $x=A_{C;D}^{-1}g$. Note that if more than n points (data and checksum) are known, then the matrix is overdetermined. This can help with the discovery of errors.

Figure 9:
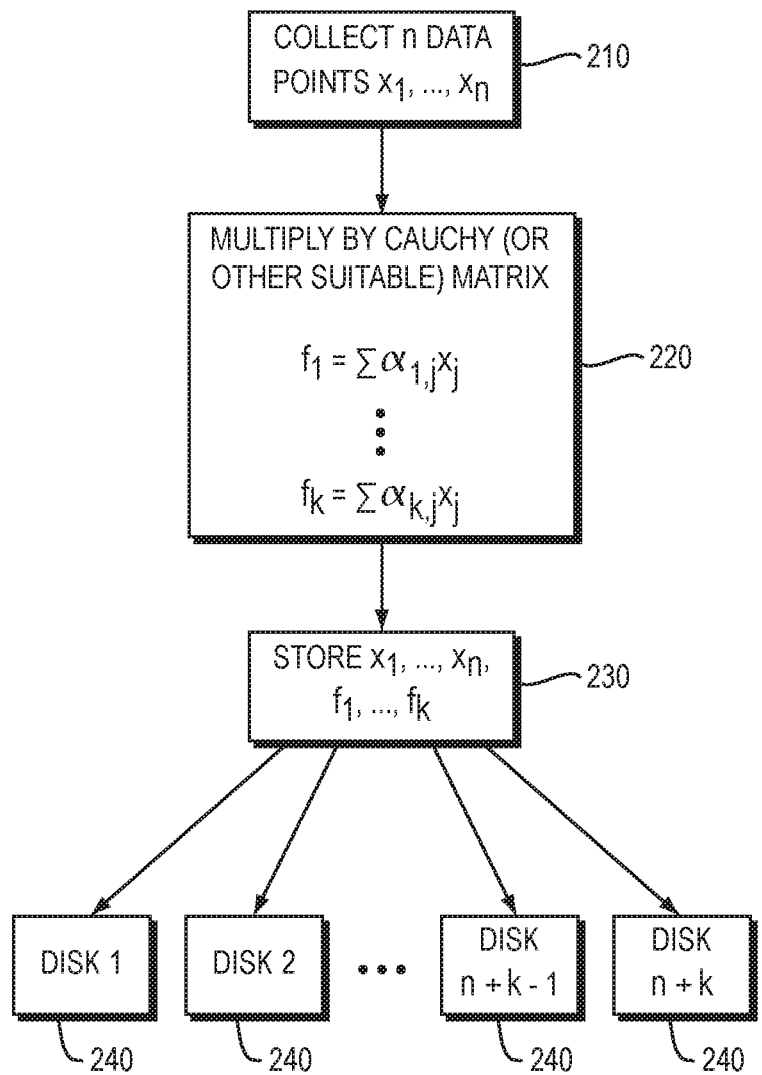
FIG. 9 is a flow diagram of an embodiment of the process of creating checksums, according to one aspect of the present invention.
Figure 10:
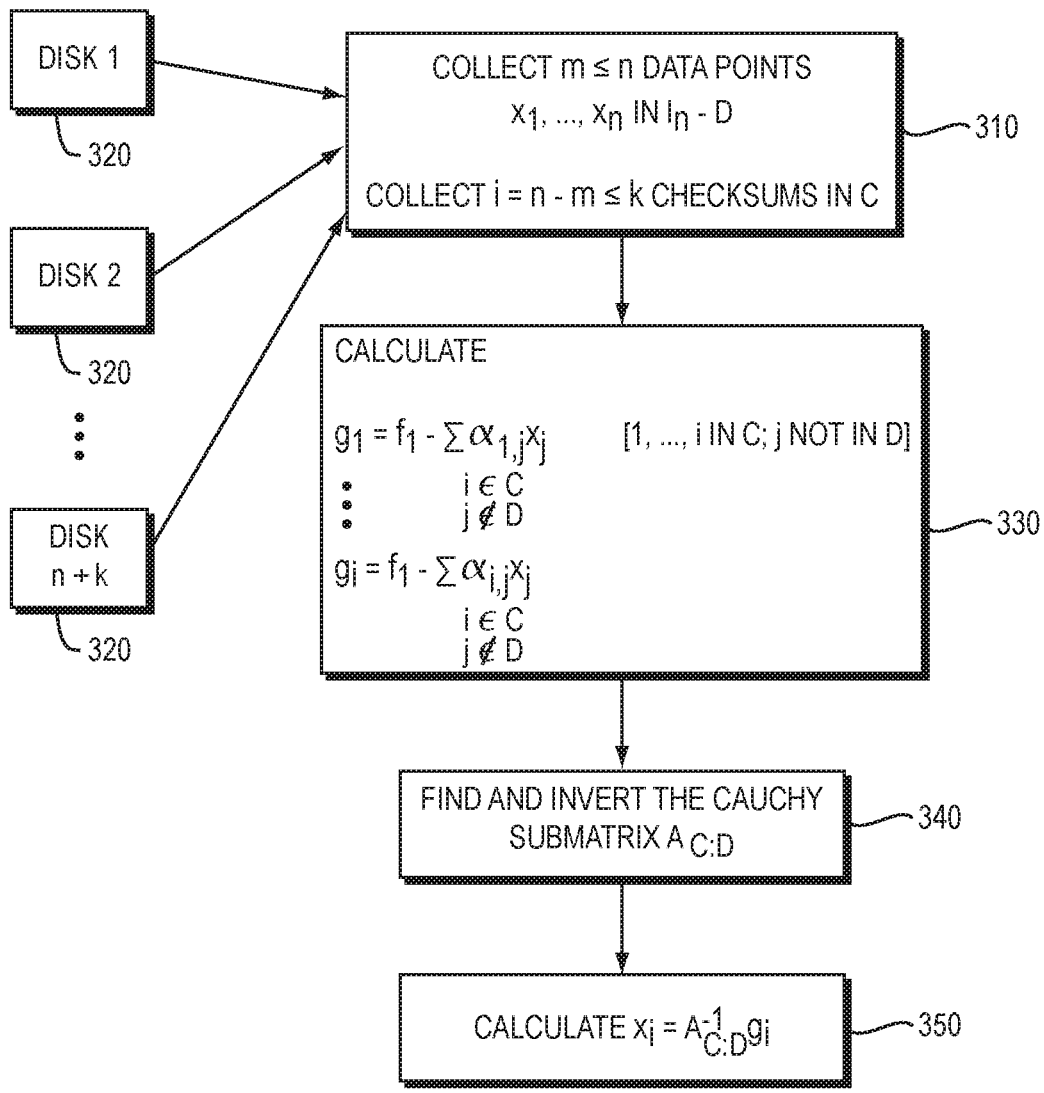
FIG. 10 is a flow diagram of an embodiment of the process of decoding checksums, according to one aspect of the present invention.

Preferred embodiments of the processes of creating and decoding checksums, respectively, are illustrated in the flow diagrams of FIGS. 9 and 10. In FIG. 9, the n data points are collected 210 and then multiplied by the Cauchy (or other suitable) matrix 220. The resulting data slices are then stored 230 on n+k disks 240. In FIG. 10, the data slices are collected 310 from the n+k disks 320. The reverse checksums are calculated 330, the Cauchy submatrix is found and inverted 340, and the original data points are reconstructed 350.

The Cauchy Matrix and Other Matrices. Let $x_i$ and $y_j$, $1 \le i \le n$, $1 \le j \le k$, be two sequences of numbers such that the $x_i$ are distinct, the $y_j$ are distinct, and $x_i+y_j \ne 0$ for every i and j. The matrix $$A = \alpha_{i,j} = \frac{1}{x_i + y_j}$$

is called a Cauchy matrix. Every square submatrix is invertible, and because of the special structure there are fast algorithms available for inversion.

When n=k the inverse matrix C satisfies:

$$c_{i,j} = -1^{n-1}(x_j + y_i) \prod_{k=1, k \ne j}^{n} \frac{x_k + y_i}{x_j - x_k} \prod_{k=1, k \ne i}^{n} \frac{x_j + y_k}{y_k - y_i}$$

[Davis, "Interpolation and Approximation", Dover, N.Y., 1975, p. 288]. This appears to require an $O(n^3)$ algorithm. In fact, if the obvious 4n products are precalculated, it can be calculated in $O(n^2)$ steps [Rabin, "Efficient Dispersal of Information for Security, Load Balancing, and Fault Tolerance", JACM 36:2, 1989, pp. 335-348]. Note that since the products do not change such precalculation has to be done only once.

Figure 11:
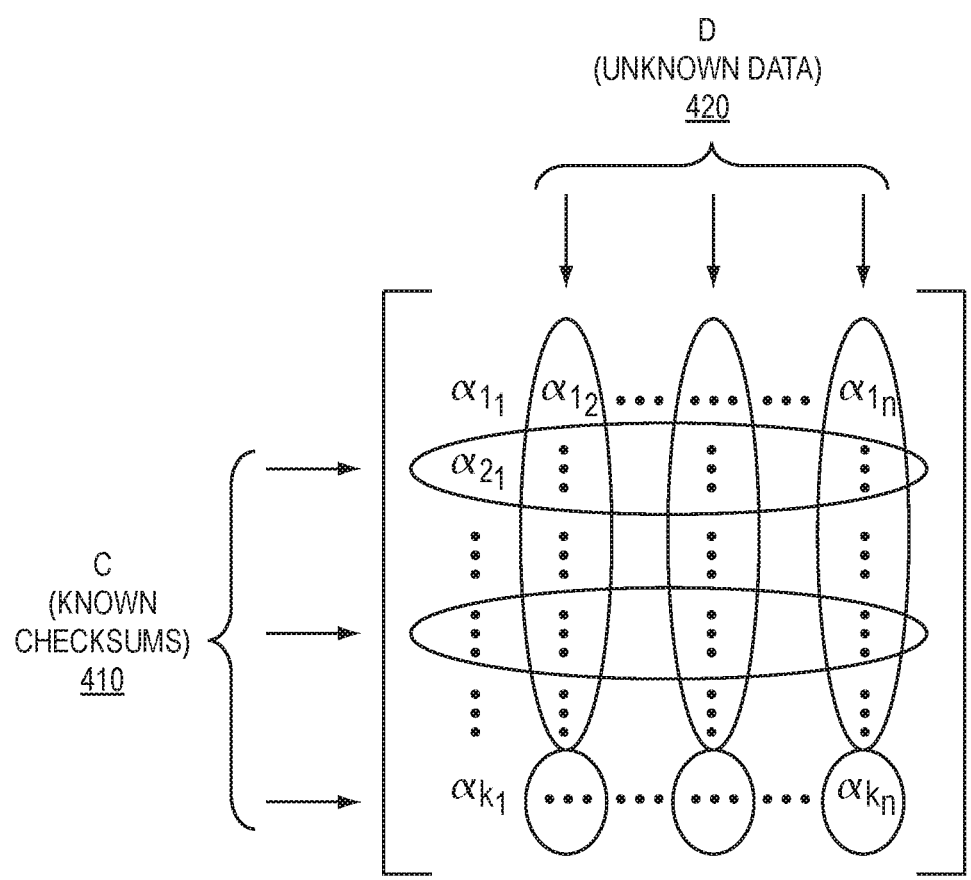
FIG. 11 is a conceptual diagram of an embodiment of the process of finding the Cauchy submatrix, according to one aspect of the present invention.

A conceptual diagram of a preferred embodiment of the process of finding the Cauchy submatrix, given known checksums C 410 and unknown data points D 420, is depicted in FIG. 11. It will be clear to one of skill in the art of the invention that other matrices also satisfy the condition that every submatrix is invertible, such as, but not limited to, Vandermonde matrices, and thus are suitable for use in the present invention, and also that other suitable methods for finding the submatrix may be similarly employed.

Constraints. There are two choices for the field in which all of the arithmetic for the checksums is performed. It can either be the real numbers or some finite field. The problem with choosing the real numbers is that Cauchy matrices are known to have explosively large condition numbers, and hence roundoff error will make the calculations impractical. In the preferred embodiment, the arithmetic is performed in the finite field $F_q$, since that can be done exactly. If the matrix A of section 3 is generated by n+k elements, a field with at least n+k distinct elements is needed, since no two elements generating the Cauchy matrix may sum to zero. Ideally the field elements should be storable in an integral number of bytes. Two plausible options are q=257 and $q=2^{16}$. Today's computers essentially use finite field approximations for data storage, since precision is bounded.

Using a Galois field with $2^m$ elements for some integer m gives great speed advantages, since addition can be replaced by XOR [Blomer et. al., "An XOR-Based Erasure Resilient Coding Scheme", Technical Report of the ICSI TR-95-048 (1995)]. Multiplication can be performed using a pre-calculated logarithm table. There exists a non-zero element b in the field with the property that $2^m-1$ is the smallest positive value of n for which $b^n=1$. That value can be found by experiment, and can be used as a base for a table of logarithms. In the particular case of $F_{2^{16}}$, as it has been coded in a preferred embodiment, b=2.

In a prototype implementation, the parameters are set such that $x_i=i$ and $y_j=n+i$ in the Cauchy matrix. Suppose it is desired to have the flexibility to expand the number of disks and the number of checksums. If M is the maximum possible number of checksums, then in this case, it might be more realistic to set $y_i=i$ and $x_i=M+i$.

It is simpler to program using a field with p elements where p is prime. In that case addition, subtraction, and multiplication take simple forms, and division can be calculated by multiplying inverses, and inverses can be calculated in advance and stored in a look up table. In particular, $x(+)y=(x+y) \% p$, $x(-)y=x-y \% p$, $x(*)y=(x*y) \% p$, and $x(/)y=x(*)y^{-1}$.

$x^{-1}$ may be calculated by sequentially calculating $x^k$, k=1, ..., p and recalling that if $x^n=1$, then $x^{n-1}=x^{-1}$. It is known that $x^{p-1}=1$ for every x in the field, so this method always works. Just calculate once and store the results in a table. Any prime q>256 works well, since that enables coding of one ASCII character in one number.

Random Errors. If it is known that errors are independent and occur with probability p, around $$\frac{np}{1-p}$$

checksums are needed on average. Due to variance, several more checksums are preferably required to account for variability. When n is large and the errors are independent and identically distributed, a normal approximation can be used. The number of errors with m≥n pieces of data is approximately normal with mean mp and variance mp(1-p)≈mp when p is small. If $\chi_\beta$ is the $\beta$ percentage point for a standard normal (e.g., 3 corresponds to 1/1000), then no fewer than $m-mp-\chi_\beta\sqrt{mp}$ correct transmissions are expected with probability 1-$\beta$. Solve for $n=m-mp-\chi_\beta\sqrt{mp}$; then m-n is the proper number of checksums. In most cases, $np+\chi_\beta\sqrt{np}$ will be an adequate approximation.

An approximation for the case when n is small is also needed. Suppose there are n data points and k checksums. Failure occurs if more than k of the n+k points fail to be transmitted. The probability of failure is then $$\sum_{j=1}^{n} \binom{n+k}{j+k} p^{j+k}(1-p)^{n-(j+k)} \le p^k \sum_{j=1}^{n} \binom{n+k}{j+k} p^j \le$$

$$\frac{np^{k+1}}{1-p}\binom{n+k}{\frac{n+k}{2}} \le \frac{np^{k+1}}{1-p} \frac{n+k}{2}\left(\frac{n+k}{2}+1\right)!$$

When $p \le n^{-1}$, a tighter inequality can be achieved. Recalling the equation:

$$\binom{n+k}{k+j+1} = \frac{n-(j+1)}{k+j+1}\binom{n+k}{k+j}$$

Then:

$$\sum_{j=1}^{n} \binom{n+k}{j+k} p^{j+k}(1-p)^{n-(j+k)} \le p^k \sum_{j=1}^{n} p^j \binom{n+k}{j+k} =$$

-continued $$p^k \binom{n+k}{k+1} \sum_{j=1}^{n} p^j \prod_{i=1}^{j} \frac{n-i}{k+i+1} \le p^k \binom{n+k}{k+1} \frac{n}{k+2}$$

For example, if $p=10^{-3}$ and one takes $n=5$ and $k=3$, then the bound is around $7*10^{-8}$.

Faster Checksums. Again suppose that n is large. Restoring each missing piece of data requires that touching all approximately $n(1-p)$ pieces of data. It would be preferable to reduce this number. In addition to regular checksums, fast checksums may be made as follows. Divide the n data points into b blocks containing $$\frac{n}{b}$$

points each (ignore fractions throughout this analysis). Constrain b by requiring $bp \approx 1$. Make two checksums in each block so that up to two errors may be restored. If only fast checksums need to be decoded in a block, then decoding each checksum requires touching only b points. It follows that one fast checksum may be decoded for each block in the time it takes to decode one slow checksum.

Approximate the number of errors in a block with a Poisson random variable with mean 1. The probability of more that 2 errors in a block is $$\frac{e-2.5}{e} \approx 0.08.$$

The expected number of errors in a block with more than 2 errors is $$\frac{e-2}{e-2.5} \approx 3.29.$$

If the two fast checksums can be used in addition to supplement the slow checksums on bad blocks, then fewer than two slow checksums are needed and the speed of decoding is considerably increased (the two examples that follow yielding around tenfold and thirtyfold increases). In fact, the fast checksums may be used with very high probability.

Inverting the checksum matrix. Let $\gamma_i^j$, $j=1, \ldots, n$ denote a Cauchy matrix. For blocks $$B_j, j = 1, \ldots, \frac{n}{b}$$

define the functions $\beta_j(i)=1$ if $i \in B_j$, and otherwise $\beta_j(i)=1$. Fast checksums are defined by $\Sigma_j(i)\gamma_i^k x_i$ and slow checksums by $\Sigma_i^k x_i$. Considering the simplest possible case, one fast checksum being calculated per block, and only one block having multiple errors. After subtracting out the known values, the problem is restricted to a single block, where the β values are identically 1. It follows that in this case only a normal Cauchy matrix needs to be inverted.

Proceed by induction. Suppose that the matrix obtained from b−1 blocks is invertible, and now consider the case where b blocks have too many errors. Suppose block i has $e_i$ errors, where $e_i > f$, the number of fast checksums per block. Set $E=\Sigma e_i$. Subtract out all of the known values, and obtain a matrix equation of the form $C_b x=c$, where $C_b$ is a known $E \times E$ matrix, x is the vector of unknowns of length E, and c is the vector of computed checksums of length E.

The matrix $C_b$ has a block structure. Each block submatrix $B_{i,j}$ has dimension $e_i \times e_j$. When $i=j$ it consists of a Cauchy matrix. When $i \ne j$ the first f rows are 0 and the remainder are elements of a Cauchy matrix. To perform the inductive step, write $$C_b = \begin{pmatrix} C_{b-1} & Q \\ R & B_{b,b} \end{pmatrix}$$

where Q is the singular $E-e_b \times e_b$ matrix of $B_{i,b}$, $1=1, \ldots, b-1$, and R is the singular $e_b \times E-E_b$ matrix of $B_{b,j}$, $j=1, \ldots, b-1$. The inductive hypothesis is that $C_{b-1}$ is invertible. Let $S=B_{b,b}-RC_{b-1}^{-1}Q$ be the Schur complement of $C_{b-1}$. It is known that $C_b$ is invertible if and only if S is invertible, in which case $$C_b^{-1} = \begin{pmatrix} C_{b-1}^{-1} + C_{b-1}^{-1}QS^{-1}RC_{b-1}^{-1} & -C_{b-1}^{-1}QS^{-1} \\ -S^{-1}RC_{b-1}^{-1} & S^{-1} \end{pmatrix}$$

A simpler technique can be used, as follows: Let $M=\{m_1, \ldots, m_n\}$ be a linearly independent set of vectors which span $R^n$, and let $C=\{c_1, \ldots, c_n\}$ be a set of vectors satisfying $m_i^T c_j = \delta_{i,j}$. Call C a vector inverse of Let $Q=\{m_1, \ldots, m_{n-1}, q_n\}$. Set $\mu_n^i = q_n^T c_i$. If $\mu_n^n \ne 0$, then when $i<n$, set $$v_n^i = -\frac{\mu_n^i}{\mu_n^n}, \text{ and set } v_n^n = \frac{1}{\mu_n^n}.$$

Then $$q_n = \sum_{i=1}^{n} \mu_n^i m_i,$$

and if $\mu_n^n \ne 0$, then q has a vector inverse, and $Q^{-1}=\{c_1+v_n^1 c_n, \ldots, c_{n-1}+v_n^{n-1}c_n, v_n^n c_n\}$. In a preferred embodiment, M is the regular Cauchy matrix and C is its inverse. The relevant vectors of the Cauchy matrix can be sequentially replaced with the modified blocked matrix and its inverse can be sequentially calculated.

Speed. The main cost of decoding checksums when the probability of error is small is the cost of subtracting out the known data. One fast checksum can be decoded in every group for the cost of calculating one slow checksum. There is a subsidiary cost, and that is the cost of multiplying the residue by the inverse Cauchy (or block Cauchy) matrix. This is also smaller for the fast checksums in good blocks, since they require a much smaller matrix to work with (the cost of calculating the matrix inverse is always negligible, since it is used many times and calculated only once). The cost of multiplying the residues of fast checksums in bad blocks is also less, since the inverse block Cauchy matrix has large regions of zeros. Since the cost is very small compared with calculating the residues, it can be ignored.

In general, it is expected that np checksums will be used, for a total time of $n^2p$. If two fast checksums are used per block, this will reduce to around $0.1 \times n^2p+2n$. If three fast checksums are used, this will reduce to around $0.035 \times n^2p+3n$. If n is appreciably larger than p, this can yield significant time savings at a modest cost in space.

For example, suppose $p=10^{-2}$, and 1000 blocks of 100 elements each and 2 fast checksums per block and 1100 slow checksums are used. It is expected to find around 920 good blocks with no more than 2 errors each, and 80 bad blocks where checksums need to be combined. It can be expected that there will be around 264 total errors in these bad blocks. Around 736 fast checksums are used in good blocks and 160 fast checksums are used in the bad blocks. All together these take around as much time to decode as 1 slow checksum, 104 of which are used. The result is that, rather than decoding 1000 slow checksums, the equivalent of 105 slow checksums are decoded, resulting in a tenfold decrease in time.

Alternatively, suppose 3 checksums are used per block. It can be expected that there will be 981 good blocks with no more than 3 errors each, and 19 bad blocks checksums need to be combined. Around 81 total errors are expected in these bad blocks. Around 919 fast checksums are used in good blocks and 57 fast checksums are used in the bad blocks. All together these take around as much time to decode as 1 slow checksum, 34 of which are used. The result is that rather than decoding 1000 slow checksums, the equivalent of 35 slow checksums are decoded, resulting in a twenty eight-fold decrease in time.

Nodal checksums. Consider another use of these fast checksums. Suppose the data are stored in correlated clusters that have faster communications within a cluster. For example, a subnode might be on a common circuit, and a node might be in a common building. Some checksumming can be performed at the subnode level and the node level for speed advantage, and some checksumming can be performed between nodes for slower but more secure protection of data.

Vector Spaces of Numbers. If each character of an ASCII file is coded separately, the data is represented not as a single number, but as a vector of numbers. Each component of the vector can be coded as above, using the same matrix A every time. The same matrix is always obtained for decoding, and it will be necessary to invert it only once per transmission, no matter how long the vector is. Essentially the file is divided up into a set of numbers whose concatenation is the original file (in whatever encoding the computer is using). Each of these is treated independently.

Reassembling a User's Files. Once a file is stored, a way to find it and reassemble it is required. Two typical paradigms known in the art are "pulling" and "pushing". Pulling involves having a central control that remembers where the file is stored and collects it. Pushing involves sending a request for the file and expecting it to come streaming in on its own. Each paradigm has its problems. The problem with pulling is that if the central index (or the pointer to the central index) is lost, then so is the file. The problem with pushing is that it requires querying many extra disks and storing certain extra information. It is expected that the extra information and the data transferred during queries is small compared with the cost of transferring files, so pulling is considered first.

In a preferred embodiment, the "central index" is a distributed hash table that is itself fault resilient and has data that is itself encoded and spread redundantly among computers. This means that that there is no central point of failure. A preferred application uses a distributed hash table (DHT) to achieve this distribution, but it will be clear to one of skill in the art of the invention that other methods can also be used. DHTs have previously been used for non-reliable (best-effort) storage such as BitTorrent, but the application of a DHT to reliable distributed storage is novel.

In a preferred embodiment, each piece of a file is stored with the following information: userid, fileid, how many pieces/checksums the file is broken into, and which piece this is. This last will be a vector with n parameters; if the same checksum scheme is always used (i.e., matrix A), it can be an integer between 1 and n+k. This information is available to the disk controller. This assumes that when a disk fails, it fails completely. If the index of the disk can fail independently of the disk (for example, in a disk containing bad sectors), it is necessary to consider the whole disk as having failed. The alternative is a recursive scheme backing up the disk to itself. The user is defined by the userid; when the user logs on he broadcasts a request for his index file (which has a standardized name), which contains a list of his file names and their ids. He can then request files as he desires. In general, each file can be stored with different 'metadata' (i.e., information about the file), as the application requires. Such metadata may include, but are not limited to, modification date, owner, permissions, CRC, which set of files the current file belongs to, hashes used to prevent replication, and any other data that the system may find useful.

The details of how a broadcast is made can be complex. Suppose a typical network contains 10,000 nodes, and a typical file is stored on 100 disks. Some effort may be eliminated if it can be guessed which disks are likely to hold a particular file, such as through some chaotic function of the fileid, which is also called a hash code by computer programmers. A second issue is that it is preferable to fill disks more or less evenly. A greedy algorithm will work fine, but is not predictable, so that when requests are broadcast it isn't known where to look. A randomized algorithm will work almost as well, but it is desirable to include a seed with each fileid so it is known where it began to be stored. In a preferred application, using a DHT easily enables the system to find any given file. The exact number of disk accesses needed scales favorably (typically poly-logarithmically) with the number of computers in the system.

As previously mentioned, the present invention may particularly be advantageously applied to the problem of disk backup, providing an efficient means for distributed backup. There are other examples of distributed backup known in the art, such as, for example, CleverSpace, but they use different approaches. In this application, instead of storing data on the disk drive of the user's machine, a community of cooperating devices is employed. When data is written to the disk drive, it is sliced into smaller pieces, checksummed using the Cauchy Matrix-based methods of the present invention and distributed among the disk drives of the community. Now, if one of the users' network connections is interrupted or their disk has crashed, the stored data is still available. Thus, a user can never lose their data. In addition, it can be guaranteed that the user's data will be available so long as the community-wide failure rate stays below a particular level, a level that can be specified according to the demands of the particular community. This therefore provides a system with much better reliability than traditional backup systems that simply hold the data in two locations. Furthermore, with a reasonable network connection, the speed of retrieval can be faster than a disk controller, since the data is coming from multiple sources and, as Hartman and Ousterhout point out [John H. Hartman, John K. Ousterhout, The Zebra Striped Network File System, ACM Transactions on Computer Systems (TOCS), Volume 13, Issue 3 (August 1995) 274-310], such an approach performs better than typical disk controllers. Essentially, it will no longer be necessary to backup data, since the nature of the way the data is stored assures its integrity, even in the presence of unreliable hardware. If the system has a bounded rate of failure, it is possible to proactively correct errors. This means that even if the total number of failures is extremely large, all of the data is recoverable as long as the number of failures in any given time frame is bounded.

While a particular example system is discussed, it will be clear to one of skill in the art that it is illustrative only, and that there are myriad possible implementations and examples. Applying the specific example analysis discussed previously to the problem of disk backup, suppose there are d disks, it is expected that no more than k of them to fail, and it is desired to back them all up. Partition the contents of each disk into n equal parts, and calculate k checksums. Each part is, of course, a vector. As long as k+n<d, each part or checksum may be stored on a separate disk, which guarantees against loss of data. The cost of this scheme is extra storage and overhead. If things are arranged so that the location of files is transparent to the user, it is not necessary to have two copies of the n pieces of data. In that case, the cost is the size of the k checksums, which is $$\frac{k}{n}$$

of the total disk space originally used. Obviously, the larger n is the smaller this number is, and the tradeoff will be against the overhead costs (bookkeeping and restoring files).

Figure 12:
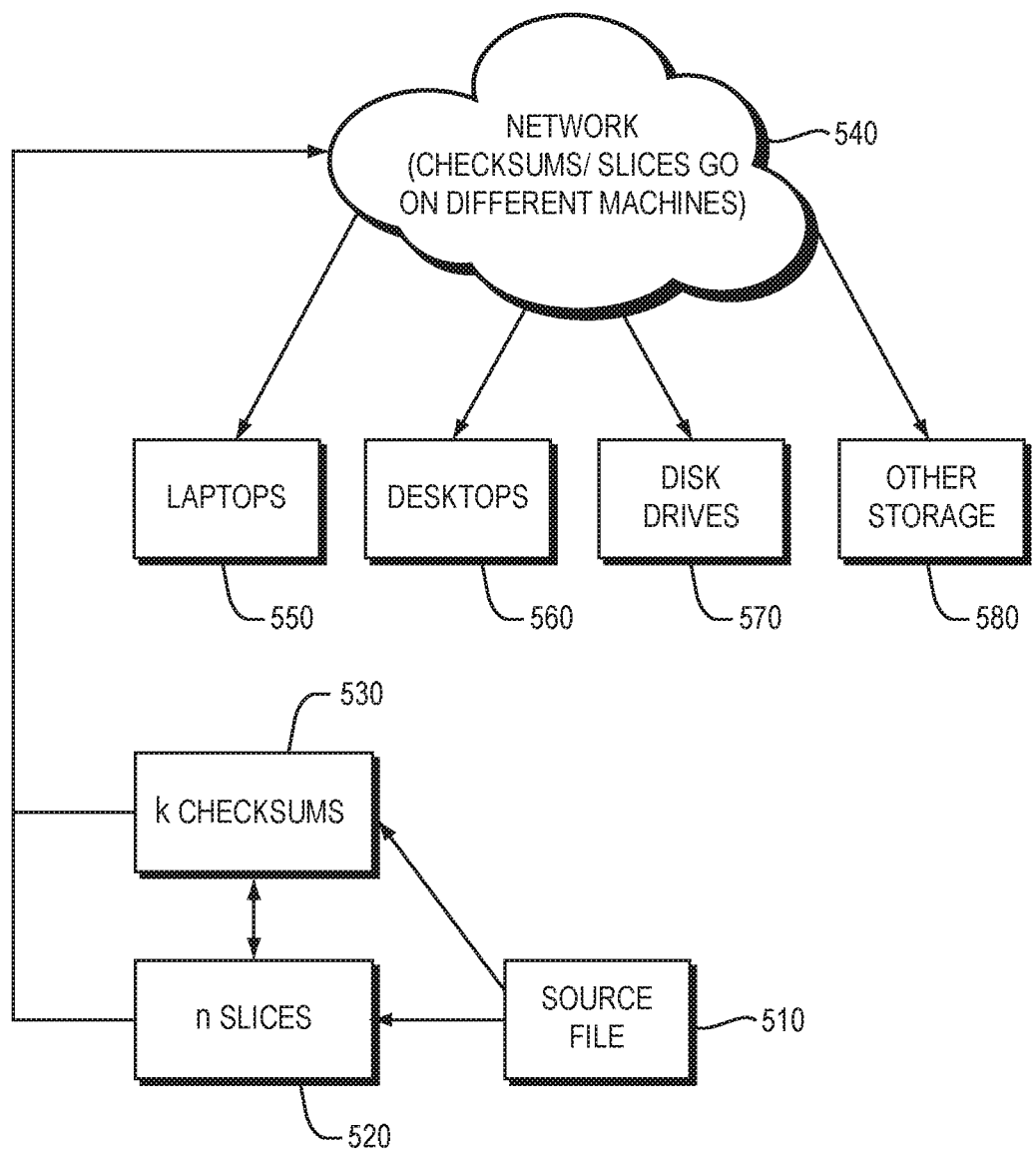
FIG. 12 is a block diagram illustrating an embodiment of the process of dispersing data slices in a network, according to one aspect of the present invention.

FIG. 12 is a block diagram illustrating an embodiment of the process of dispersing data slices in a network. In FIG. 12, source file 510 is sliced into n slices 520 and k checksums 530 are calculated. Data slices 520 and checksums 530 are then sent over network 540 and stored across various laptop computers 550, desktop computers 560, disk drives 570 and/or other suitable storage devices 580.

The present invention may also be advantageously applied to the problem of database reliability. A database is a file that is edited piece by piece. One of issues with the use of matrix-based codes is that the algorithms are designed for the storage and retrieval of large files may not be efficient for databases where small amounts of data is stored and retrieved, as in the case where a single record is added or modified. There are two general solutions to this problem: a modification of the matrix-based codes or evaporation. By using fewer checksums and slicing the files up differently, small files may be efficiently read and written. This permits large database systems to be constructed from commodity hardware and extended simply by adding more storage. Such a design is extensible, redundant, and fault tolerant, in that drives can be removed and added at will without interruption.

The other solution to writing small files, evaporation, also has many other applications. In evaporation, rather than rewriting new data to existing files, when a file is rewritten it is simply written again in another location and the previous file is left as is. The directory of the file system is updated to reflect the new location of the file. Unless the file has some explicit policy associated with it, it remains in the distributed file system. Based on a defined policy, such as, for example, files that are marked as a candidate for deletion or files that have not been accessed or modified for a particular period of time, files are evaporated and can be replaced. Files that need to be maintained are marked as such and will persist. Evaporation can easily be run as a separate process in the background. The feasibility of this process is a side effect of the fact that disk storage is now very cheap and the methods of the present invention are much more efficient than prior art mirrors or other coding methods, so that the cost is not overwhelming. Evaporation can be thought of as the equivalent of garbage collection for managing memory.

For simplicity, assume that each database piece is the same size. Effective backup has been obtained by this invention with minimum extra space for normal files by distributing them over many disks with independent errors. The cost was that each disk had to be read every time the file was filed. In an alternative embodiment, appending to a file may be used and may be considerably less expensive. In general, more "expensive" (e.g., storage intensive) backup techniques are generally preferred if they require fewer reads and writes to obtain or change single elements of the database. Yekhanin ["New Locally Decodable Codes and Private Information Retrieval Schemes", Electronic Colloquium on Computational Complexity, Report No. 127 (2006)] reviews algorithms for database reliability. The problem Yekhanin addresses is the amount of space required to obtain, with high probability, a correct answer from a small, fixed number of queries. He claims that, for a database of length m, such an algorithm requires more than $O(m^{1+\delta})$ space, assuming that the probability of error remains fixed, but the size of the database is increased.

The present invention is different in at least two respects. First, it is assumed that which data are erroneous is known. Second, rather than having a fixed number of queries, a random number are allowed, with small expectation. In that case, O(m) space is needed to solve Yekhanin's problem, and O(m log m) space is needed to have high probability that of recovering every element of the database. The algorithm is: Let ε>0 be the total possible allowable error. Select n such that $p<n^{-1}$ (in the worst case we'll need n=1). Group the m=g*n data points into g groups each containing n points. Checksum each group with k checksums. The probability of error for a query of a single datum is bounded by $$f(k) = p^k \binom{n+k}{k+1} \frac{n}{k+2}$$

Notice that f(k) does not depend on g, and that $$\lim_{k \to \infty} f(k) \leq \lim_{k \to \infty} p^k (n+k)^n = 0$$

Select k so that f(k)≤ε and then use k checksums for every n points of data, yielding $$m + gk = m + \frac{mk}{n}$$

points in all, O(m) space. It can be assumed that which data is erroneous is known due to over determination of the matrix inversion. Which data is erroneous could also be discovered by, for example, using a homomorphic encoding/ signatures of the data pieces. It will be clear to one of skill in the art of the invention that any other method can be used to discover which pieces are incorrect.

As for time, with probability 1-p one query will suffice, and otherwise it is expected to need $$\frac{k}{1-p}$$

additional queries, a total expected value of $$1 + \frac{kp}{1-p}.$$

In the event that the initial query fails (probability p), an $O(k^2)$ time algorithm will also be needed to invert the matrix needed to decode the checksums.

Suppose that it is desirable to know the probability that all the queries asked turn out correct. In that case, the probability of error is $$f(g) = gp^k \binom{n+k}{k+1} \frac{n}{k+2}$$

Set k=α log g and write $$f(g) = gp^k \binom{n+k}{k+1} \frac{n}{k+2}$$

$\leq \exp(\log g + \alpha \log g \log p + n \log(n + \log g))$ $\leq \exp(1 + \alpha \log p) \log g + n \log(n + \log g))$ which converges to 0 as long as $$\alpha < \frac{-1}{\log p}.$$

The rest of the analysis is precisely as above. The only difference is that, since k=O(log m), O(m log m), space is needed.

Thus far, only consulting a database has been discussed. There is also a second operation: changing a database entry. To do this, it is necessary to change one entry and k checksums. To evaluate the new value of the k checksums, there are two options; one is to recalculate the checksums from scratch, and the other is to subtract out the contribution of the changed element, and to replace it with the contribution of the new element. This is an O(1) operation for each of the k checksums. In addition, some way to index the operation is required in order to find out where the data and its checksums are stored. Conceptually this is a table; in practice, it should be a function of some sort so that it will not require appreciable space. A preferred application uses a DHT for this purpose.

The calculations of probabilities assume that every entry in the database is independent. Suppose, instead, that n+k disks are used, and one element of every group is stored on the same disk, so that all elements on one disk succeed or fail together. In that case the first calculation of probability of error is correct, even when m→∞. In particular, k may be taken as fixed. This provides an opportunity to implement distributed databases. Some kind of lock on the group of n+k data and checksums is required while one of them is being written, but there need be no such constraints when they are read, and there need be no constraints on the rest of the database. Such a lock is required only for consistency; if consistency is not desired then this can be ignored. The furnishing of such locks can be thought of as a service to programs desiring to use this invention for distributed computation.

A possible embodiment of the system assumes that files will be distributed among disks scattered throughout the network. This requires extra security, both from malicious and accidental corruption. Several possible security devices would be suitable for files. One is a cryptographic hash that depends on the entire file, so that it is known if the file has been changed. Another is a public/private key for encoding the file so that it can't be read by anyone unauthorized. And a third is a header describing the file in some detail. It may optionally be desirable to include pointers to other pieces of the same file. At first glance it might seem that it is not possible to obtain a self-proving file; that is, the hash can't be part of the file. That changes, though, if the hash can itself be coded, e.g., by artfully interspersing a password into the file to be hashed. In order to use the cryptographic hash, an index file that contains the previously calculated hashes of all the slices of all the files belonging to the user is used. It will be clear to one of skill in the art of the invention that any other cryptographic method may be utilized to ensure privacy and security of data.

The present invention may also be advantageously applied to the problem of restoring tracks on a single disk. A major problem with disk drives is that they fail and recovery can be long and costly, sometimes costing thousands of dollars to repair. The user faced with loss of data is often willing to pay almost anything for the disk to be repaired. There are many failure modes for disk drives, including head crashes, circuit card problems, alignment, and media deterioration. Some disk failures are catastrophic. Others, however, damage only certain tracks on a hard disk. One major failure mode is for the head on a multi-platter drive to "go open", i.e. the head fails. In that instance, one whole platter of the drive is lost; however, the rest of the disk platters still work. Scratches on a CD or DVD are conceptually similar. The principles embodied in the present invention may be advantageously used to design a self-restoring hard disk, as well as a CD/DVD that is resistant to scratches.

For example, if the drive uses matrix-based codes and slices what is written to the disk so that it is split among platters, then if any one platter, or even multiple platters, fail, data written to the disk can be recovered without opening the disk and replacing the head. This is accomplished by simply writing slices to each platter in a manner such that data can be recovered if any one platter is lost. In fact, this repair can be performed without requiring user intervention. The cost is an amount of additional storage necessary for the checksums, but if there are a reasonable number of platters, this would be small, being on the order of the inverse of the number of platters. There is an additional cost in read only storage that after failure data access will be slightly slower. This approach can also be used to protect against both hard and soft disk errors that occur on a sector-by-sector basis. In such an instance, data is written and read in ensembles and these are distributed on the disk, in different places on a single platter and/or on different platters. If there are hard or soft errors, the disk can still be recovered.

Figure 13:
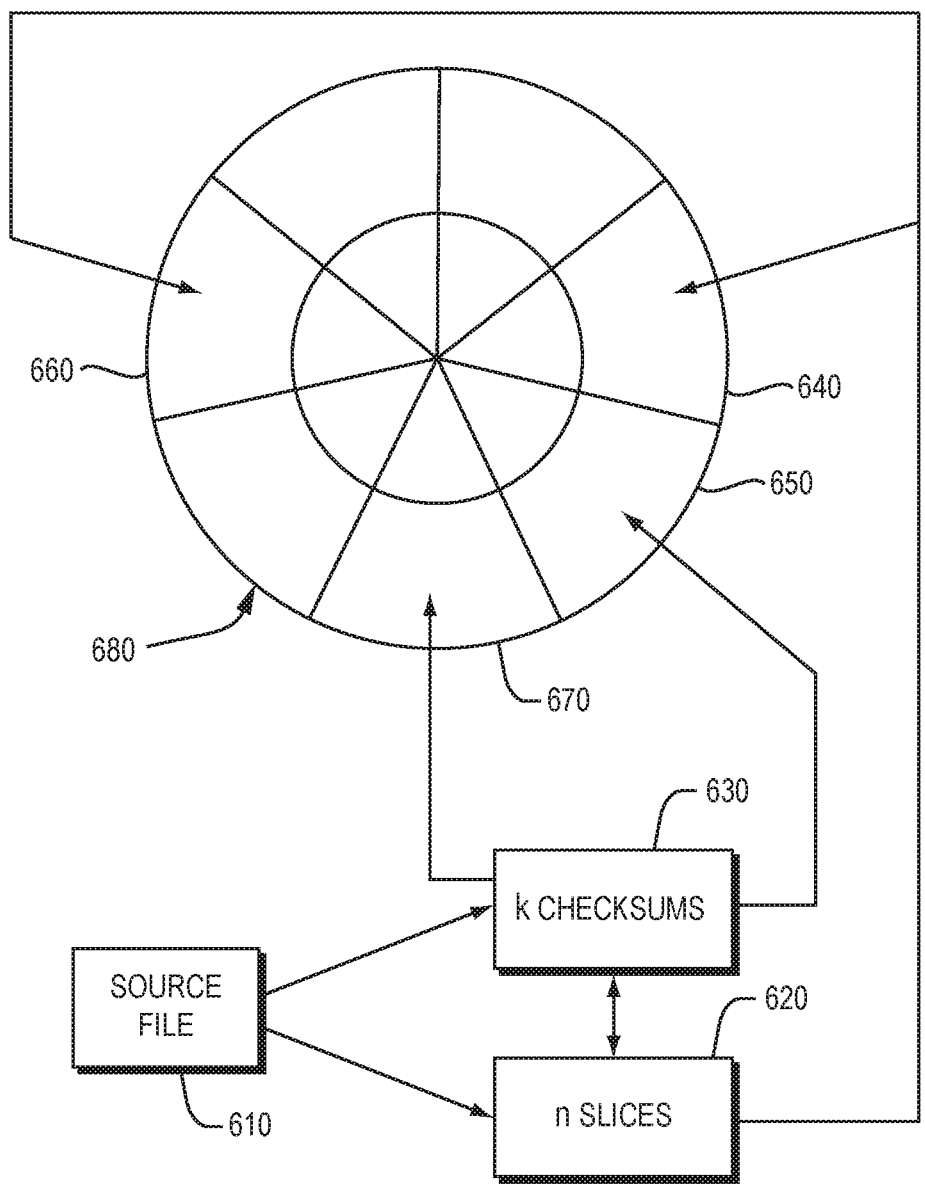
FIG. 13 is a block diagram illustrating an embodiment of the process of dispersing data slices on disk tracks, according to another aspect of the present invention.

FIG. 13 is a block diagram illustrating an embodiment of the process of dispersing data slices on disk tracks according to this aspect of the present invention. In FIG. 13, source file 610 is sliced into n slices 620 and k checksums 630 are calculated. Data slices 620 and checksums 630 are then stored in separate sectors 640, 650, 660, 670 of hard drive 680.

Figure 14:
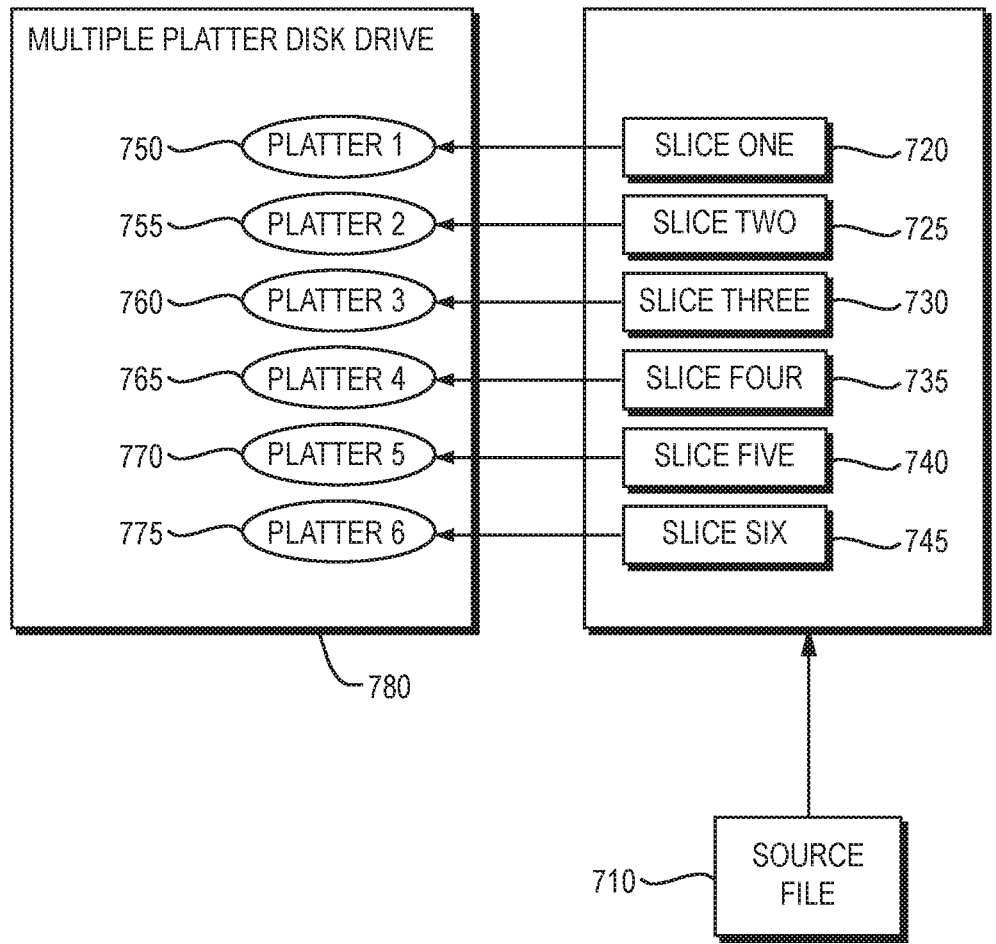
FIG. 14 is a block diagram illustrating an embodiment of the process of dispersing data slices on a multiple platter disk drive, according to one aspect of the present invention.

FIG. 14 is a block diagram illustrating an embodiment of the process of dispersing data slices onto the platters of a multiple platter disk drive. In FIG. 14, source file 710 is sliced into data slices 720, 725, 730, 735, 740, 745, which are then stored on separate platters 750, 755, 760, 765, 770, 755 of multiple platter disk drive 780.

Time and Space Costs. Suppose a large file has been coded, so that the overhead of inverting the Cauchy matrix is negligible (of course the cost can be negligible for small files also if it is precalculated). In particular, say that the file is of length nv. The cost of inverting each checksum is then n multiplications and n subtractions. In a preferred embodiment, the multiplication has been coded as a look up table so that each of these operations take around the same time. It follows that each checksum takes 2n time to be decoded. It is expected that np disks will be lost, and hence it is expected that vnp checksums will be decoded, and thus the time of decoding is proportional to $vn^2p$.

Time may be saved by adding extra checksums. Suppose, for example, that the n disks are grouped into subgroups of $$\frac{1}{p} \text{(round down)}.$$

Calculate 3 checksums for each subgroup. Checksums over the entire group of n disks are also required. If p is small enough (say p<0.2), the number of errors among a subgroup may be approximated by a Poisson with mean 1. If X is a Poisson with mean 1, the probability that it is greater than 3 is $$1 - e^{-1}\left(1 + 1 + \frac{1}{2} + \frac{1}{6}\right) < 0.02.$$

At the boundary, when p=0.2, the exact value is less than 0.007, well below the Poisson approximation.

It follows that more than 98/100 of the groups can be decoded in time $$\frac{1}{p}$$

rather than time n. The remaining groups will have disproportionately large numbers of checksums. If X represents a Poisson with mean 1 the expected value is $E(X|X \leq 3) \leq 3.3$. It follows that the total time for decoding checksums will be proportional to $v(n+0.02*3.3n^2p)$. To pick a reasonable example, suppose p=0.01 and $n=10^4$. Using the regular system, it is expected that the decoding time will be proportional to $v10^6$. Using the system of the present invention, that is reduced to $v(10^4+0.0661 0^6)=3v10^4$, a seven fold reduction. For fixed p, as n gets large, the limit is more than a fifteen fold reduction.

Further, while 3np of the fast checksums are needed, the full quota of $np+\chi\sqrt{np}$ slow checksums is not needed, since more than 98/100 of the groups will be preempted by the fast checksums. Instead, only $0.066np+\chi\sqrt{np}$ slow checksums are needed. In addition, slow checksums are added to account for the loss of checksums due to disk failures. The tripled checksums need not be duplicated; instead only an additional $$\frac{p}{1-p}(np + \chi\sqrt{np})$$

slow checksums are needed.

As an example, suppose it has been decided to have three checksums per group. What would be the optimal group size? It is desirable to set it so the probability of more than three errors was small. In other words, if $\lambda$ is the mean of the Poisson, it is desirable to pick $\lambda$ to minimize $$e^{-\lambda}\left(1 + \lambda + \frac{\lambda^2}{2} + \frac{\lambda^3}{6}\right).$$

This requires solving the equation $\lambda^4+3\lambda 3+3\lambda^2-6=0$. The solution is around 0.95, and reduces the probability from around 0.019 to around 0.017. It follows that a slightly better limiting speed up (from around 15 to around 18) will be obtained if groups of size $$\frac{0.95}{p}$$

are taken.

The number of checksums per group may also be changed. At $\lambda=1$, the marginal value of the fourth checksum is small. In general, however, given a number of checksums, it is necessary to redo the optimization. For example, if only two checksums are desired, the optimal value is around $$\frac{0.85}{p}.$$

This gives a limiting speedup of 11, whereas a group size of $$\frac{1}{p}$$

gives a limiting speedup of 7.8. A particular advantage of the present invention is that these calculations may be performed in parallel, speeding up the computation and permitting it to be run in distributed and multi-core systems. Although the above discussion focuses on two types of checksums (fast and slow), it is clear to one skilled in the art that multiple levels of checksums may be advantageously employed in the present invention.

Comparison With Standard Results. These results compare favorably with Luby's Tornado codes [Luby et. al., "Efficient Erasure Correcting Codes", IEEE Transactions on Information Theory 47:2, (2001) 569-584]. Tornado codes take n log n time, and the procedure of the present invention will therefore be faster if $$n^2 p^2 = O(1),$$

or $$p = O\left(\frac{1}{n}\right).$$

Ease of implementation also argues for use of the present invention in marginal cases. In addition, tornado codes have a positive probability of failure.

In particular, changing the database is fast, being only a O(k) operation. When only n+k disks are used, the probability of an error somewhere in the system decreases). The present invention therefore needs only O(n) to solve Yekhanin's problem of minimizing the probability that a single query will yield an incorrect answer. O(n log n) is required for the stronger claim that every database element is recoverable. Tables 1-3 present bounds on probabilities for 1 to 10 data points and checksums per group using the present invention, for probability of error 1/10, 1/100, and 1/1000.

Table 1 for bound on probability of error 0.1

| | checksums | | | | | | | | | |
|---|---|---|---|---|---|---|---|---|---|---|
| data | 1 | 2 | 3 | 4 | 5 | 6 | 7 | 8 | 9 | 10 |
| 1 | 0.03 | 0.003 | 0.0002 | 2.00E−05 | 1.00E−06 | 1.00E−07 | 1.00E−08 | 1.00E−09 | 9.00E−11 | 8.00E−12 |
| 2 | 0.2 | 0.02 | 0.002 | 0.0002 | 2.00E−05 | 2.00E−06 | 2.00E−07 | 2.00E−08 | 2.00E−09 | 2.00E−10 |
| 3 | 0.6 | 0.08 | 0.009 | 0.001 | 0.0001 | 1.00E−05 | 2.00E−06 | 2.00E−07 | 2.00E−08 | 2.00E−09 |
| 4 | 1 | 0.2 | 0.03 | 0.004 | 0.0005 | 6.00E−05 | 7.00E−06 | 9.00E−07 | 1.00E−07 | 1.00E−08 |
| 5 | 2 | 0.4 | 0.07 | 0.01 | 0.002 | 0.0002 | 3.00E−05 | 4.00E−06 | 5.00E−07 | 6.00E−08 |
| 6 | 4 | 0.8 | 0.2 | 0.03 | 0.004 | 0.0006 | 9.00E−05 | 1.00E−05 | 2.00E−06 | 2.00E−07 |
| 7 | 7 | 1 | 0.3 | 0.05 | 0.009 | 0.002 | 0.0002 | 4.00E−05 | 5.00E−06 | 7.00E−07 |
| 8 | 10 | 2 | 0.5 | 0.1 | 0.02 | 0.003 | 0.0006 | 9.00E−05 | 1.00E−05 | 2.00E−06 |
| 9 | 10 | 4 | 0.9 | 0.2 | 0.04 | 0.007 | 0.001 | 0.0002 | 4.00E−05 | 6.00E−06 |
| 10 | 20 | 6 | 1 | 0.3 | 0.07 | 0.01 | 0.003 | 0.0005 | 8.00E−05 | 1.00E−05 |

Table 2 for bound on probability of error 0.01

| | checksums | | | | | | | | | |
|---|---|---|---|---|---|---|---|---|---|---|
| data | 1 | 2 | 3 | 4 | 5 | 6 | 7 | 8 | 9 | 10 |
| 1 | 0.003 | 3.00E−05 | 2.00E−07 | 2.00E−09 | 1.00E−11 | 1.00E−13 | 1.00E−15 | 1.00E−17 | 9.00E−20 | 8.00E−22 |
| 2 | 0.02 | 0.0002 | 2.00E−06 | 2.00E−08 | 2.00E−10 | 2.00E−12 | 2.00E−14 | 2.00E−16 | 2.00E−18 | 2.00E−20 |
| 3 | 0.06 | 0.0008 | 9.00E−06 | 1.00E−07 | 1.00E−09 | 1.00E−11 | 2.00E−13 | 2.00E−15 | 2.00E−17 | 2.00E−19 |
| 4 | 0.1 | 0.002 | 3.00E−05 | 4.00E−07 | 5.00E−09 | 6.00E−11 | 7.00E−13 | 9.00E−15 | 1.00E−16 | 1.00E−18 |
| 5 | 0.3 | 0.004 | 7.00E−05 | 1.00E−06 | 2.00E−08 | 2.00E−10 | 3.00E−12 | 4.00E−14 | 5.00E−16 | 6.00E−18 |
| 6 | 0.4 | 0.008 | 0.0002 | 3.00E−06 | 4.00E−08 | 6.00E−10 | 9.00E−12 | 1.00E−13 | 2.00E−15 | 2.00E−17 |
| 7 | 0.7 | 0.01 | 0.0003 | 5.00E−06 | 9.00E−08 | 2.00E−09 | 2.00E−11 | 4.00E−13 | 5.00E−15 | 7.00E−17 |
| 8 | 1 | 0.02 | 0.0005 | 1.00E−05 | 2.00E−07 | 3.00E−09 | 6.00E−11 | 9.00E−13 | 1.00E−14 | 2.00E−16 |
| 9 | 1 | 0.04 | 0.0009 | 2.00E−05 | 4.00E−07 | 7.00E−09 | 1.00E−10 | 2.00E−12 | 4.00E−14 | 6.00E−16 |
| 10 | 2 | 0.06 | 0.001 | 3.00E−05 | 7.00E−07 | 1.00E−08 | 3.00E−10 | 5.00E−12 | 8.00E−14 | 1.00E−15 |

Table 3 for bound on probability of error 0.001

| | checksums | | | | | | | | | |
|---|---|---|---|---|---|---|---|---|---|---|
| data | 1 | 2 | 3 | 4 | 5 | 6 | 7 | 8 | 9 | 10 |
| 1 | 0.0003 | 3.00E−07 | 2.00E−10 | 2.00E−13 | 1.00E−16 | 1.00E−19 | 1.00E−22 | 1.00E−25 | 9.00E−29 | 8.00E−32 |
| 2 | 0.002 | 2.00E−06 | 2.00E−09 | 2.00E−12 | 2.00E−15 | 2.00E−18 | 2.00E−21 | 2.00E−24 | 2.00E−27 | 2.00E−30 |
| 3 | 0.006 | 8.00E−06 | 9.00E−09 | 1.00E−11 | 1.00E−14 | 1.00E−17 | 2.00E−20 | 2.00E−23 | 2.00E−26 | 2.00E−29 |
| 4 | 0.01 | 2.00E−05 | 3.00E−08 | 4.00E−11 | 5.00E−14 | 6.00E−17 | 7.00E−20 | 9.00E−23 | 1.00E−25 | 1.00E−28 |
| 5 | 0.03 | 4.00E−05 | 7.00E−08 | 1.00E−10 | 2.00E−13 | 2.00E−16 | 3.00E−19 | 4.00E−22 | 5.00E−25 | 6.00E−28 |
| 6 | 0.04 | 8.00E−05 | 2.00E−07 | 3.00E−10 | 4.00E−13 | 6.00E−16 | 9.00E−19 | 1.00E−21 | 2.00E−24 | 2.00E−27 |
| 7 | 0.07 | 0.0001 | 3.00E−07 | 5.00E−10 | 9.00E−13 | 2.00E−15 | 2.00E−18 | 4.00E−21 | 5.00E−24 | 7.00E−27 |
| 8 | 0.1 | 0.0002 | 5.00E−07 | 1.00E−09 | 2.00E−12 | 3.00E−15 | 6.00E−18 | 9.00E−21 | 1.00E−23 | 2.00E−26 |
| 9 | 0.1 | 0.0004 | 9.00E−07 | 2.00E−09 | 4.00E−12 | 7.00E−15 | 1.00E−17 | 2.00E−20 | 4.00E−23 | 6.00E−26 |
| 10 | 0.2 | 0.0006 | 1.00E−06 | 3.00E−09 | 7.00E−12 | 1.00E−14 | 3.00E−17 | 5.00E−20 | 8.00E−23 | 1.00E−25 |

As discussed before, Luby claims that deterministic codes are much slower than Tornado codes. However, Luby assumes that he is working with systems with a high number of errors. In reality, many applications have a much smaller number of errors and there is consequently a much lower speed penalty. Tests of a "basic" prototype implementation show very little cost with the use of the codes described herein, and a number of improvements can increase the speed advantage up to fifteen times over the codes used by Luby in his tests. Essentially, while current codes are faster to reconstruct data when errors are corrected, they are slower when there are no errors. Fortunately, the case where there are no errors is much more likely and so the present invention takes advantage of this fact.

Table 4 presents example results from timing tests of the basic prototype implementation of the error correction methods of the present invention. The tested prototype employs the base version of the codes of the present invention, without several of the possible efficiency improvements. The cost of encoding depends linearly on the number of checksums to be computed. The decode speed is independent of the number of checksums that exist; instead it is dependent on the number of checksums used.

TABLE 4 testing 112 slices with 16 checks 0 reconstructions over 146800640 bytes: 10.0548 Mb/s encode, 299.593 Mb/s decode
testing 112 slices with 16 checks 1 reconstructions over 146800640 bytes: 10.0963 Mb/s encode, 62.2037 Mb/s decode
testing 112 slices with 16 checks 2 reconstructions over 146800640 bytes: 10.1242 Mb/s encode, 45.0309 Mb/s decode
testing 112 slices with 16 checks 3 reconstructions over 146800640 bytes: 10.0894 Mb/s encode, 35.8050 Mb/s decode
testing 112 slices with 16 checks 4 reconstructions over 146800640 bytes: 10.1452 Mb/s encode, 29.7167 Mb/s decode
testing 112 slices with 16 checks 5 reconstructions over 146800640 bytes: 10.0617 Mb/s encode, 26.1211 Mb/s decode
testing 112 slices with 16 checks 6 reconstructions over 146800640 bytes: 10.0205 Mb/s encode, 23.0095 Mb/s decode
testing 112 slices with 16 checks 7 reconstructions over 146800640 bytes: 10.0548 Mb/s encode, 20.1097 Mb/s decode
testing 112 slices with 16 checks 8 reconstructions over 146800640 bytes: 10.1172 Mb/s encode, 18.6769 Mb/s decode
testing 112 slices with 16 checks 9 reconstructions over 146800640 bytes: 10.0963 Mb/s encode, 17.0897 Mb/s decode
testing 112 slices with 16 checks 10 reconstructions over 146800640 bytes: 10.0963 Mb/s encode, 15.4365 Mb/s decode
testing 112 slices with 16 checks 11 reconstructions over 146800640 bytes: 10.1452 Mb/s encode, 14.5491 Mb/s decode
testing 112 slices with 16 checks 12 reconstructions over 146800640 bytes: 10.1382 Mb/s encode, 13.5176 Mb/s decode
testing 112 slices with 16 checks 13 reconstructions over 146800640 bytes: 9.99324 Mb/s encode, 12.6334 Mb/s decode
testing 112 slices with 16 checks 14 reconstructions over 146800640 bytes: 9.98644 Mb/s encode, 11.9156 Mb/s decode
testing 112 slices with 16 checks 15 reconstructions over 146800640 bytes: 10.0825 Mb/s encode, 11.1976 Mb/s decode As an example, one of the preferred applications for the present invention is distributing files. Using the methods of the invention, a file is divided into numerous slices, and even if a number of slices of the file are missing, the file can still be recreated using the methodology of the invention. The present invention is not being used just for recovering data in extremely noisy channels, but also for storing and reading all data. In this example, if a file is distributed among a thousand disks, and if on average a disk fails every three years, then using the present invention only 0.1% additional storage is needed to ensure against loss of any data. Furthermore, larger amounts of redundancy will protect against larger failure rates and/or for longer periods of time. This presents a major advantage over prior art methods that require replication of the data at a cost of additional storage of 100%, 200%, or more. Furthermore, in this example, the computational costs and time for recovery are small and the system can continue to work while it reconstructs the lost data. Therefore, if a drive fails, it makes no difference in the read/write performance and there is very little cost for the background process to recover the drive.

A working prototype has been implemented that uses these erasure codes to encode and decode. It also distributes slices to (and retrieves slices from) nodes in a storage ring. Erlang was employed as a programming language for high-level implementation of the prototype embodiment, but it will be clear to one of skill in the art of the invention that many other programming languages are suitable. Erlang was chosen in part because it supports concurrency in at least five ways. First, it is a functional language, which eliminates the hazards of maintaining mutable state. Second, it allows for natural parallel programming with its extremely efficient process and message passing implementations. Third, it is a distributed concurrent language so that computations can be easily migrated to multiple hosts if they can bear the network latency. Fourth, it is engineered for highly available systems so it has mechanisms for error recovery and system restart. Fifth, it is engineered for non-stop systems so it has mechanisms for live code update and automatic fall back if the update fails. Erlang has proven itself as a suitable vehicle for massively parallel, distributed, scalable, highly available, non-stop systems in its use by Ericsson for telecommunication switches, ejabberd as a scalable instant messaging server, CouchDB as a web database server, Scalaris as a scalable key value store, and Yaws as a full featured web server.

In the prototype implementation, numerically intensive parts of the system, such as the erasure coding and decoding and cryptographic computations, use libraries and modules written in the C language. It will be clear to one of skill in the art of the invention that other programming languages would also be suitable. The prototype employs SHA-1 as the cryptographic hash function, but other cryptographic hash functions could be used instead. All or part of the system can be written in other programming languages, which may be desirable, for example, if those other languages are well suited to a particular client or server environment. For instance, an implementation of the client side file system code could be written in Javascript for use inside web browsers.

Tables 5 and 6 present example embodiments of code that implements the error correction methods of the present invention, in particular for computing checksums and encoding and decoding the data. While preferred embodiments are disclosed, it will be clear that there are many other suitable implementations that will occur to one of skill in the art and are within the scope of the invention. For example, in some applications it may be desirable to handle big/little endian issues without performing a byte swap.

TABLE 5

(ecodec.h)

```
/*
** externally supplied utilities for erasure codec and galois field
*/
extern int ecodec_fail(char *message);
/*
** the modulus of our galois field
*/
#define FMODULUS 256*256
/*
** outer limits on encoding sizes
*/
#define MAX_ROWS    256    /* maximum number of data slices */
#define MAX_COLS     64    /* maximum number of checksum slices */
/*
** galois field type definitions and function declarations
*/
typedef unsigned short ffelement; /* the field element is 16 bits */
typedef unsigned int ffaccum;     /* an accumulator needs 17 bits */
extern void ffinit(void);
extern ffelement ffadd(ffelement x, ffelement y);
extern ffelement ffsub(ffelement x, ffelement y);
extern ffelement ffmul(ffelement x, ffelement y);
extern ffelement ffdiv(ffelement x, ffelement y);
extern unsigned short fflog(ffelement x);
extern ffelement ffexp(unsigned short x);
/*
** erasure code type definitions and function declarations
*/
/*
** terminology:
** the data presented for erasure coding will be sliced into nslice
** data slices augmented by ncheck checksum slices. In general a
** slice refers to a data slice.
** The length of each data and checksum slice might be considered
** the depth of the slices, it can range from a minimum of 2 up to
** some undetermined maximum. The size of a UDP datagram could be a
** limit on slice depth, but probably shouldn't.
*/
/*
** compute ncheck checksums for length bytes of data in nslice slices.
**
** data is an array of length bytes, where length / nslice = bytes_per_slice,
** length % nslice = 0, and bytes_per_slice is even.
**
** data is stored so slice[0] is at data[0], data[1], data[2], ...,
** data[bytes_per_slice-1].
**
** the encoded result, ret, is an array of ncheck * bytes_per_slice checksums.
** it is also stored so check[0] is at ret[0], ret[1], ret[2], ...,
** ret[bytes_per_slice-1].
**
** the data is in the order it is presented by the client for transmission, we
** slice it in row major order so that data slices are not made of contiguous
** data bytes.
*/
extern int ecencode(int nslice, int ncheck, int length, unsigned char *data, unsigned char *result);
/*
** recover the original data from nslice slices or checksums stored in length
** bytes of data.
**
** slice numbers identified in index, where 0 .. nslice-1 indicate data slices
** and nslice .. nslice+ncheck-1 indicate checksum slices
**
** the slices_or_checksums are presented in the order they were received,
** which may bear no relation to their natural order.
**
** and data contains the data of the slices so
** slice_or_checksum[index[0]] is at data[0], data[1], ...,
** data[bytes_per_slice-1].
**
** Hmm, this assumes that we've concatenated the received slices and
** checksums in the order received, and then reconcatenate in the
** correct order with the missing slices, if any, reconstructed.
**
```

TABLE 5-continued (ecodec.h)

```
** At the minimum, we simply permute the received slices into the
** correct order.
*/
extern int ecdecode(int nslice, int ncheck, int *index, int length, unsigned char *data, unsigned
char *result);
```

Table 6 (ecodec.c)

```
/*
** Implement erasure coding and decoding
**
** Coded by Roger E Critchlow Jr, February 2008
** based closely on code by David Riceman, July-August 2007
```

```
**
*/ include <stdio.h>
include <string.h>
#include "ecodec.h"

/*
** galois field  order 2^16
** possible primitive polynomials written in octal
** 210013, 234313, 233303, 307107, 307527, 306357,
** 201735, 272201, 242413, 270155, 302157, 210205,
** 305667, 236107
**
** sources for information about finite fields and arithmetic over
** finite fields:
**
** http://en.wikipedia.org/wiki/Finite_field
** http://en.wikipedia.org/wiki/Finite_field_arithmetic
** Galois Field Arithmetic Library C++:
**     http://www.partow.net/projects/galois/index.html
** Fast Galois Field Arithmetic Library in C/C++:
**     http://www.cs.utk.edu/~plank/plank/papers/CS-07-593/
**
*/

/* the prime polynomial is x^16+x^12+x^3+x+1 (Blahut p. 82) */
/* 0210013 */
/* 1 0001 0000 0000 1011 */
/* 1    1    0    0    B */
#define POLYNOMIAL    0x1100B
define OVERFLOW      0x10000 static unsigned short logtable[FMODULUS];       /* logs logtable[base^i]=i */
static ffelement exptable[FMODULUS*2];          /* exponents exptable[i]=base^(i%(FMODULUS-1)) */

/*
** addition in the field is binary xor
*/
static ffelement _ffadd(ffelement x, ffelement y) { return x ^ y; }

/*
** subtraction in the field is binary xor
*/
static ffelement _ffsub(ffelement x, ffelement y) { return x ^ y; }

/*
** This is just a digit by digit multiplication
** which handles overflow by adding in a magic polynomial
** this is a modified version of the peasant's algorithm
*/
static ffelement _ffmul_long(ffelement x, ffelement y) {
  ffelement sum;
  ffaccum ay = y;
  /* skip y = 0 */
  if (y == 0)
```

```
    return 0;
  /* scan over the non-zero digits of x from right to left */
  for (sum = 0; x != 0; x >>= 1) {
    /* if x has a 1 in its low order digit, then add y to the result */
    if (x & 1) sum ^= ay;
    /* multiply y by two */
    ay <<= 1;
    /* if y has overflowed the field, then add in the magic polynomial */
    if (ay & OVERFLOW) ay ^= POLYNOMIAL;
  }
  return sum;
}

/*
** This initialization knows that 2 is a base for our galois field
*/
static void _ffinit(void) {
  ffelement base, base_to_power;
  int power;

base = 2;
  base_to_power = 1;
  for (power = 0; power < FMODULUS*2; power += 1) {
    exptable[power] = base_to_power;
    base_to_power = _ffmul_long(base_to_power,base);
  }
  for (power = 0; power < FMODULUS; power += 1) {
    logtable[exptable[power]] = power;
  }
} static ffelement _ffmul(ffelement x, ffelement y) {
  return (x == 0 || y == 0) ? 0 : exptable[logtable[x]+logtable[y]];
} static ffelement _ffdiv(ffelement x, ffelement y) {
  return (x == 0 || y == 0) ? 0 : exptable[logtable[x]-logtable[y]+FMODULUS-1];
}

/*
** The external entries, for testing.
** The internal, static entries will be inlined.
*/
void ffinit(void) { _ffinit(); }
ffelement ffadd(ffelement x, ffelement y) { return _ffadd(x,y); }
ffelement ffsub(ffelement x, ffelement y) { return _ffsub(x,y); }
ffelement ffmul(ffelement x, ffelement y) { return _ffmul(x,y); }
ffelement ffdiv(ffelement x, ffelement y) { return _ffdiv(x,y); }
unsigned short fflog(ffelement x) { return logtable[x]; }
ffelement ffexp(unsigned short x) { return exptable[x]; }

/*
** erasure coding
*/
#ifdef SWAP_BYTES
#define canshort(x) (x) = ((((x)>>8)&0x377)|((x)<<8))
```

```
#else
#define canshort(x) /* no swap required */
endif static ffelement **getmatrix(int rows, int cols);
static ffelement **getinverse(int n_missing_row, int *missing_row, int *present_col);

int ecencode(int nslice, int ncheck, int length, unsigned char *data, unsigned char *sums) {
  /* fprintf(stderr, "ecencode(nslice=%d, ncheck=%d, length=%d, data=..., sums=...)\n", nslice, ncheck, length); */
  if (nslice > MAX_ROWS)
    return ecodec_fail("encode: too many rows, increase MAX_ROWS and recompile");
  else if (ncheck > MAX_COLS)
    return ecodec_fail("encode: too many columns, increase MAX_COLS and recompile");
  else if ((length % (nslice*sizeof(ffelement))) != 0)
    return ecodec_fail("encode: data length not a multiple of nslice*sizeof(ffelement)");
  else {
    ffelement **matrix = getmatrix(nslice, ncheck);
    ffelement *ffdata = (ffelement *)data;
    ffelement *ffsums = (ffelement *)sums;
    int i, j, k, kn = length / (nslice * sizeof(ffelement));
    ffelement sum;
    /* oh, no, this is a canonical byte ordering situation
       some machines will need to swap bytes */
    /* oh, yes, we can put all the byte swapping into our arithmetic -- TODO, byte swapped ff arithmetic */
    for (k = 0; k < kn; k += 1) {
      for (j = 0; j < ncheck; j += 1) {
        sum = 0;
        for (i = 0; i < nslice; i += 1) {
          ffelement elt = ffdata[i*kn+k];
          canshort(elt);
          sum = _ffadd(sum, _ffmul(elt, matrix[i][j]));
        }
        canshort(sum);
        ffsums[j*kn+k] = sum;
      }
    }
    return 0;
  }
} int ecdecode(int nslice, int ncheck, int *index, int length, unsigned char *data, unsigned char *result) {
  /* fprintf(stderr, "ecdecode(nslice=%d, ncheck=%d, index, length=%d, data)\n", nslice, ncheck, length); */
  if (nslice > MAX_ROWS)
    return ecodec_fail("decode: too many rows, increase MAX_ROWS and recompile");
  else if (ncheck > MAX_COLS)
    return ecodec_fail("decode: too many columns, increase MAX_COLS and recompile");
  else if ((length % (nslice*sizeof(ffelement))) != 0)
    return ecodec_fail("decode: data length not a multiple of nslice*sizeof(ffelement)");
  else {
    ffelement *ffdata = (ffelement *)data, *ffresult = (ffelement *)result;
    ffelement *ffdata_rows[MAX_ROWS+MAX_COLS], *ffresult_rows[MAX_ROWS];
    int missing_rows[MAX_COLS], present_cols[MAX_COLS];
    int i, j, k, kn = (length / nslice) / sizeof(ffelement), n_missing_row = 0, n_present_col = 0;
    /* mark all the data rows, slices and checksums, as missing */
    for (i = 0; i < nslice+ncheck; i += 1) {
```

```
    ffdata_rows[i] = NULL;
  }
  /* find the data rows, slices and checksums, which are present */
  for (i = 0; i < nslice; i += 1) {
    if (index[i] >= nslice+ncheck) {
      return ecodec_fail("decode: index of data row is greater than or equal to nslice+ncheck");
    }
    if (ffdata_rows[index[i]] != NULL) {
      /* fprintf(stderr, "index %d is duplicated\n", index[i]); */
      return ecodec_fail("decode: duplicate index");
    }
    ffdata_rows[index[i]] = ffdata + i*kn;
    /* fprintf(stderr, "pointing ffdata row[%d] to ffdata at %d * %d = %.*s\n",
       index[i], i, kn, kn*sizeof(ffelement), ffdata_rows[index[i]]); */
    /* make the result row pointers */
    ffresult_rows[i] = ffresult + i*kn;
  }
  /* scan to find which slices are missing and which checksums are preset */
  for (i = 0; i < nslice+ncheck; i += 1) {
    if (ffdata_rows[i] == NULL) {
      /* this slice or checksum is missing */
      if (i < nslice) {
        /* this slice is missing */
        if (n_missing_row >= MAX_COLS) {
          return ecodec_fail("decode: too many missing rows");
        }
        missing_rows[n_missing_row++] = i;
        /* fprintf(stderr, "missing row %d\n", i); */
      }
    } else {
      /* this slice or checksum is not missing */
      if (i >= nslice) {
        /* this checksum is not missing */
        if (n_present_col >= MAX_COLS) {
          return ecodec_fail("decode: too many present cols");
        }
        present_cols[n_present_col++] = i-nslice;
        /* fprintf(stderr, "present col %d\n", i-nslice); */
      }
    }
  }
  /* check that we have the right numbers of parts */
  if (n_missing_row != n_present_col) {
    /* fprintf(stderr, "ecdecode(nslice=%d,ncheck=%d,...,length=%d,...), n_missing_row=%d,
n_present_col=%d\n",
       nslice, ncheck, length, n_missing_row, n_present_col); */
    return ecodec_fail("decode: number of missing rows does not equal number of supplied columns");
  }
  /* if there are missing rows we need to fill them in */
  if (n_missing_row != 0) {
    ffelement res, **inverse, **matrix, gvec[MAX_COLS];
    int nres;
    /* get the cauchy matrix */
    matrix = getmatrix(nslice, ncheck);
    /* get the cauchy inverse */
    inverse = getinverse(n_missing_row, missing_rows, present_cols);
```

```
/* now scan the received data to construct the missing rows */
/* do this one column of slice depth at a time */
for (k = 0; k < kn; k += 1) {
  for (j = 0; j < n_missing_row; j += 1) {
    res = ffdata_rows[present_cols[j]+nslice][k]; /* ??? need the kth element of the known checksum */
    canshort(res);
    gvec[j] = res;
  }
  for (i = 0; i < nslice; i += 1) {
    if (ffdata_rows[i] != NULL) {
      for (j = 0; j < n_missing_row; j += 1) {
        res = ffdata_rows[i][k];
        canshort(res);
        gvec[j] = _ffsub(gvec[j], _ffmul(matrix[i][present_cols[j]], res));
      }
    }
  }
  nres = 0;
  for (i = 0; i < nslice; i += 1) {
    if (ffdata_rows[i] == NULL) {
      res = 0;
      for (j = 0; j < n_missing_row; j += 1) {
        res = _ffadd(res, _ffmul(inverse[j][nres], gvec[j]));
      }
      /* res = '.'+('.'<<8); *//* temporary */
      ffresult_rows[i][k] = res;
      nres += 1;
    } else {
      res = ffdata_rows[i][k];
      canshort(res);
      ffresult_rows[i][k] = res;
    }
  }
}
} else {
  /* no missing rows, simply copy the received slices into the correct order */
  ffelement res;
  for (k = 0; k < kn; k += 1) {
    for (i = 0; i < nslice; i += 1) {
      res = ffdata_rows[i][k];
      canshort(res);
      ffresult_rows[i][k] = res;
    }
  }
}
return 0;
}
} static ffelement matrix_xvec[MAX_ROWS];
static ffelement matrix_yvec[MAX_COLS];

static ffelement **getmatrix(int nrows, int ncols) {
  static int matrix_nrows;
  static int matrix_ncols;
  static ffelement matrix[MAX_ROWS][MAX_COLS];
```

```
  static ffelement *matrix_rows[MAX_ROWS];

if (matrix_rows[0] != &matrix[0][0]) {
    /* compute row pointers for cauchy matrix */
    int i;
    for (i = 0; i < MAX_ROWS; i += 1)
      matrix_rows[i] = &matrix[i][0];
  }
  if (matrix_nrows != nrows || matrix_ncols != ncols) {
    /* construct a new cauchy matrix */
    int i, j;
    /* set new cauchy matrix dimensions */
    matrix_nrows = nrows;
    matrix_ncols = ncols;
    /* compute cauchy x vector */
    for (i = 0; i < nrows; i += 1) {
      matrix_xvec[i] = i+1;
    }
    /* compute cauchy y vector */
    for (j = 0; j < ncols; j += 1) {
      matrix_yvec[j] = nrows+j+1;
    }
    /* compute cauchy matrix */
    for (i = 0; i < nrows; i += 1) {
      for (j = 0; j < ncols; j += 1) {
        matrix[i][j] = _ffdiv(1, _ffadd(matrix_xvec[i], matrix_yvec[j]));
      }
    }
  }
  return matrix_rows;
} static ffelement **getinverse(int n_missing_row, int *missing_rows, int *present_cols) {
  static ffelement inverse[MAX_COLS][MAX_COLS];
  static ffelement *inverse_rows[MAX_COLS];
  int i, j, k;
  ffelement xvec[MAX_COLS], yvec[MAX_COLS];
  ffelement n1[MAX_COLS], n2[MAX_COLS], d1[MAX_COLS], d2[MAX_COLS];
  if (inverse_rows[0] != &inverse[0][0]) {
    /* compute row pointers for inverse matrix */
    for (i = 0; i < MAX_ROWS; i += 1)
      inverse_rows[i] = &inverse[i][0];
  }
  /* construct the reduced xvec and yvec */
  for (i = 0; i < n_missing_row; i += 1) {
    xvec[i] = matrix_xvec[missing_rows[i]];
    yvec[i] = matrix_yvec[present_cols[i]];
  }
  /* intermediate results */
  for (i = 0; i < n_missing_row; i += 1) {
    n1[i] = n2[i] = d1[i] = d2[i] = 1;
    for (k = 0; k < n_missing_row; k += 1) {
      n1[i] = _ffmul(n1[i], _ffadd(xvec[k], yvec[i]));
      n2[i] = _ffmul(n2[i], _ffadd(xvec[i], yvec[k]));
      if (i != k) {
        d1[i] = _ffmul(d1[i], _ffsub(xvec[i], xvec[k]));
```

```
      d2[i] = _ffmul(d2[i], _ffsub(yvec[k], yvec[i]));
    }
   }
  }
  /* computation of inverse */
  for (i = 0; i < n_missing_row; i += 1) {
   for (j = 0; j < n_missing_row; j += 1) {
    inverse[i][j] = _ffdiv(_ffdiv(_ffmul(_ffmul(_ffdiv(1, _ffadd(xvec[j],yvec[i])), n1[i]), n2[j]), d1[j]), d2[i]);
   }
  }
  return inverse_rows;
}
```

The present invention has the advantages of the Zebra file system and the fault tolerance of BitTorrent, with only a relatively small cost for replication. Since a very small amount of additional data is needed to assure fault tolerance, it has an immense advantage over the prior art. The invention provides space efficiency, storing data that is robust against errors much more efficiently than mirroring strategies that simply make multiple copies, thereby providing robust storage with the benefits of distributed striping. In addition, it is easy to add resources as needed. The present invention therefore gives the user the ability to determine how much redundancy he wants and to provision the system accordingly. In addition, repair is simple, being effected by simply replacing defective disk drives and then reconstructing automatically the missing data. A storage system can therefore be constructed which can be upgraded effortlessly to produce a storage system that will last forever as it is incrementally upgraded and replaced.

The benefits of the erasure codes of the present invention include, but are not limited to, better space efficiency than mirroring/replication strategies, the ability to choose the degree of redundancy in the code (or even dynamically for each file), which combined with the expected failure rate of slice storage gives the expected time to failure or how long until the data needs to be refreshed if it is desirable to keep it longer, the ability to make the code hierarchical, which allows for more probable errors to be corrected at less expense than the less probable, triple witching hour errors, and the ability to tune the number of slices required for reconstruction to be the number, which the expected network transport can deliver most effectively. The present invention makes it possible to build a variety of storage systems that vary these parameters to meet different requirements, with all of the storage systems being based on a very simple underlying slice storage server.

A specific benefit of the present invention is that it provides hyper-resilient data. The system can protect against a large number of disk failures (or node failures). Parameters can be configured to select the level of data resiliency that is desired. Specifically, up to k failures can be protected against, where k is the number of checksums it has been chosen to calculate. For example, protection against the failure of two nodes in a network is achieved by calculating 2 checksums. In practice, a safety factor might be added, in order to protect against more node failures than are normally expected to occur (e.g., a safety factor of 3 checksums might be added in this example, so that the data could be reconstructed despite 5 node failures).

The present invention also has a lower redundancy cost. Using this system, the number of servers needed to store a given amount of data in a resilient manner can be dramatically reduced. This is achieved by lowering the amount of extra space needed to achieve data redundancy. In this system, the redundancy cost is k/n. The parameters can be configured to achieve a particular cost. For example, if a 1% redundancy cost is desired, set n equal to 500 and k equal to 5 (by dividing an original data block into 500 data slices and calculating 5 checksums). This yields a redundancy cost of 5/500, or 1%. A comparison illustrates how the present invention can store data in a more resilient manner using less space. In the example, the data can be recovered despite the loss of 5 nodes, the stored data occupies 101% of the space of the original, and the redundancy cost is 1%. By comparison, with a traditional, single backup, the data is protected against the loss of only one copy, the original and replica occupy 200% of the original space, and the redundancy cost is 100%. Parameters can be configured to achieve different levels of data resiliency and redundancy cost, with the example above presenting just one of many possibilities.

Redundancy cost may be reduced even further by taking advantage of a feature of cryptographic hashes: Suppose many copies of the same file (e.g., a You Tube video) would reside in many places in a traditional network. In the present system, the hash of each of the identical files would be the same, and thus the hash would be stored only once. In any event, a much lower redundancy cost can be achieved than when either traditional backup (i.e., replication) or RAID is employed.

In some implementations, speed can be increased by concurrently reading and writing small shreds from multiple remote points. This can be faster than reading and writing a large original file from a local disk. The system is also scalable, in that it enables a large storage system to be built out of identical, simple units. These units could consist of commodity, off-the-shelf disks with a simple operating system, such as a stripped-down version of Linux. Also, the system is scalable in the sense that the number of nodes in the storage ring can be easily increased or decreased. Consistent hashing is used to map keys to nodes. A benefit of doing so is that, when a node is removed or added, the only keys that change are those associated with adjacent nodes. The storage system could therefore serve as a foundation for computing at the exascale.

One of the major advantages of the present invention is that it can be used to produce a general purpose, fault tolerant, scalable, data storage system. This system is much more efficient than present methods, for example the Google File System which essentially uses mirroring techniques to insure data reliability. In addition when used in conjunction with methods such as map reduce it produces a more efficient parallel system than for example Google uses since one can insure that all data is available and the problem of stragglers [Jeffery Dean, Sanjay Ghemawat, Distributer Programing with MapReduce, Beautiful Code, Oram & Wilson, O'Reilly, 2007; Sanjay Ghemawat, Howard Gobioff, Shun-Tak Leung, 19th ACM Symposium on Operating Systems Principles, Lake George, N.Y., October, 2003] is eliminated.

While the invention has been described with respect to its application to the problems of restoration, receipt, or distribution of data or processes under possible failure, it will be clear to one of skill in the art that it has many other suitable applications, including, but not limited to, video distribution, automatic updates, distributed file systems, and data storage applications. The erasure codes of the present invention may also be used in any application where older and/or less efficient erasure codes are presently used.

One useful application is a distributed file system. Historically, machines have been constructed like islands and all major subsystems are replicated in each machine. This model makes substantially less sense today, when machines are reliably networked. One can imagine a time when every personal computer (even portables) have a high speed network persistent connection. In this environment it makes no sense to have all the resources needed for each machine duplicated everywhere. Using the present invention, a file system can be constructed that is distributed among a large number of machines. This has a number of advantages including, but not limited to, that data will never have to be backed up since the system will have its own redundancy, that it will run faster, and that it will take less storage space because, using distributed hash tables, it is only necessary to store one copy of every file. The distributed hash table may be implemented by taking a cryptographic hash of each file, using that as the address or i-node of the file, and only storing the data once for each hash. By using compression on files, the amount of space will be reduced, which is in addition to the fact that a significant amount of space will be saved by only storing one instance of each file. Files can also be encrypted, so that the fact that files are distributed will not affect security.

Figure 15:
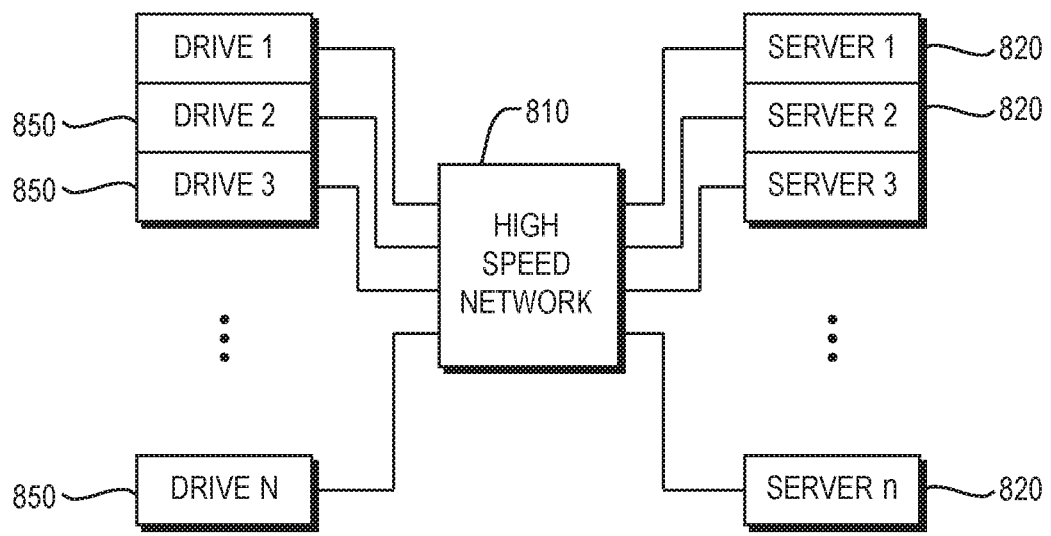
FIG. 15 is a block diagram illustrating an embodiment of a distributed file system employing web servers, according to one aspect of the present invention.

FIG. 15 is a block diagram illustrating an exemplary embodiment of a distributed file system employing web servers, according to one aspect of the present invention. Storage can conveniently be added as necessary, with data being sliced and stored according to the methods of the present invention. In FIG. 15, distributed file system 800 comprises high speed network 810 linking n web servers 820 and n drives 850.

Another useful application of the present invention is distributed computation. The high-level implementation language and other features of the present invention are well suited for concurrent processing. For example, nodes are enabled, acting independently, to gather the data they need to run concurrent processes. Languages such as Erlang that permit distribution of computation in a fault tolerant way may be used in conjunction with the distributed storage methods of the present invention in order to provide distributed computation having the additional advantage of fault-tolerant distributed storage where resources can be added as needed. When such a system uses disk instead of the memory required by Scalaris, and uses erasure codes for storage, an improved distributed computation model is obtained which is fault tolerant and redundant.

Figure 16:
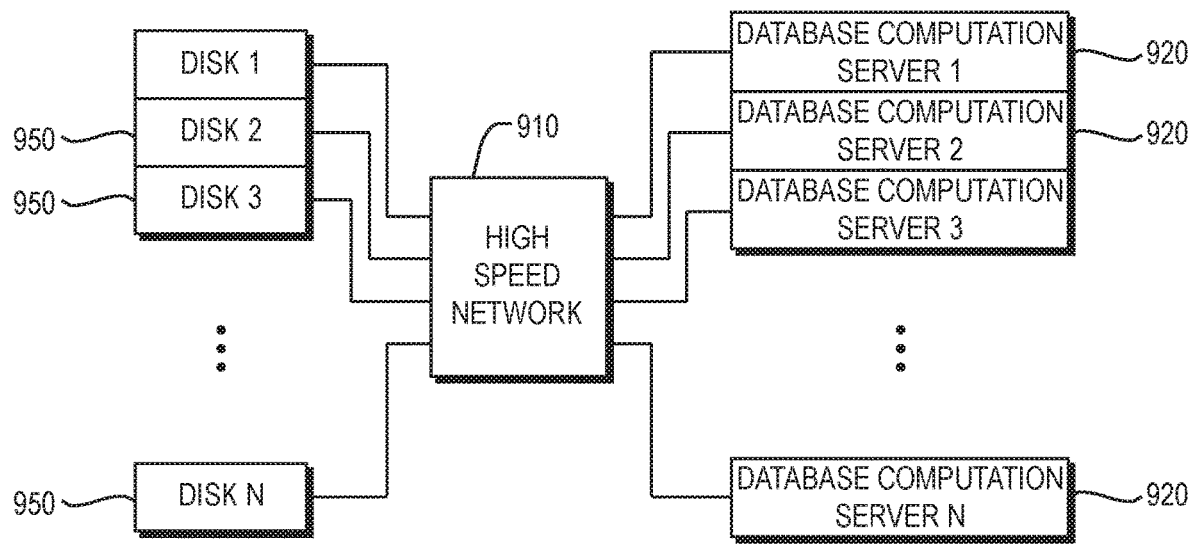
FIG. 16 is a block diagram illustrating an embodiment of a system for distributed database computation, according to another aspect of the present invention.

FIG. 16 is a block diagram illustrating an embodiment of a system for distributed database computation, according to one aspect of the present invention. In this embodiment, data and computation tasks are distributed among multiple disks and computation servers using the methods of the present invention. The system may be easily expanded as the load requires. In FIG. 16, distributed database computation system 900 comprises high speed network 910 linking n database computation servers 920 and n storage disks 950.

The present invention may also be advantageously employed to provide distributed data storage system and method, in which data is stored on a network. When stored, a file does not exist on any one drive. Rather, the file is shredded and the shreds are stored on many drives. This makes the data hyper-resilient, in a manner analogous to the robustness of packet switching. With packet switching, data packets can be routed to their destination despite the failure of nodes in the transmission system. Using the present invention, all data in a storage ring can be recovered, despite the failure of nodes in the ring. The basic method of the system is: (1) Divide an original data block into n data slices, (2) Use Cauchy-Reed-Solomon erasure codes to compute k checksums, (3) Calculate a cryptographic hash for each data slice and checksum, and (4) Store the n+k slices (consisting of n data slices and k checksums) on a distributed storage ring. Each node is responsible for a sector of the cryptographic hash range, and each shred is stored at the node responsible for the hash of the shred's address. No more than one slice is stored at any node. Thus, n+k slices (consisting of n data slices and k checksums) are stored on n+k nodes of a storage ring. The checksums are designed so that, in order to reconstruct the original data block, it is not required to retrieve all of the slices. Rather, it is sufficient if a total of least n data slices or checksums are retrieved. The other k data slices or checksums are not needed. Thus, the original data can be reconstructed despite the failure of up to k nodes. Put differently, in order to protect against the failure of k nodes, k checksums are calculated.

Figure 17:
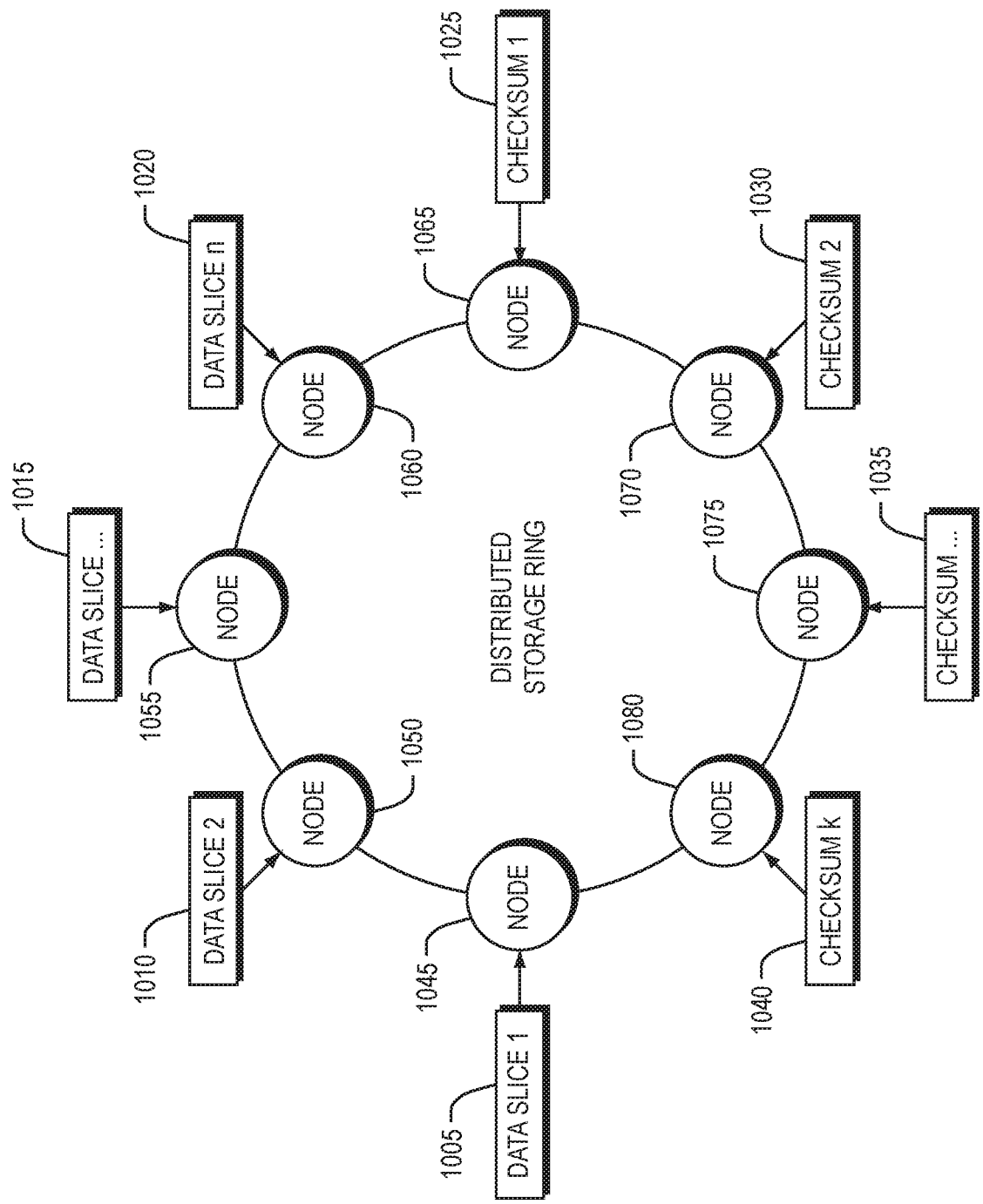
FIG. 17 is a diagram that illustrates an exemplary implementation of distributed data storage according to one aspect of the present invention.

FIG. 17 is a diagram that illustrates an exemplary implementation of distributed data storage according to one aspect of the present invention. In FIG. 17, n+k slices 1005, 1010, 1015, 1020, 1025, 1030, 1035, 1040, consisting of n data slices 1005, 1010, 1015, 1020 and k checksums 1025, 1030, 1035, 1040, are stored on n+k nodes 1045, 1050, 1055, 1060, 1065, 1070, 1075, 1080 of distributed storage ring 1090. The original data can be reconstructed despite the failure of up to k nodes. By using k checksums, data is protected against the loss of k nodes. In one embodiment, extra checksums are calculated to provide an enhanced safety factor.

Structured Overlay Network. The nodes participating in the storage system are organized into a structured overlay network that provides routing services and implements a distributed hash table. The structured overlay operates much like the Chord/Dhash system from MIT and other peer-to-peer networking systems proposed in the last decade, but adapted to sets of peers more focused than ad hoc file sharers.

Decentralized Storage with Independent, Concurrently Acting Nodes. In this approach, storage is decentralized. A stored file does not reside at any particular node. Rather, the file shreds or slices are distributed for storage throughout the system. Any node, acting independently, may initiate queries to the other nodes to retrieve these slices or shreds. As soon as the node that initiated the query receives back at least n slices, it can reconstruct the file. It does not need to wait to hear back from the remaining nodes. Each participant can gather the data it needs to support the concurrent processes it is executing. In contrast, in a conventional distributed system, responsibility for a file is centralized to some extent. One or more nodes have responsibility for a particular file, and can act as a bottleneck. The system is truly distributed in that none of the participants is any more important or indispensable than any other. Each participant, acting independently, can gather the data it needs to support the concurrent processes it is executing. This degree of distribution is important. It is a radical departure from a conventional approach that tries to make a remote file behave like one on a local system.

Another useful application of the present invention is adaptive distributed memory. The flexibility of the erasure coding of the present invention permits another way to envision cloud storage. A user who writes an item of data can choose the erasure coding parameters to ensure that the item may be recovered after some number of slice failures, that the reconstruction of the item will require a certain amount of work after some number of slice failures, and that the item should be checked after a certain period of time to ensure that the erasure coding is operating to specification. These parameters may be chosen according to some anticipated rate of disk failure, of slice server disconnection, of data access, and/or of access urgency, or the parameters may be adaptively learned by watching how erasure-coded data works over time. The user of a data storage system would specify the expected usage of their stored data, sample the properties of the storage system, and choose the erasure coding parameters accordingly. They would also sample the properties of the storage system at later times and update the encoding of their data if necessary to meet the expected usage of their stored data. This may also be extended to include sampling the actual usage of their stored data, in order to see that it meets the expected usage.

It will be clear to one of skill in the art that the present invention has many other potential applications. These include, but are not limited to, a flexible combat ring, server farms, self-restoring hard drives, scratch-resistant CDs and DVDs, flash memory, and highly efficient forward error correction in data transmission. For example, in a flexible storage ring for use in combat, nodes (consisting, for example, of wirelessly enabled computers carried by tactical units) could join or leave the ring, and all data could be recovered despite the loss of numerous nodes. Large server farms are appropriate in some cases for intelligence gathering, cloud computing and parallel, distributed computation, and the present invention could be used to achieve reductions in the number of servers needed on such farms because they are resilient in the case of failure and can be scaled by simply adding more hardware.

While a preferred embodiment is disclosed, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention, which is not to be limited except by the claims that follow.

Section headings or titles used herein are for convenience only, do not limit the scope of this invention in any way, and are not intended to affect or limit the description of this invention. The term "herein" refers to this entire patent or patent application, and not merely to the section in which such term appears. While preferred embodiments are disclosed herein, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention, which is not to be limited except by the claims that follow.

What is claimed is:

1. A method for insuring integrity and recoverability of file data in a distributed data environment comprising:
    identifying a data file to be stored;
    quantifying the data in the file as containing n pieces of data, where n is a positive integer;
    dividing the n pieces of data into b blocks, where b is a positive integer less than n and is dependent on an assigned probability of error during data movement;
    assigning each block of data one or more checksums, such that there are a total of k checksums for the b blocks, where k is a positive integer;
    assigning a file manager to the file, the file manager maintaining a list of locations of the b blocks and k checksums representing the file;
    assigning a storage manager to the file, the storage manager itself being stored separately from the file manager, the storage manager managing storage and retrieval of the b blocks and k checksums representing the file;
    storing the b blocks and k checksums on a plurality of storage devices;
    in the case of a failed storage device containing a subset of the b blocks representing the file, using the list of locations maintained by the file manager to recover the possibly damaged blocks from the failed storage device and at least a subset of the k checksums relating to the subset of the b blocks from either the failed storage device or other storage devices;
    checking each possibly damaged block from the failed device for errors using its respective checksums, and correcting when possible using the subset of the k checksums;
    whereby fast checksum error checking and correction on a block basis renders unneeded slow checksum error checking and correction on all of the data, thereby increasing speed of error checking and correction.

2. The method of claim 1 further comprising storing the b blocks and k checksums on n+k different storage devices.

3. The method of claim 1 wherein the storage devices comprise computing devices connected to a communication channel with block data being received over the channel transmitted from a first device to a second device.

4. The method of claim 3 further comprising:
    at the first device:
        collecting the n pieces of data and then multiplying by a matrix to yield n+k data slices, wherein k depends on the outer dimension of the matrix and
    at the second device:
        storing the data slices on n+k respective disks.

5. The method of claim 4 wherein every square submatrix of the matrix is invertible.

6. The method of claim 5 wherein the matrix comprises a Cauchy matrix.

7. The method of claim 4 wherein the k checksums derive from error checking codes comprising Cauchy-based Reed-Solomon codes.

8. The method of claim 4 wherein the checksums derive from error checking codes comprising Vandermonde-Reed-Solomon codes.

9. The method of claim 4 wherein the checksums derive from error checking codes comprising any code that transforms source data of a particular quantity of blocks into data with a greater quantity of blocks, such that the original data can be recovered from a subset of the greater number of blocks.

10. The method of claim 1 further comprising multiplying each of the b blocks by a matrix to produce a total of n+k data slices.

11. The method of claim 10 wherein each square submatrix of the matrix is invertible.

12. The method of claim 11 wherein the matrix comprises a Cauchy matrix.

13. The method of claim 12 wherein the Cauchy matrix is a matrix over a finite Galois field.

14. The method of claim 13 wherein the Galois field contains 2**m elements, where m is a positive integer.

15. The method of claim 1 wherein the k checksums derive from error checking codes comprising Cauchy-based Reed-Solomon codes.

16. The method of claim 1 wherein the k checksums derive from error checking codes comprising Vandermonde-Reed-Solomon codes.

17. The method of claim 1 wherein the k checksums derive from error checking codes comprising any code that transforms source data of a particular quantity of blocks into data with a greater quantity of blocks, such that the original data can be recovered from a subset of the greater number of blocks.

18. The method of claim 1 wherein a first subset r of the k checksums relate to an inner code and a second subset q of the k checksums relate to an outer code, wherein r and q are positive integers and r+q=k.

19. The method of claim 18 wherein the inner code is a matrix erasure code and the outer code is an error-correcting code.

20. The method of claim 1 wherein at least one of the file manager or the storage manager is stored as a distributed hash table.

* * * * *